United States Patent
Pierer et al.

(10) Patent No.: US 10,670,818 B2
(45) Date of Patent: *Jun. 2, 2020

(54) DIRECTLY WRITTEN WAVEGUIDE FOR COUPLING OF LASER TO PHOTONIC INTEGRATED CIRCUIT

(71) Applicant: NORTH INC., Kitchener (CA)

(72) Inventors: Jörg Pierer, Alpnach (CH); Rony Jose James, Alpnach (CH); Stefan Mohrdiek, Affoltern am Albis (CH); Martin Joseph Kiik, Kitchener (CA); Syed Moez Haque, Kitchener (CA); Douglas Raymond Dykaar, Waterloo (CA)

(73) Assignee: North Inc., Kitchener, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 16/231,284

(22) Filed: Dec. 21, 2018

(65) Prior Publication Data
US 2019/0219825 A1    Jul. 18, 2019

Related U.S. Application Data

(60) Provisional application No. 62/608,749, filed on Dec. 21, 2017, provisional application No. 62/609,870, (Continued)

(51) Int. Cl.
*G02B 6/42* (2006.01)
*G02B 27/01* (2006.01)
(Continued)

(52) U.S. Cl.
CPC ........... *G02B 6/4215* (2013.01); *G02B 6/124* (2013.01); *G02B 6/12004* (2013.01);
(Continued)

(58) Field of Classification Search
None
See application file for complete search history.

(56) References Cited

U.S. PATENT DOCUMENTS

| 2002/0024495 | A1* | 2/2002 | Lippert ................. G02B 23/12 345/98 |
| 2006/0138239 | A1 | 6/2006 | Sonoda et al. |

(Continued)

FOREIGN PATENT DOCUMENTS

CN  204496106 U  7/2015

OTHER PUBLICATIONS

International Search Report and Written Opinion of the International Searching Authority, PCT/CA2018/051344, dated Feb. 19, 2019.

*Primary Examiner* — Chad H Smith
(74) *Attorney, Agent, or Firm* — Thomas Mahon

(57) ABSTRACT

Systems, devices, and methods of manufacturing optical engines and laser projectors that are well-suited for use in wearable heads-up displays (WHUDs) are described. Generally, the optical engines of the present disclosure integrate a plurality of laser diodes (e.g., 3 laser diodes, 4 laser diodes) within a single, hermetically or partially hermetically sealed, encapsulated package. Photonic integrated circuits having grating or edge couplers thereon may be used to wavelength multiplex beams of light emitted by the plurality of laser diodes into a coaxially superimposed aggregate beam. A waveguide medium having one or more directly written waveguides may couple light from laser diodes to a photonic integrated circuit, and may optionally hermetically or partially hermetically seal the laser diodes, eliminating the need for a separate seal. Such optical engines may have advantages over existing designs including, for example, smaller volumes, better manufacturability, faster modulation speed, (Continued)

etc. WHUDs that employ such optical engines and laser projectors are also described.

20 Claims, 21 Drawing Sheets

Related U.S. Application Data filed on Dec. 22, 2017, provisional application No. 62/620,600, filed on Jan. 23, 2018, provisional application No. 62/760,835, filed on Nov. 13, 2018.

(51) Int. Cl.

| | | |
|---|---|---|
| *G02B 6/12* | (2006.01) | |
| *H01S 5/40* | (2006.01) | |
| *G02B 6/124* | (2006.01) | |
| *H01S 5/022* | (2006.01) | |
| *G02B 27/42* | (2006.01) | |
| *H01S 5/42* | (2006.01) | |
| *H01S 5/026* | (2006.01) | |
| *H01S 5/042* | (2006.01) | |
| *G02B 27/10* | (2006.01) | |
| *G03B 21/20* | (2006.01) | |
| *H04N 9/31* | (2006.01) | |
| *G02B 6/125* | (2006.01) | |
| *G02B 6/13* | (2006.01) | |
| *G02B 27/14* | (2006.01) | |
| *G02B 26/10* | (2006.01) | |
| *H01S 5/02* | (2006.01) | |

(52) U.S. Cl.
CPC ......... *G02B 6/125* (2013.01); *G02B 6/12007* (2013.01); *G02B 6/13* (2013.01); *G02B 6/42* (2013.01); *G02B 6/4206* (2013.01); *G02B 6/4251* (2013.01); *G02B 27/0172* (2013.01); *G02B 27/1006* (2013.01); *G02B 27/4205* (2013.01); *G03B 21/2033* (2013.01); *H01S 5/0226* (2013.01); *H01S 5/0261* (2013.01); *H01S 5/02208* (2013.01); *H01S 5/02248* (2013.01); *H01S 5/02272* (2013.01); *H01S 5/02288* (2013.01); *H01S 5/02296* (2013.01); *H01S 5/042* (2013.01); *H01S 5/4012* (2013.01); *H01S 5/4031* (2013.01); *H01S 5/4093* (2013.01); *H01S 5/423* (2013.01); *H04N 9/3161* (2013.01); *G02B 26/101* (2013.01); *G02B 27/141* (2013.01); *G02B 2006/12069* (2013.01); *G02B 2006/12107* (2013.01); *G02B 2006/12147* (2013.01); *G02B 2006/12164* (2013.01); *G02B 2027/011* (2013.01); *G02B 2027/0112* (2013.01); *G02B 2027/0116* (2013.01); *G02B 2027/0178* (2013.01); *H01S 5/0206* (2013.01)

(56) References Cited

U.S. PATENT DOCUMENTS

| | | |
|---|---|---|
| 2011/0063871 A1 | 3/2011 | Tanaka et al. |
| 2013/0114629 A1 | 5/2013 | Firth et al. |
| 2013/0265770 A1 | 10/2013 | Breidenassel et al. |
| 2014/0126918 A1 | 5/2014 | Sato |
| 2014/0240952 A1 | 8/2014 | Nakanishi et al. |
| 2017/0299956 A1 | 10/2017 | Holland et al. |
| 2018/0035087 A1* | 2/2018 | Xu ..................... H01S 5/06825 |
| 2019/0219778 A1* | 7/2019 | Pierer ................ G02B 6/12004 |

\* cited by examiner

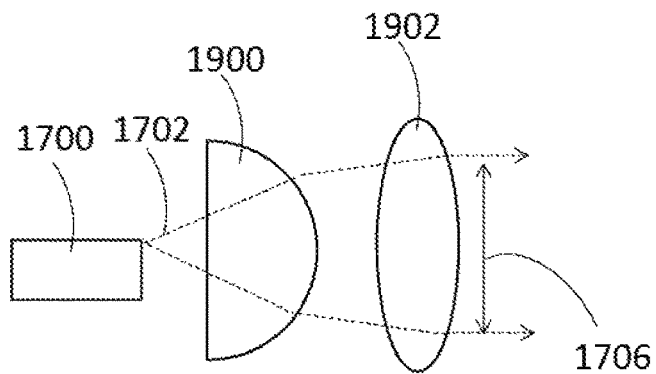
FIG. 19A
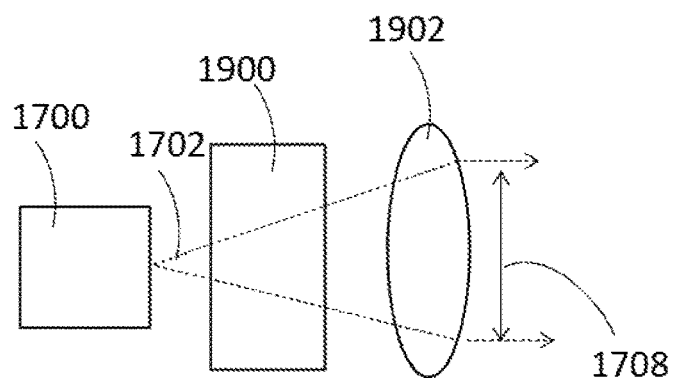
FIG. 19B
          
FIG. 19C                    FIG. 19D

DIRECTLY WRITTEN WAVEGUIDE FOR COUPLING OF LASER TO PHOTONIC INTEGRATED CIRCUIT

BACKGROUND

Technical Field

The present disclosure is generally directed to systems, devices, and methods relating to optical engines, for example, optical engines for laser projectors used in wearable heads-up displays or other applications.

Description of the Related Art

A projector is an optical device that projects or shines a pattern of light onto another object (e.g., onto a surface of another object, such as onto a projection screen) in order to display an image or video on that other object. A projector necessarily includes a light source, and a laser projector is a projector for which the light source comprises at least one laser. The at least one laser is temporally modulated to provide a pattern of laser light and usually at least one controllable mirror is used to spatially distribute the modulated pattern of laser light over a two-dimensional area of another object. The spatial distribution of the modulated pattern of laser light produces an image at or on the other object. In conventional scanning laser projectors, at least one controllable mirror may be used to control the spatial distribution, and may include: a single digital micromirror (e.g., a microelectromechanical system ("MEMS") based digital micromirror) that is controllably rotatable or deformable in two dimensions, or two digital micromirrors that are each controllably rotatable or deformable about a respective dimension, or a digital light processing ("DLP") chip comprising an array of digital micromirrors.

In a conventional laser projector comprising an RGB (red/green/blue) laser module with a red laser diode, a green laser diode, and a blue laser diode, each respective laser diode may have a corresponding respective focusing lens. Each of the laser diodes of a laser module are typically housed in a separate package (e.g., a TO-38 package or "can"). The relative positions of the laser diodes, the focusing lenses, and the at least one controllable mirror are all tuned and aligned so that each laser beam impinges on the at least one controllable mirror with substantially the same spot size and with substantially the same rate of convergence (so that all laser beams will continue to have substantially the same spot size as they propagate away from the laser projector towards, e.g., a projection screen). In a conventional laser projector, it is usually possible to come up with such a configuration for all these elements because the overall form factor of the device is not a primary design consideration. However, in applications for which the form factor of the laser projector is an important design element, it can be very challenging to find a configuration for the laser diodes, the focusing lenses, and the at least one controllable mirror that sufficiently aligns the laser beams (at least in terms of spot size, spot position, and rate of convergence) while satisfying the form factor constraints.

A head-mounted display is an electronic device that is worn on a user's head and, when so worn, secures at least one electronic display within a viewable field of at least one of the user's eyes, regardless of the position or orientation of the user's head. A wearable heads-up display is a head-mounted display that enables the user to see displayed content but also does not prevent the user from being able to see their external environment. The "display" component of a wearable heads-up display is either transparent or at a periphery of the user's field of view so that it does not completely block the user from being able to see their external environment. A "combiner" component of a wearable heads-up display is the physical structure where display light and environmental light merge as one within the user's field of view. The combiner of a wearable heads-up display is typically transparent to environmental light but includes some optical routing mechanism to direct display light into the user's field of view.

Examples of wearable heads-up displays include: the Google Glass®, the Optinvent Ora®, the Epson Moverio®, and the Sony Glasstron®, just to name a few.

The optical performance of a wearable heads-up display is an important factor in its design. When it comes to face-worn devices, users also care a lot about aesthetics and comfort. This is clearly highlighted by the immensity of the eyeglass (including sunglass) frame industry. Independent of their performance limitations, many of the aforementioned examples of wearable heads-up displays have struggled to find traction in consumer markets because, at least in part, they lack fashion appeal or comfort. Most wearable heads-up displays presented to date employ relatively large components and, as a result, are considerably bulkier, less comfortable and less stylish than conventional eyeglass frames.

Direct Laser Writing

Femtosecond laser micro-machining is a direct-laser-write and rapid prototyping technique that provides great potential for optical device fabrication. Strong focusing of femtosecond laser light into transparent glass can induce positive refractive index modifications up to 0.01 refractive index units (MU) within the material and without surface damage. Ultrafast (femto/pico-second) lasers enable flexible 3D structuring of various glasses, which may be useful in many types of optical devices (waveguides, couplers, Bragg gratings, waveplates, etc.) that can serve as building blocks for 3D optical circuits.

Direct-laser-writing uses ultrashort laser pulses to confine strong nonlinear optical interactions that may induce, for example, positive or negative refractive index changes in bulk transparent materials for creating optical waveguides (WGs). The mechanisms by which direct-laser-write modifications occur include, but are not limited to, multiphoton ionization, avalanche ionization, electron-atom collisions, plasma interactions, thermal effects (e.g., diffusion, heat accumulation), energy dissipation, and material cooling leading to inhomogeneous solidification. For direct-laser-writing waveguides, waveguide performance can be tuned and optimized by, but not limited to, the writing laser's properties (e.g., pulse duration, pulse temporal shape, bandwidth and shape, pulse repetition rate, wavelength, polarization, and beam spatial shape) and the focusing conditions (e.g., lens numerical aperture, air/liquid immersion, translation direction and speeds).

BRIEF SUMMARY

An optical engine may be summarized as including a base substrate; a plurality of laser diodes, each of the plurality of laser diodes bonded directly or indirectly to the base substrate; at least one laser diode driver circuit operatively coupled to the plurality of laser diodes to selectively drive current to the plurality of laser diodes; a cap including at least one wall and at least one optical window that, together with the base substrate, define an interior volume sized and dimensioned to receive at least the plurality of laser diodes, the cap being bonded to the base substrate to provide a hermetic or partially hermetic seal between the interior volume of the cap and a volume exterior to the cap, and the optical window positioned and oriented to allow beams of light emitted from the plurality of laser diodes to exit the interior volume; a photonic integrated circuit bonded to the base substrate proximate the optical window of the cap, the photonic integrated circuit including a plurality of input facets and at least one output facet, in operation, the photonic integrated circuit receives a plurality of beams of light at the respective plurality of input facets and wavelength multiplexes the plurality of beams of light to provide an aggregated beam of light at the output facet; and a waveguide medium disposed between the optical window of the cap and the photonic integrated circuit, the waveguide medium including at least one directly written waveguide that is operative to couple the plurality of beams of light emitted by the plurality of laser diodes from the optical window of the cap to the input facets of the photonic integrated circuit. Each of the plurality of input facets of the photonic integrated circuit may include a grating input coupler. Each of the plurality of input facets of the photonic integrated circuit may include an edge input coupler. The waveguide medium may be spaced apart from at least one of the optical window of the cap or the photonic integrated circuit. The waveguide medium may be in contact with at least one of the optical window of the cap or the photonic integrated circuit. The waveguide medium may include an organically modified ceramic (ORMOCER) material. The waveguide medium may be spaced apart from the optical window of the cap, and a surface of the waveguide medium that faces the optical window may be formed into a lens shape that directs the plurality of beams of light into the directly written waveguide of the waveguide medium.

The optical engine may further include a collimation lens positioned and oriented to receive and collimate the aggregate beam of light from the output facet of the photonic integrated circuit. The collimation lens may include an achromatic lens. The collimation lens may include an apochromatic lens.

The optical engine may further include at least one diffractive optical element positioned and oriented to receive the aggregate beam of light, in operation, the at least one diffractive optical element provides wavelength dependent focus correction for the aggregate beam of light.

The optical engine may further include a plurality of chip submounts bonded to the base substrate, wherein each of the laser diodes are bonded to a corresponding one of the plurality of chip submounts. The plurality of laser diodes may include a red laser diode to provide a red laser light, a green laser diode to provide a green laser light, a blue laser diode to provide a blue laser light, and an infrared laser diode to provide infrared laser light. The base substrate may be formed from at least one of low temperature co-fired ceramic (LTCC), aluminum nitride (AlN), Kovar®, or alumina. The at least one laser diode driver circuit may be bonded to a first surface of the base substrate, and the plurality of laser diodes and the cap may be bonded to a second surface of the base substrate, the second surface of the base substrate opposite the first surface of the base substrate. The at least one laser diode driver circuit, the plurality of laser diodes, and the cap may be bonded to a first surface of the base substrate. The plurality of laser diodes and the cap can be bonded to the base substrate, and the at least one laser diode driver circuit can be bonded to another substrate separate from the base substrate.

Each of the laser diodes may include one of an edge emitter laser or a vertical-cavity surface-emitting laser (VCSEL).

The photonic integrated circuit can include a first plurality of waveguides, each waveguide of the first plurality of waveguides having a respective input facet, and the waveguide medium can include a second plurality of waveguides, each waveguide of the second plurality of waveguides to receive laser light from a respective laser diode of the plurality of laser diodes and couple the received laser light to the input facet of a respective waveguide in the first plurality of waveguides.

An optical engine may be summarized as including a base substrate; a plurality of laser diodes, each of the plurality of laser diodes bonded directly or indirectly to the base substrate; at least one laser diode driver circuit operatively coupled to the plurality of laser diodes to selectively drive current to the plurality of laser diodes; a photonic integrated circuit bonded to the base substrate at a position that is spaced apart from the plurality of laser diodes, the photonic integrated circuit including a plurality of input facets and at least one output facet, in operation, the photonic integrated circuit receives a plurality of beams of light at the respective plurality of input facets and wavelength multiplexes the plurality of beams of light to provide an aggregated beam of light at the output facet; and a waveguide and sealing medium that covers and hermetically or partially hermetically seals the plurality of laser diodes, the waveguide and sealing medium including at least one directly written waveguide that couples the plurality of beams of light emitted by the plurality of laser diodes to the input facets of the photonic integrated circuit. The waveguide and sealing medium may include an organically modified ceramic (ORMOCER) material. Each of the plurality of input facets of the photonic integrated circuit may include one of a grating input coupler or an edge input coupler.

The optical engine may further include a collimation lens positioned and oriented to receive and collimate the aggregate beam of light from the output facet of the photonic integrated circuit. The collimation lens may include one of an achromatic lens or an apochromatic lens.

The optical engine may further include at least one diffractive optical element positioned and oriented to receive the aggregate beam of light, in operation, the at least one diffractive optical element provides wavelength dependent focus correction for the aggregate beam of light.

The optical engine may further include a plurality of chip submounts bonded to the base substrate, wherein each of the laser diodes are bonded to a corresponding one of the plurality of chip submounts. The plurality of laser diodes may include a red laser diode to provide a red laser light, a green laser diode to provide a green laser light, a blue laser diode to provide a blue laser light, and an infrared laser diode to provide infrared laser light. The base substrate may be formed from at least one of low temperature co-fired ceramic (LTCC), aluminum nitride (AlN), alumina, or Kovar®.

The at least one laser diode driver circuit may be bonded to a first surface of the base substrate, and the plurality of laser diodes and the cap may be bonded to a second surface of the base substrate, the second surface of the base substrate opposite the first surface of the base substrate. The at least one laser diode driver circuit, the plurality of laser diodes, and the cap may be bonded to a first surface of the base substrate. The plurality of laser diodes and the cap may be bonded to the base substrate, and the at least one laser diode driver circuit may be bonded to another substrate separate from the base substrate.

The photonic integrated circuit may include a first plurality of waveguides, each waveguide of the first plurality of waveguides having a respective input facet, and the waveguide and sealing medium may include a second plurality of waveguides, each waveguide of the second plurality of waveguides to receive laser light from a respective laser diode of the plurality of laser diodes and couple the received laser light to the input facet of a respective waveguide in the first plurality of waveguides.

A wearable heads-up display (WHUD) may be summarized as including a support structure that in use is worn on the head of a user; a laser projector carried by the support structure, the laser projector including an optical engine, including a base substrate; a plurality of laser diodes, each of the plurality of laser diodes bonded directly or indirectly to the base substrate; at least one laser diode driver circuit operatively coupled to the plurality of laser diodes to selectively drive current to the plurality of laser diodes; a cap including at least one wall and at least one optical window that, together with the base substrate, define an interior volume sized and dimensioned to receive at least the plurality of laser diodes, the cap being bonded to the base substrate to provide a hermetic or partially hermetic seal between the interior volume of the cap and a volume exterior to the cap, and the optical window positioned and oriented to allow beams of light emitted from the plurality of laser diodes to exit the interior volume; a photonic integrated circuit bonded to the base substrate proximate the optical window of the cap, the photonic integrated circuit including a plurality of input facets and at least one output facet, in operation, the photonic integrated circuit receives a plurality of beams of light at the respective plurality of input facets and wavelength multiplexes the plurality of beams of light to provide an aggregated beam of light at the output facet; and a waveguide medium disposed between the optical window of the cap and the photonic integrated circuit, the waveguide medium including at least one directly written waveguide that is operative to couple the plurality of beams of light emitted by the plurality of laser diodes from the optical window of the cap to the input facets of the photonic integrated circuit; and at least one scan mirror positioned to receive the aggregate beam of light output at the output facet of the photonic integrated circuit, the at least one scan mirror controllably orientable to redirect the aggregate beam of light over a range of angles.

The WHUD may further include a processor communicatively coupled to the laser projector to modulate the generation of light signals. The WHUD may further include a transparent combiner carried by the support structure and positioned within a field of view of the user, in operation the transparent combiner directs laser light from an output of the laser projector into the field of view of the user.

Each of the plurality of input facets of the photonic integrated circuit may include a grating input coupler or an edge input coupler. The waveguide medium may be spaced apart from at least one of the optical window of the cap or the photonic integrated circuit. The waveguide medium may be in contact with at least one of the optical window of the cap or the photonic integrated circuit. The waveguide medium may include an organically modified ceramic (ORMOCER) material. The waveguide medium may be spaced apart from the optical window of the cap, and a surface of the waveguide medium that faces the optical window may be formed into a lens shape that directs the plurality of beams of light into the directly written waveguide of the waveguide medium.

The WHUD may further include a collimation lens positioned and oriented to receive and collimate the aggregate beam of light from the output facet of the photonic integrated circuit. The collimation lens may include an achromatic lens or an apochromatic lens. The WHUD may further include at least one diffractive optical element positioned and oriented to receive the aggregate beam of light, in operation, the at least one diffractive optical element may provide wavelength dependent focus correction for the aggregate beam of light.

The WHUD may further include a plurality of chip submounts bonded to the base substrate, wherein each of the laser diodes are bonded to a corresponding one of the plurality of chip submounts. The plurality of laser diodes may include a red laser diode to provide a red laser light, a green laser diode to provide a green laser light, a blue laser diode to provide a blue laser light, and an infrared laser diode to provide infrared laser light. The base substrate may be formed from at least one of low temperature co-fired ceramic (LTCC), aluminum nitride (AlN), alumina, or Kovar®.

The at least one laser diode driver circuit may be bonded to a first surface of the base substrate, and the plurality of laser diodes and the cap may be bonded to a second surface of the base substrate, the second surface of the base substrate opposite the first surface of the base substrate. The at least one laser diode driver circuit, the plurality of laser diodes, and the cap may be bonded to a first surface of the base substrate. The plurality of laser diodes and the cap may be bonded to the base substrate, and the at least one laser diode driver circuit may be bonded to another substrate separate from the base substrate.

Each of the laser diodes may include one of an edge emitter laser or a vertical-cavity surface-emitting laser (VCSEL).

The photonic integrated circuit may include a first plurality of waveguides, each waveguide of the first plurality of waveguides having a respective input facet, and the waveguide medium may include a second plurality of waveguides, each waveguide of the second plurality of waveguides to receive laser light from a respective laser diode of the plurality of laser diodes and couple the received laser light to the input facet of a respective waveguide in the first plurality of waveguides.

A wearable heads-up display (WHUD) may be summarized as including a support structure that in use is worn on the head of a user; a laser projector carried by the support structure, the laser projector including an optical engine, including a base substrate; a plurality of laser diodes, each of the plurality of laser diodes bonded directly or indirectly to the base substrate; at least one laser diode driver circuit operatively coupled to the plurality of laser diodes to selectively drive current to the plurality of laser diodes; a photonic integrated circuit bonded to the base substrate at a position that is spaced apart from the plurality of laser diodes, the photonic integrated circuit including a plurality of input facets and at least one output facet, in operation, the photonic integrated circuit receives a plurality of beams of light at the respective plurality of input facets and wavelength multiplexes the plurality of beams of light to provide an aggregated beam of light at the output facet; and a waveguide and sealing medium that covers and hermetically or partially hermetically seals the plurality of laser diodes, the waveguide and sealing medium including at least one directly written waveguide that couples the plurality of beams of light emitted by the plurality of laser diodes to the input facets of the photonic integrated circuit; and at least one scan mirror positioned to receive the aggregate beam of light output at the output facet of the photonic integrated circuit, the at least one scan mirror controllably orientable to redirect the aggregate beam of light over a range of angles.

The WHUD may further include a processor communicatively coupled to the laser projector to modulate the generation of light signals. The WHUD may further include a transparent combiner carried by the support structure and positioned within a field of view of the user, in operation the transparent combiner directs laser light from an output of the laser projector into the field of view of the user.

Each of the plurality of input facets of the photonic integrated circuit may include a grating input coupler or an edge input coupler. The waveguide medium may include an organically modified ceramic (ORMOCER) material. The WHUD may further include a collimation lens positioned and oriented to receive and collimate the aggregate beam of light from the output facet of the photonic integrated circuit. The collimation lens may include an achromatic lens or an apochromatic lens. The WHUD may further include at least one diffractive optical element positioned and oriented to receive the aggregate beam of light, in operation, the at least one diffractive optical element provides wavelength dependent focus correction for the aggregate beam of light.

The WHUD may further include a plurality of chip submounts bonded to the base substrate, wherein each of the laser diodes are bonded to a corresponding one of the plurality of chip submounts. The plurality of laser diodes may include a red laser diode to provide a red laser light, a green laser diode to provide a green laser light, a blue laser diode to provide a blue laser light, and an infrared laser diode to provide infrared laser light. The base substrate may be formed from at least one of low temperature co-fired ceramic (LTCC), aluminum nitride (AlN), alumina, or Kovar®.

The at least one laser diode driver circuit may be bonded to a first surface of the base substrate, and the plurality of laser diodes and the cap are bonded to a second surface of the base substrate, the second surface of the base substrate opposite the first surface of the base substrate.

The at least one laser diode driver circuit, the plurality of laser diodes, and the cap may be bonded to a first surface of the base substrate. The plurality of laser diodes and the cap may be bonded to the base substrate, and the at least one laser diode driver circuit may be bonded to another substrate separate from the base substrate.

Each of the laser diodes may include one of an edge emitter laser or a vertical-cavity surface-emitting laser (VCSEL).

The photonic integrated circuit may include a first plurality of waveguides, each waveguide of the first plurality of waveguides having a respective input facet, and the waveguide medium may include a second plurality of waveguides, each waveguide of the second plurality of waveguides to receive laser light from a respective laser diode of the plurality of laser diodes and couple the received laser light to the input facet of a respective waveguide in the first plurality of waveguides.

A method of manufacturing an optical engine may be summarized as including bonding a plurality of lasers directly or indirectly to a base substrate; coupling at least one laser diode driver circuit to the laser diodes, in operation the at least one laser diode driver circuit selectively drives current to the laser diodes; bonding a cap including at least one wall and at least one optical window to the base substrate, the at least one wall, the at least one optical window, and at least a portion of the base substrate together delimit an interior volume sized and dimensioned to receive at least the plurality of laser diodes, the bonding of the cap to the base substrate providing a hermetic or partially hermetic seal between the interior volume of the cap and a volume exterior to the cap, and the optical window positioned and oriented to allow light emitted from the laser diodes to exit the interior volume; bonding a photonic integrated circuit proximate the optical window of the cap, the photonic integrated circuit including a plurality of input facets and at least one output facet, in operation, the photonic integrated circuit receives a plurality of beams of light at the respective plurality of input facets and wavelength multiplexes the plurality of beams of light to provide an aggregated beam of light at the output facet; and disposing a waveguide medium between the optical window of the cap and the photonic integrated circuit, the waveguide medium including at least one directly written waveguide that couples beams of light emitted by the plurality of laser diodes to the input facets of the photonic integrated circuit.

The method may further include directly writing the at least one waveguide into the waveguide medium after disposing the waveguide medium between the optical window of the cap and the photonic integrated circuit. Directly writing the at least one waveguide into the waveguide medium may include writing a first plurality of waveguides into the waveguide medium, each waveguide of the first plurality of waveguides to receive laser light from a respective laser diode of the plurality of laser diodes and couple the received laser light to an input facet of a respective waveguide in a second plurality of waveguides in the photonic integrated circuit.

The method may further include forming a surface of the waveguide medium into at least one lens shape which couples beams of light emitted by the plurality of laser diodes to the at least one directly written waveguide.

The method may further include bonding each of the laser diodes indirectly to the base substrate by bonding each laser diode to a respective chip submount, and bonding each chip submount to the base substrate. Bonding each laser diode to a respective chip submount may include bonding each laser diode to a respective chip submount using a eutectic gold tin (AuSn) solder process. Bonding each chip submount to the base substrate may include step-soldering each chip submount to the base substrate. Bonding each chip submount to the base substrate may include bonding each chip submount to the base substrate using at least one of a reflow oven process, thermosonic bonding, thermocompression bonding, transient liquid phase (TLP) bonding, or laser soldering. Bonding each chip submount to the base substrate may include bonding a chip submount that has a red laser diode bonded thereto, bonding a chip submount that has a green laser diode bonded thereto, bonding a chip submount that has a blue laser diode bonded thereto, and bonding a chip submount that has an infrared laser diode bonded thereto.

Coupling at least one laser diode driver circuit to the laser diodes may include: bonding a plurality of electrical connections to the base substrate, each electrical connection coupled to a respective laser diode in the plurality of laser diodes; providing a coupling between each of the plurality of electrical connections and the at least one laser diode driver circuit; and bonding an electrically insulating cover to the base substrate over the plurality of electrical connections, wherein bonding the cap to the base substrate comprises bonding the cap to the base substrate and the electrically insulating cover. Providing a coupling between each of the plurality of electrical connections and the at least one laser diode driver circuit may include bonding a plurality of electrical contacts to the base substrate, each electrical contact coupled to a respective one of the plurality of electrical connections; and providing a coupling between each of the electrical contacts and the at least one laser diode driver circuit.

Bonding the plurality of laser diodes directly or indirectly to a base substrate may include bonding the laser diodes directly or indirectly to a first surface of the base substrate, and bonding a cap to the base substrate may include bonding a cap to the first surface of the base substrate, the method may further include bonding the at least one laser diode driver circuit to a second surface of the base substrate, the second surface of the base substrate opposite the first surface of the base substrate. Bonding the plurality of laser diodes directly or indirectly to a base substrate may include bonding the laser diodes directly or indirectly to a first surface of the base substrate, and bonding a cap to the base substrate may include bonding a cap to the first surface of the base substrate, the method may further include bonding the at least one laser diode driver circuit to the first surface of the base substrate.

Bonding a cap to the base substrate may include bonding a cap to the base substrate using at least one of a seam welding process, a laser assisted soldering process, or a diffusion bonding process.

The method may further include positioning and orienting a collimation lens to receive and collimate the aggregate beam of light from the output facet of the photonic integrated circuit.

The method may further include laser writing the photonic integrated circuit into writeable glass before bonding the photonic integrated circuit proximate the optical window of the cap. Laser writing the photonic integrated circuit into writeable glass may include laser writing a plurality of waveguides into the writeable glass, each waveguide of the plurality of waveguides being written for a respective one laser diode of the plurality of laser diodes. Laser writing a plurality of waveguides into the writeable glass may include writing a waveguide combiner into the writeable glass. Writing a waveguide combiner into the writeable glass may include writing at least one of: a directional coupler, Y-branch, whispering gallery mode, or multi-mode interface coupler. Laser writing a plurality of waveguides into the writeable glass may include laser writing each waveguide of the plurality of waveguide to have a input facet to receive laser light from a respective laser diode of the plurality of laser diodes and an output facet to output the received laser light, a spacing between the output facets of each waveguide being smaller than a spacing of the input facets of each waveguide.

A method of manufacturing an optical engine may be summarized as including bonding a plurality of lasers directly or indirectly to a base substrate; coupling at least one laser diode driver circuit to the laser diodes, in operation the at least one laser diode driver circuit selectively drives current to the laser diodes; bonding a photonic integrated circuit proximate the plurality of laser diodes, the photonic integrated circuit including a plurality of input facets and at least one output facet, in operation, the photonic integrated circuit receives a plurality of beams of light at the respective plurality of input facets and wavelength multiplexes the plurality of beams of light to provide an aggregated beam of light at the output facet; and disposing a waveguide medium between the laser diodes and the photonic integrated circuit, the waveguide medium providing a hermetic or partially hermetic seal for the plurality of laser diodes, and the waveguide medium including at least one directly written waveguide that couples beams of light emitted by the plurality of laser diodes to the input facets of the photonic integrated circuit.

The method may further include directly writing the at least one waveguide into the waveguide medium after disposing the waveguide medium between the optical window of the cap and the photonic integrated circuit. Directly writing the at least one waveguide into the waveguide medium may include writing a first plurality of waveguides into the waveguide medium, each waveguide of the first plurality of waveguides to receive laser light from a respective laser diode of the plurality of laser diodes and couple the received laser light to an input facet of a respective waveguide in a second plurality of waveguides in the photonic integrated circuit.

Disposing a waveguide medium between the laser diodes and the photonic integrated circuit may include covering the plurality of lasers with the waveguide medium and at least partially covering a coupling between the at least one laser diode driver circuit and the plurality of laser diodes. Disposing a waveguide medium between the laser diodes and the photonic integrated circuit may include covering at least a portion of an edge and a top surface of the photonic integrated circuit.

The method may further include: bonding each of the laser diodes indirectly to the base substrate by bonding each laser diode to a respective chip submount; and bonding each chip submount to the base substrate. Bonding each laser diode to a respective chip submount may include bonding each laser diode to a respective chip submount using a eutectic gold tin (AuSn) solder process. Bonding each chip submount to the base substrate may include step-soldering each chip submount to the base substrate. Bonding each chip submount to the base substrate may include bonding each chip submount to the base substrate using at least one of a reflow oven process, thermosonic bonding, thermocompression bonding, transient liquid phase (TLP) bonding, or laser soldering. Bonding each chip submount to the base substrate comprises bonding a chip submount that has a red laser diode bonded thereto, bonding a chip submount that has a green laser diode bonded thereto, bonding a chip submount that has a blue laser diode bonded thereto, and bonding a chip submount that has an infrared laser diode bonded thereto.

Coupling at least one laser diode driver circuit to the laser diodes may include: bonding a plurality of electrical connections to the base substrate, each electrical connection coupled to a respective laser diode in the plurality of laser diodes; and providing a coupling between each of the plurality of electrical connections and the at least one laser diode driver circuit. Providing a coupling between each of the plurality of electrical connections and the at least one laser diode driver circuit may include: bonding a plurality of electrical contacts to the base substrate, each electrical contact coupled to a respective one of the plurality of electrical connections; and providing a coupling between each of the electrical contacts and the at least one laser diode driver circuit.

Bonding the plurality of laser diodes directly or indirectly to a base substrate may include bonding the laser diodes directly or indirectly to a first surface of the base substrate, and the method may further include bonding the at least one laser diode driver circuit to a second surface of the base substrate, the second surface of the base substrate opposite the first surface of the base substrate. Bonding the plurality of laser diodes directly or indirectly to a base substrate may include bonding the laser diodes directly or indirectly to a first surface of the base substrate, and the method may further include bonding the at least one laser diode driver circuit to the first surface of the base substrate.

The method may further include positioning and orienting a collimation lens to receive and collimate the aggregate beam of light from the output facet of the photonic integrated circuit.

The method may further include laser writing the photonic integrated circuit into writeable glass before bonding the photonic integrated proximate the plurality of laser diodes. Laser writing the photonic integrated circuit into writeable glass may include laser writing a plurality of waveguides into the writeable glass, each waveguide of the plurality of waveguides being written for a respective one laser diode of the plurality of laser diodes. Laser writing a plurality of waveguides into the writeable glass may include writing a waveguide combiner into the writeable glass. Writing a waveguide combiner into the writeable glass may include writing at least one of: a directional coupler, Y-branch, whispering gallery mode, or multi-mode interface coupler. Laser writing a plurality of waveguides into the writeable glass may include laser writing each waveguide of the plurality of waveguides to have a input facet to receive laser light from a respective laser diode of the plurality of laser diodes and an output facet to output the received laser light, a spacing between the output facets of each waveguide being smaller than a spacing of the input facets of each waveguide.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

FIG. 19A is a left side sectional view of a set of collimation lenses for circularizing and collimating a beam of light.

FIG. 19B is a top side sectional elevational view of the set of collimation lenses of FIG. 19A.

FIGS. 19C and 19D are isometric views of exemplary lens shapes which could be used as a collimation lens in the implementation of FIGS. 19A and 19B.

DETAILED DESCRIPTION

Figure 1A:
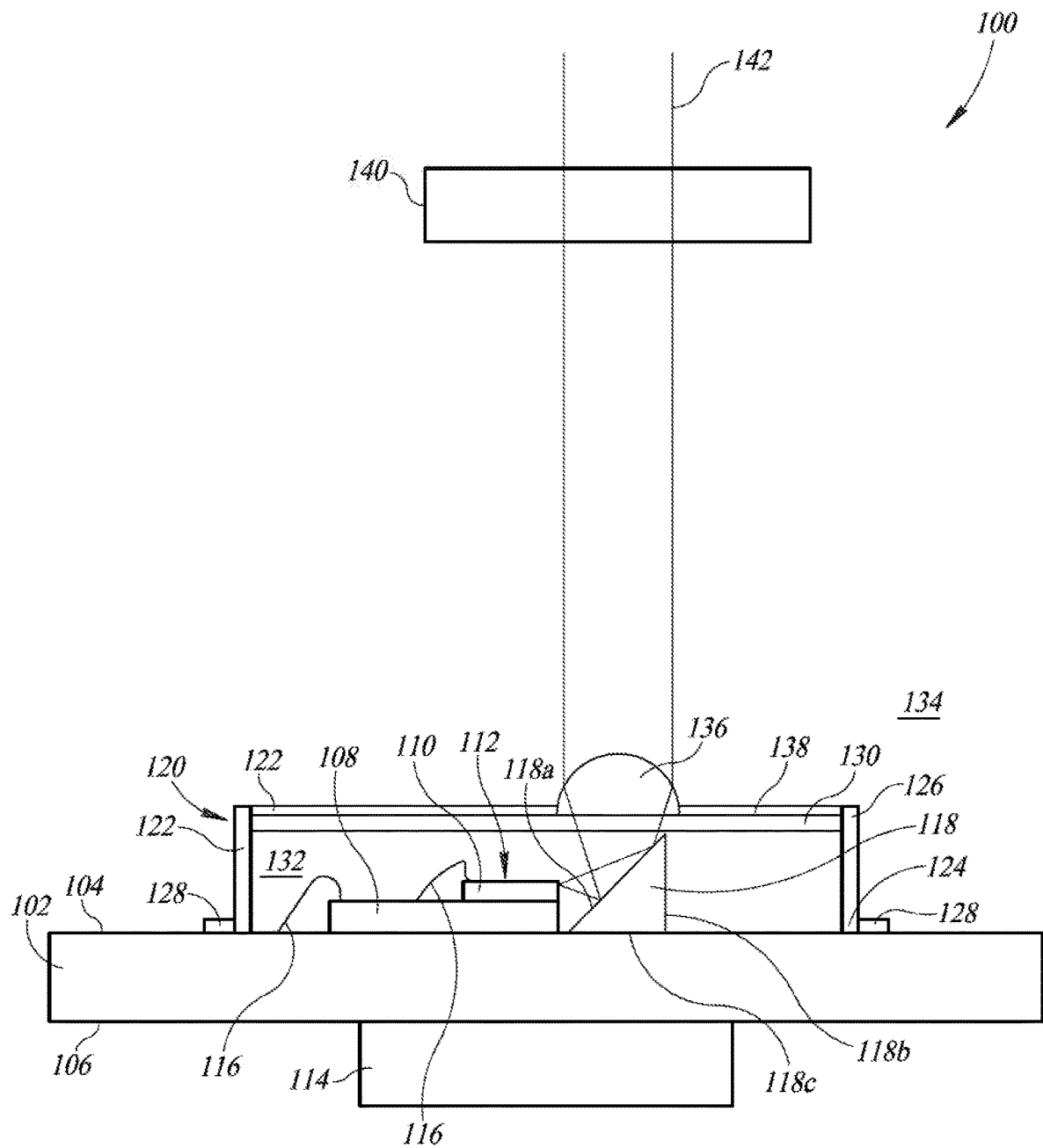
FIG. 1A is a left side, sectional elevational view of an optical engine, in accordance with the present systems, devices, and methods.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

One or more implementations of the present disclosure provide laser-based optical engines, for example, laser-based optical engines for laser projectors used in wearable heads-up displays or other applications. Generally, the optical engines discussed herein integrate a plurality of laser dies or diodes (e.g., 3 laser diodes, 4 laser diodes) within a single, hermetically or partially hermetically sealed, encapsulated package. As discussed further below with reference to FIGS. 6 and 7, in at least some implementations, photonic integrated circuits having input facets (e.g., edge couplers, grating couplers) may be used to wavelength multiplex beams of light emitted by the plurality of laser diodes into a coaxially superimposed aggregate beam. Alternatively, each wavelength of light may be channeled individually through the photonic integrated circuit. In at least some implementations, the laser diodes are coupled to the photonic integrated circuit via directly written waveguides. In at least some implementations, the waveguide medium in which the waveguides are written may also provide a seal for the laser diodes, thereby eliminating the need for a separate cap to hermetically or partially hermetically seal the laser diodes on a base substrate, for example. Such optical engines may have various advantages over existing designs including, for example, smaller volume, lower weight, better manufacturability, lower cost, faster modulation speed, etc. The material used for the optical engines discussed herein may be any suitable materials, e.g., ceramics with advantageous thermal properties, etc. As noted above, such features are particularly advantages in various applications including WHUDs.

Figure 1B:
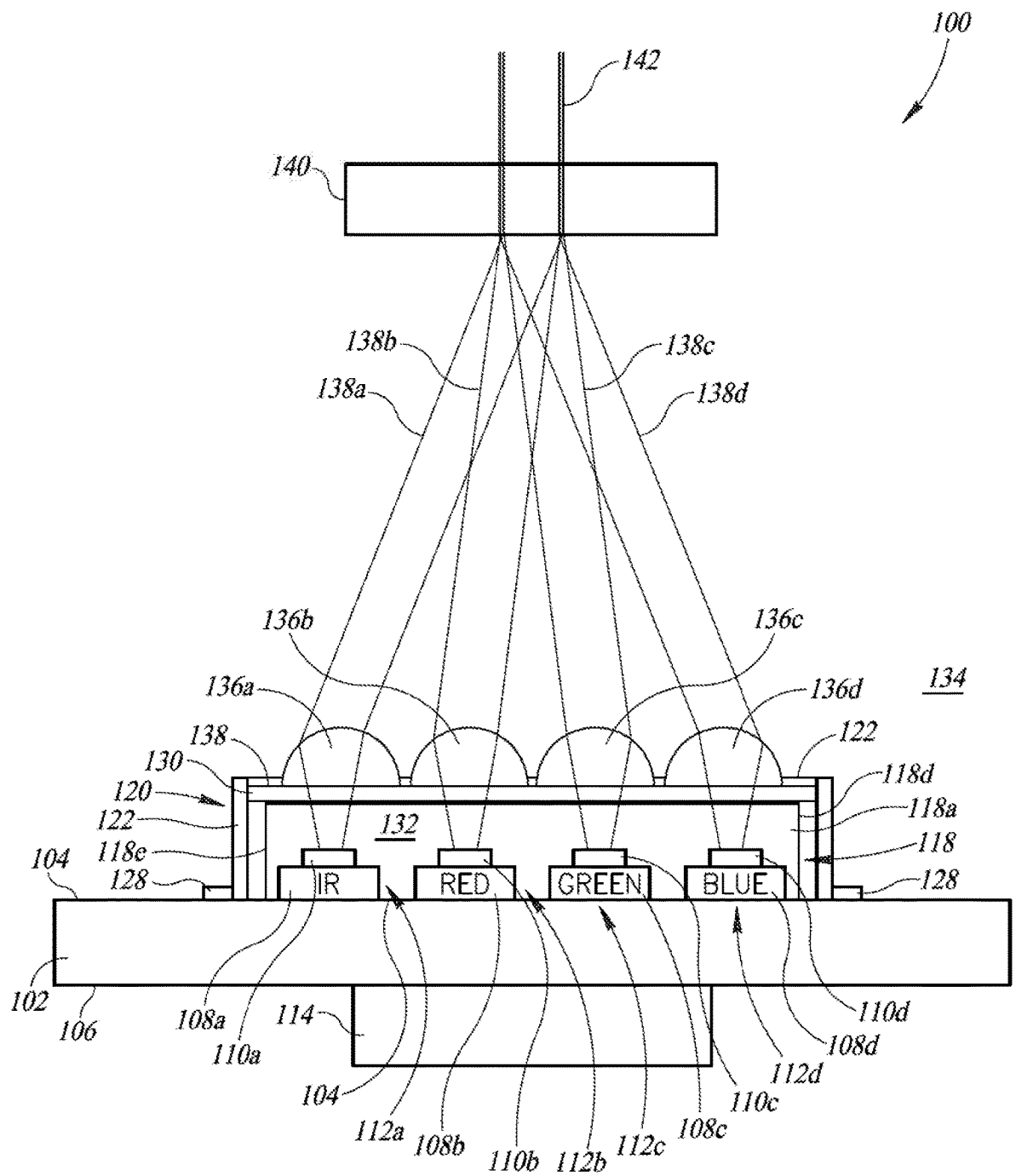
FIG. 1B is a front side, sectional elevational view of the optical engine also shown in FIG. 1A, in accordance with the present systems, devices, and methods.

FIG. 1A is a left side, elevational sectional view of an optical engine 100, which may also be referred to as a "multi-laser diode module" or an "RGB laser module," in accordance with the present systems, devices, and methods. FIG. 1B is a front side, elevational sectional view of the optical engine 100. The optical engine 100 includes a base substrate 102 having a top surface 104 and a bottom surface 106 opposite the top surface. The base substrate 102 may be formed from a material that is radio frequency (RF) compatible and is suitable for hermetic sealing. For example, the base substrate 102 may be formed from low temperature co-fired ceramic (LTCC), aluminum nitride (AlN), alumina, aluminum nitride (AlN), Kovar®, other ceramics with suitable thermal properties, etc. The term Kovar® generally refers to iron-nickel-cobalt alloys having similar thermal expansion coefficients to glass and ceramics, thus making Kovar® materials particularly suitable for forming hermetic seals which remain functional in a wide range of temperatures.

The optical engine 100 also includes a plurality of chip submounts 108a-108d (collectively 108) bonded (e.g., attached) to the top surface 104 of the base substrate 102. The plurality of chip submounts 108 are aligned in a row across a width of the optical engine 100 between the left and right sides thereof. Each of the plurality of chip submounts 108 includes a laser diode 110, also referred to as a laser chip or laser die, bonded thereto. In particular, an infrared chip submount 108a carries an infrared laser diode 110a, a red chip submount 108b carries a red laser diode 110b, a green chip submount 108c carries a green laser diode 110c, and a blue chip submount 108d carries a blue laser diode 110d. In operation, the infrared laser diode 110a provides infrared laser light, the red laser diode 110b provides red laser light, the green laser diode 110c provides green laser light, and the blue laser diode 110d provides blue laser light. Each of the laser diodes 110 may comprise one of an edge emitter laser or a vertical-cavity surface-emitting laser (VCSEL), for example. Each of the four laser diode/chip submount pairs may be referred to collectively as a "laser chip on submount," or a laser CoS 112. Thus, the optical engine 100 includes an infrared laser CoS 112a, a red laser CoS 112b, a green laser CoS 112c, and a blue laser CoS 112d. In at least some implementations, one or more of the laser diodes 110 may be bonded directly to the base substrate 102 without use of a submount 108. It should be appreciated that although some implementations discussed herein describe laser diodes as chips or dies on submounts, other dies or types of devices, e.g., p-side down devices, may be used as well.

The optical engine 100 also includes a laser diode driver circuit 114 bonded to the bottom surface 106 of the base substrate 102. The laser diode driver circuit 114 is operatively coupled to the plurality of laser diodes 110 via suitable electrical connections 116 to selectively drive current to the plurality of laser diodes. In at least some implementations, the laser diode driver circuit 114 may be positioned relative to the CoSs 112 to minimize the distance between the laser diode driver circuit 114 and the CoSs 112. Although not shown in FIGS. 1A and 1B, the laser diode driver circuit 114 may be operatively coupleable to a controller (e.g., microcontroller, microprocessor, ASIC) which controls the operation of the laser diode driver circuit 114 to selectively modulate laser light emitted by the laser diodes 110. In at least some implementations, the laser diode driver circuit 114 may be bonded to another portion of the base substrate 102, such as the top surface 104 of the base substrate. In at least some implementations, the laser diode driver circuitry 114 may be remotely located and operatively coupled to the laser diodes 110. In order to not require the use of impedance matched transmission lines, the size scale may be small compared to a wavelength (e.g., lumped element regime), where the electrical characteristics are described by (lumped) elements like resistance, inductance, and capacitance.

Proximate the laser diodes 110 there is positioned an optical director element 118. Like the chip submounts 108, the optical director element 118 is bonded to the top surface 104 of the base substrate 102. In the illustrated example, the optical director element 118 has a triangular prism shape that includes a plurality of planar faces. In particular the optical director element 118 includes an angled front face 118a that extends along the width of the optical engine 100, a rear face 118b, a bottom face 118c that is bonded to the top surface 104 of the base substrate 102, a left face 118d, and a right face 118e opposite the left face. The optical director element 118 may comprise a mirror or a prism, for example.

The optical engine 100 also includes a cap 120 that includes a vertical sidewall 122 having a lower first end 124 and an upper second end 126 opposite the first end. A flange 128 may be disposed around a perimeter of the sidewall 122 adjacent the lower first end 124. Proximate the upper second end 126 of the sidewall 122 there is a horizontal optical window 130 that forms the "top" of the cap 120. The sidewall 122 and the optical window 130 together define an interior volume 132 sized and dimensioned to receive the plurality of chip submounts 108, the plurality of laser diodes 110, and the optical director element 118. The lower first end 124 and the flange 128 of the cap 120 are bonded to the base substrate 102 to provide a hermetic or partially hermetic seal between the interior volume 132 of the cap and a volume 134 exterior to the cap.

As shown best in FIG. 1A, the optical director element 118 is positioned and oriented to direct (e.g., reflect) laser light received from each of the plurality of laser diodes 108 upward (as shown) toward the optical window 130 of the cap 120, wherein the laser light exits the interior volume 132.

The cap 120 may have a round shape, rectangular shape, or other shape. Thus, the vertical sidewall 122 may comprise a continuously curved sidewall, a plurality (e.g., four) of adjacent planar portions, etc. The optical window 130 may comprise an entire top of the cap 120, or may comprise only a portion thereof. In at least some implementations, the optical window 130 may be located on the sidewall 122 rather than positioned as a top of the cap 120, and the laser diodes 110 and/or the optical director element 118 may be positioned and oriented to direct the laser light from the laser diodes toward the optical window on the sidewall 122. At least some implementations may not include optical director element 118 such that laser light from the laser diodes may be output towards the optical window on the sidewall 122 without the need for intervening optical elements. In at least some implementations, the cap 120 may include a plurality of optical windows instead of a single optical window.

The optical engine 100 also includes four collimation/pointing lenses 136a-136d (collectively 136), one for each of the four laser diodes 110a-110d, respectively, that are bonded to a top surface 138 of the optical window 130. Each of the plurality of collimation lenses 136 is positioned and oriented to receive light from a corresponding one of the laser diodes 110 through the optical window 130. In particular, the collimation lens 136a receives light from the infrared laser diode 110a via the optical director element 118 and the optical window 130, the collimation lens 136b receives light from the red laser diode 110b via the optical director element and the optical window, the collimation lens 136c receives light from the green laser diode 110c via the optical director element and the optical window, and the collimation lens 136d receives light from the blue laser diode 110d via the optical director element and the optical window.

Each of the collimation lenses 136 is operative to receive laser light from a respective one of the laser diodes 110, and to generate a single color beam. In particular, the collimation lens 136a receives infrared laser light from the infrared laser diode 110a and produces an infrared laser beam 138a, the collimation lens 136b receives red laser light from the red laser diode 110b and produces a red laser beam 138b, the collimation lens 136c receives green laser light from the green laser diode 110c and produces a green laser beam 138c, and the collimation lens 136d receives blue laser light from the blue laser diode 110d and produces a blue laser beam 138d.

Figure 3:
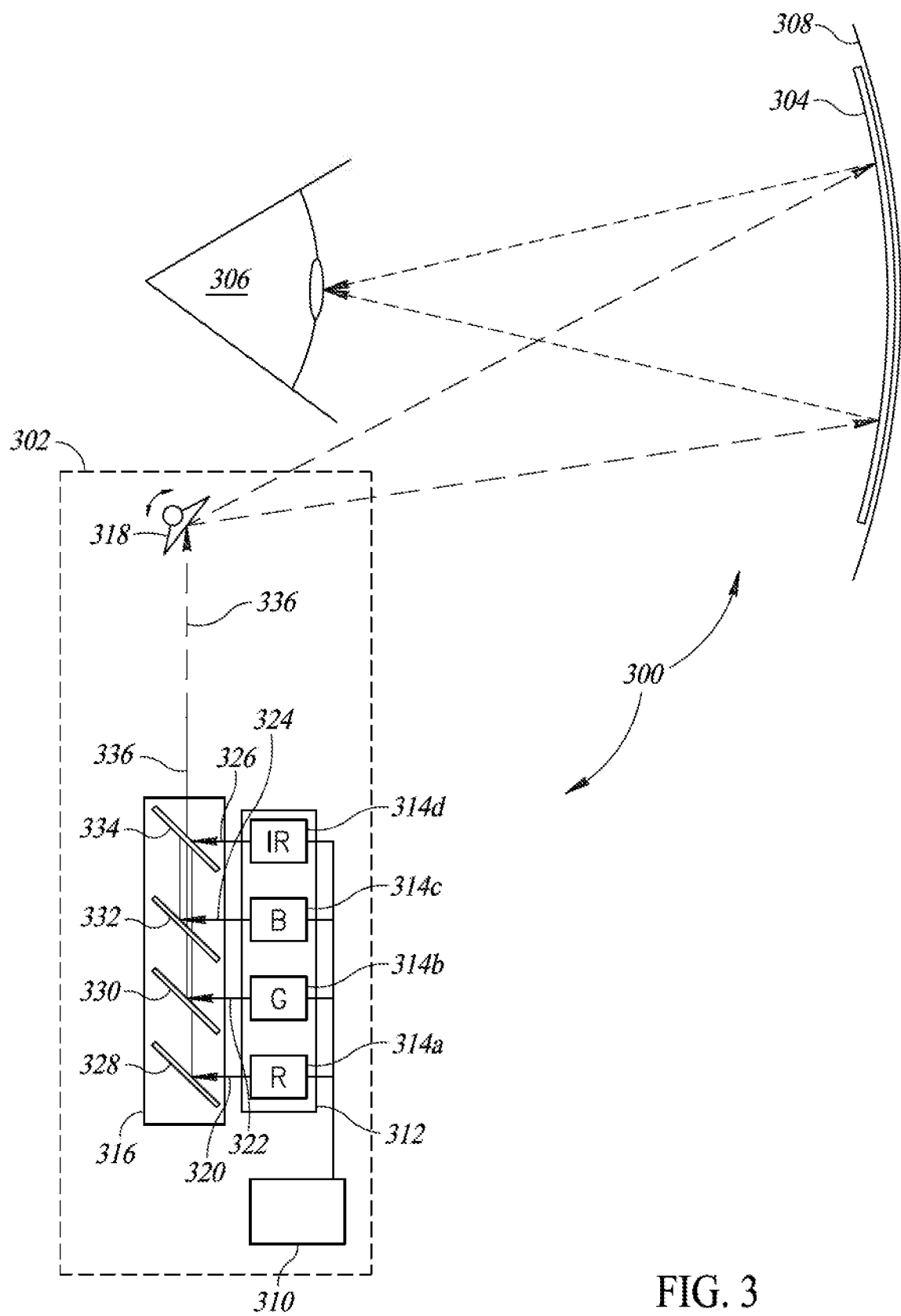
FIG. 3 is a schematic diagram of a wearable heads-up display with a laser projector that includes an optical engine, and a transparent combiner in a field of view of an eye of a user, in accordance with the present systems, devices, and methods.

The optical engine 100 may also include, or may be positioned proximate to, a beam combiner 140 that is positioned and oriented to combine the light beams 138a-138d received from each of the collimation lenses 136 into a single aggregate beam 142. As an example, the beam combiner 140 may include one or more diffractive optical elements (DOE) and/or refractive/reflective optical elements that combine the different color beams 138a-138d in order to achieve coaxial superposition. An example beam combiner is shown in FIG. 3 and discussed below.

In at least some implementations, the laser CoSs 112, the optical director element 118, and/or the collimation lenses 136 may be positioned differently. As noted above, laser diode driver circuit 114 may be mounted on the top surface 104 or the bottom surface 106 of the base substrate 102, depending on the RF design and other constraints (e.g., package size). In at least some implementations, the optical engine 100 may not include the optical director element 118, and the laser light may be directed from the laser diodes 110 toward the collimation lenses 136 without requiring an intermediate optical director element. Additionally, in at least some implementations, one or more of the laser diodes may be mounted directly on the base substrate 102 without use of a submount.

For the sake of a controlled atmosphere inside the interior volume 132, it may be desirable to have no organic compounds inside the interior volume 132. In at least some implementations, the components of the optical engine 100 may be bonded together using no adhesives. In other implementations, a low amount of adhesives may be used to bond at least one of the components, which may reduce cost while providing a relatively low risk of organic contamination for a determined lifetime (e.g., 2 or more years) of the optical engine 100. The use of adhesives may result in a partial hermetic seal, but this partial hermetic seal may be acceptable in certain applications, as detailed below.

Generally, "hermetic" refers to a seal which is airtight, that is, a seal which excludes the passage of air, oxygen, and other gases. "Hermetic" within the present specification carries this meaning. Further, "partially hermetic" as used herein refers to a seal which limits, but does not necessarily completely prevent, the passage of gases such as air. "Partially hermetic" as used herein may alternatively be stated as "reduced hermiticity". In the example above, adhesives may be used to bond components. Such adhesives may result in a seal being not completely hermetic, in that some amount of gasses may slowly leak through the adhesive. However, such a seal can still be considered "partially hermetic" or as having "reduced hermiticity", because the seal reduces the flow of gasses therethrough.

In one example application, even in an environment with only partial hermiticity, the life of laser diodes 110 and transparency of optical window 130 may be maintained longer than the life of a battery of a device, such that partial hermiticity may be acceptable for the devices. In some cases, even protecting interior volume 132 from particulate with a dust cover may be sufficient to maintain laser diodes 110 and transparency of optical window 130 for the intended lifespan of the device. In some cases, laser diodes 110 and transparency of optical window 130 may last for the intended lifespan of the device even without a protective cover. Various bonding processes (e.g., attaching processes) for the optical engine 100 are discussed below with reference to FIG. 5.

Figure 2:
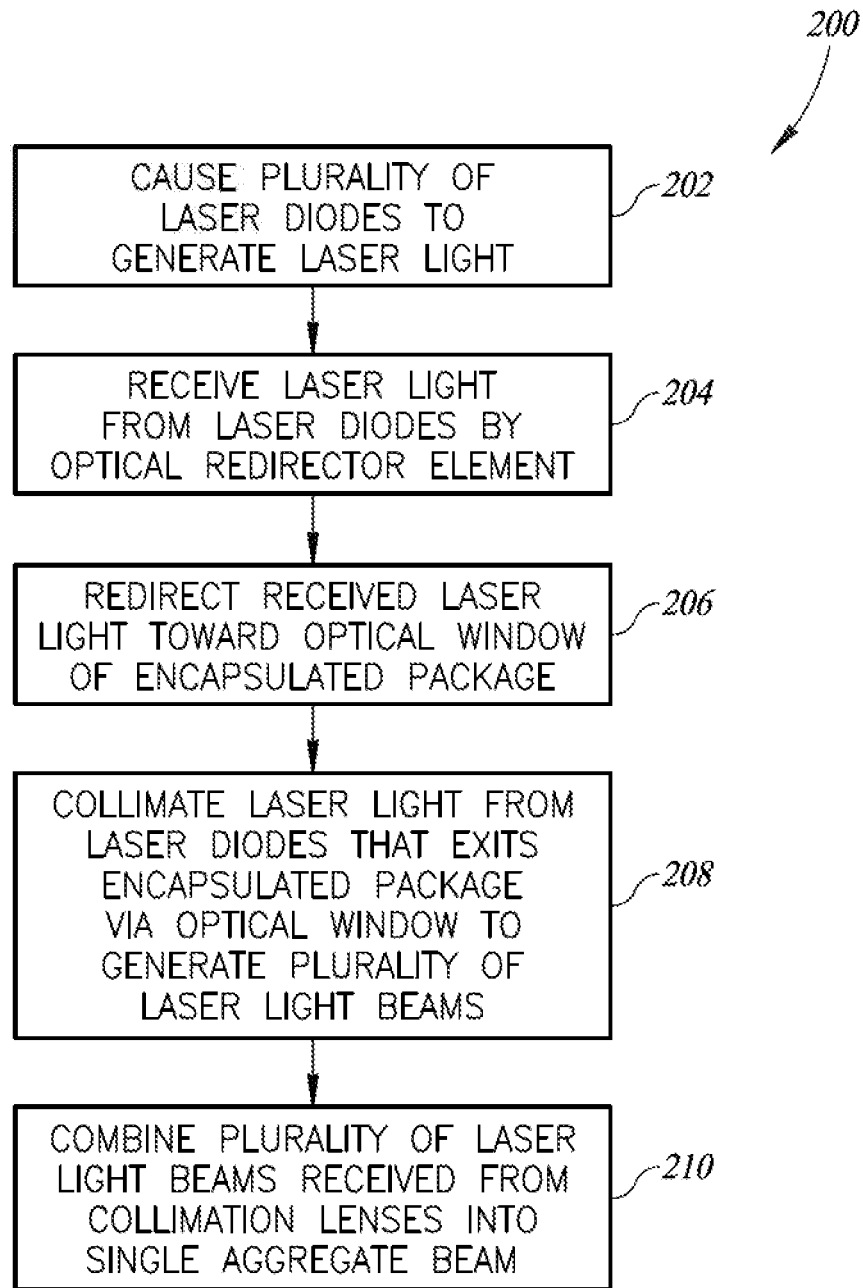
FIG. 2 is a flow diagram of a method of operating an optical engine, in accordance with the present systems, devices, and methods.

FIG. 2 is a flow diagram of a method 200 of operating an optical engine, in accordance with the present systems, devices, and methods. The method 200 may be implemented using the optical engine 100 of FIGS. 1A-1B, for example. It should be appreciated that methods of operating optical engines according to the present disclosure may include fewer or additional acts than set forth in the method 200. Further, the acts discussed below may be performed in an order different than the order presented herein.

At 202, at least one controller may cause a plurality of laser diodes of an optical engine to generate laser light. As discussed above, the plurality of laser diodes may be hermetically or partially hermetically sealed in an encapsulated package. The laser diodes may produce light sequentially and/or simultaneously with each other. At 204, at least one optical director element may optionally receive the laser light from the laser diodes. The optical director element may comprise a mirror or a prism, for example. As discussed above, in at least some implementations the optical engine may be designed such that laser light exits the optical engine without use of an optical director element.

At 206, the at least one optical director element, if included, may direct the received laser light toward an optical window of the encapsulated package. For example, the optical director element may reflect the received laser light toward the optical window of the encapsulated package. In implementations without at least one optical director element, the laser light generated by the plurality of laser diodes may be output directly toward the optical window of the encapsulated package.

At 208, a plurality of collimation lenses may collimate the laser light from the laser diodes that exits the encapsulated package via the optical window to generate a plurality of differently colored laser light beams. The collimation lenses may be positioned inside or outside of the encapsulated package. As an example, the collimation lenses may be physically coupled to the optical window of the encapsulated package.

At 210, a beam combiner may combine the plurality of laser light beams received from each of the collimation lenses into a single aggregate beam. The beam combiner may include one or more diffractive optical elements (DOE) that combine different color beams in order to achieve coaxial superposition, for example. The beam combiner may include one or more DOEs and/or one or more refractive/reflective optical elements. An example beam combiner is shown in FIG. 3 and discussed below.

FIG. 3 is a schematic diagram of a wearable heads-up display (WHUD) 300 with an exemplary laser projector 302, and a transparent combiner 304 in a field of view of an eye 306 of a user of the WHUD, in accordance with the present systems, devices, and methods. The WHUD 300 includes a support structure (not shown), with the general shape and appearance of an eyeglasses frame, carrying an eyeglass lens 308 with the transparent combiner 304, and the laser projector 302.

The laser projector 302 comprises a controller or processor 310, an optical engine 312 comprising four laser diodes 314a, 314b, 314c, 314d (collectively 314) communicatively coupled to the processor 310, a beam combiner 316, and a scan mirror 318. The optical engine 312 may be similar or identical to the optical engine 100 discussed above with reference to FIGS. 1A and 1B. Generally, the term "processor" refers to hardware circuitry, and may include any of microprocessors, microcontrollers, application specific integrated circuits (ASICs), digital signal processors (DSPs), programmable gate arrays (PGAs), and/or programmable logic controllers (PLCs), or any other integrated or non-integrated circuit.

During operation of the WHUD 300, the processor 310 modulates light output from the laser diodes 314, which includes a first red laser diode 314a (R), a second green laser diode 314b (G), a third blue laser diode 314c (B), and a fourth infrared laser diode 314d (IR). The first laser diode 314a emits a first (e.g., red) light signal 320, the second laser diode 314b emits a second (e.g., green) light signal 322, the third laser diode 314c emits a third (e.g., blue) light signal 324, and the fourth laser diode 314d emits a fourth (e.g., infrared) light signal 326. All four of light signals 320, 322, 324, and 326 enter or impinge on the beam combiner 316. Beam combiner 316 could for example be based on any of the beam combiners described in U.S. Provisional Patent Application Ser. No. 62/438,725, U.S. Non-Provisional patent application Ser. No. 15/848,265 (U.S. Publication Number 2018/0180885), U.S. Non-Provisional patent application Ser. No. 15/848,388 (U.S. Publication Number 2018/0180886), U.S. Provisional Patent Application Ser. No. 62/450,218, U.S. Non-Provisional patent application Ser. No. 15/852,188 (U.S. Publication Number 2018/0210215), U.S. Non-Provisional patent application Ser. No. 15/852,282, (U.S. Publication Number 2018/0210213), and/or U.S. Non-Provisional patent application Ser. No. 15/852,205 (U.S. Publication Number 2018/0210216).

In the illustrated example, the beam combiner 316 includes optical elements 328, 330, 332, and 334. The first light signal 320 is emitted towards the first optical element 328 and reflected by the first optical element 328 of the beam combiner 316 towards the second optical element 330 of the beam combiner 316. The second light signal 322 is also directed towards the second optical element 330. The second optical element 330 is formed of a dichroic material that is transmissive of the red wavelength of the first light signal 320 and reflective of the green wavelength of the second light signal 322. Therefore, the second optical element 330 transmits the first light signal 320 and reflects the second light signal 322. The second optical element 330 combines the first light signal 320 and the second light signal 322 into a single aggregate beam (shown as separate beams for illustrative purposes) and routes the aggregate beam towards the third optical element 332 of the beam combiner 316.

The third light signal 324 is also routed towards the third optical element 332. The third optical element 332 is formed of a dichroic material that is transmissive of the wavelengths of light (e.g., red and green) in the aggregate beam comprising the first light signal 320 and the second light signal 322 and reflective of the blue wavelength of the third light signal 324. Accordingly, the third optical element 332 transmits the aggregate beam comprising the first light signal 320 and the second light signal 322 and reflects the third light signal 324. In this way, the third optical element 332 adds the third light signal 324 to the aggregate beam such that the aggregate beam comprises the light signals 320, 322, and 324 (shown as separate beams for illustrative purposes) and routes the aggregate beam towards the fourth optical element 334 in the beam combiner 316.

The fourth light signal 326 is also routed towards the fourth optical element 334. The fourth optical element 334 is formed of a dichroic material that is transmissive of the visible wavelengths of light (e.g., red, green, and blue) in the aggregate beam comprising the first light signal 320, the second light signal 322, and the third light signal 324 and reflective of the infrared wavelength of the fourth light signal 326. Accordingly, the fourth optical element 334 transmits the aggregate beam comprising the first light signal 320, the second light signal 322, and the third light signal 324 and reflects the fourth light signal 326. In this way, the fourth optical element 334 adds the fourth light signal 326 to the aggregate beam such that the aggregate beam 336 comprises portions of the light signals 320, 322, 324, and 326. The fourth optical element 334 routes the aggregate beam 336 towards the controllable scan mirror 318.

The scan mirror 318 is controllably orientable and scans (e.g. raster scans) the beam 336 to the eye 306 of the user of the WHUD 300. In particular, the controllable scan mirror 318 scans the laser light onto the transparent combiner 304 carried by the eyeglass lens 308. The scan mirror 318 may be a single bi-axial scan mirror or two single-axis scan mirrors may be used to scan the laser light onto the transparent combiner 304, for example. In at least some implementations, the transparent combiner 304 may be a holographic combiner with at least one holographic optical element. The transparent combiner 304 redirects the laser light towards a field of view of the eye 306 of the user. The laser light redirected towards the eye 306 of the user may be collimated by the transparent combiner 304, wherein the spot at the transparent combiner 304 is approximately the same size and shape as the spot at the eye 306 of the user. The laser light may be converged by the eye 306 to a focal point at the retina of eye 306 and creates an image that is focused. The visible light may create display content in the field of view of the user, and the infrared light may illuminate the eye 306 of the user for the purpose of eye tracking.

Figure 4:
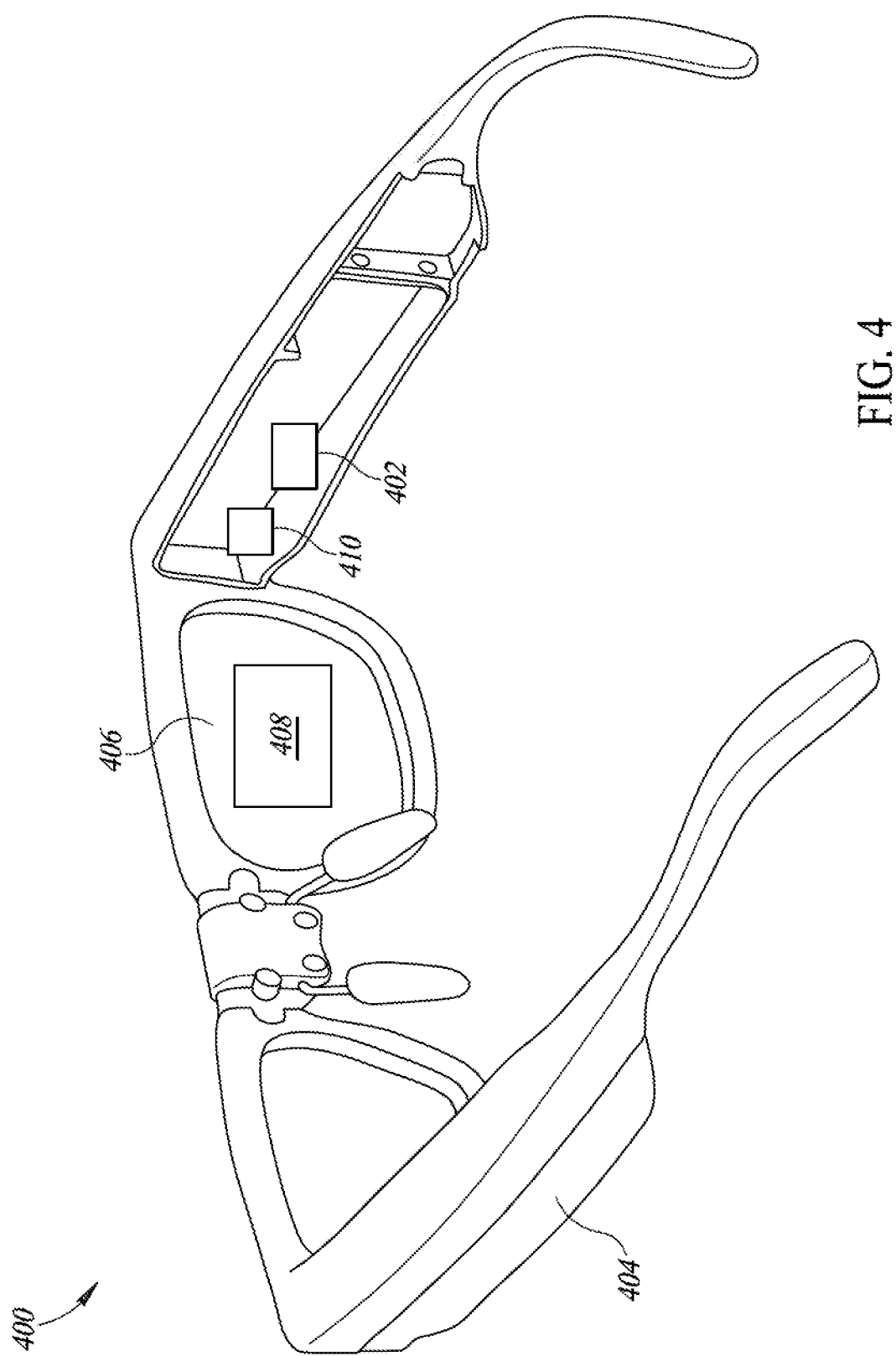
FIG. 4 is an isometric view of a wearable heads-up display with a laser projector that includes an optical engine, in accordance with the present systems, devices, and methods.

FIG. 4 is a schematic diagram of a wearable heads-up display (WHUD) 400 with a laser projector 402 in accordance with the present systems, devices, and methods. WHUD 400 includes a support structure 404 with the shape and appearance of a pair of eyeglasses that in use is worn on the head of the user. The support structure 404 carries multiple components, including eyeglass lens 406, a transparent combiner 408, the laser projector 402, and a controller or processor 410. The laser projector 402 may be similar or identical to the laser projector 302 of FIG. 3. For example, the laser projector 402 may include an optical engine, such as the optical engine 100 or the optical engine 312. The laser projector 402 may be communicatively coupled to the controller 410 (e.g., microprocessor) which controls the operation of the projector 402, as discussed above. The controller 410 may include or may be communicatively coupled to a non-transitory processor-readable storage medium (e.g., memory circuits such as ROM, RAM, FLASH, EEPROM, memory registers, magnetic disks, optical disks, other storage), and the controller may execute data and/or instruction from the non-transitory processor readable storage medium to control the operation of the laser projector 402.

In operation of the WHUD 400, the controller 410 controls the laser projector 402 to emit laser light. As discussed above with reference to FIG. 3, the laser projector 402 generates and directs an aggregate beam (e.g., aggregate beam 336 of FIG. 3) toward the transparent combiner 408 via at least one controllable mirror (not shown in FIG. 4). The aggregate beam is directed towards a field of view of an eye of a user by the transparent combiner 408. The transparent combiner 408 may collimate the aggregate beam such that the spot of the laser light incident on the eye of the user is at least approximately the same size and shape as the spot at transparent combiner 408. The transparent combiner 408 may be a holographic combiner that includes at least one holographic optical element.

Figure 5:
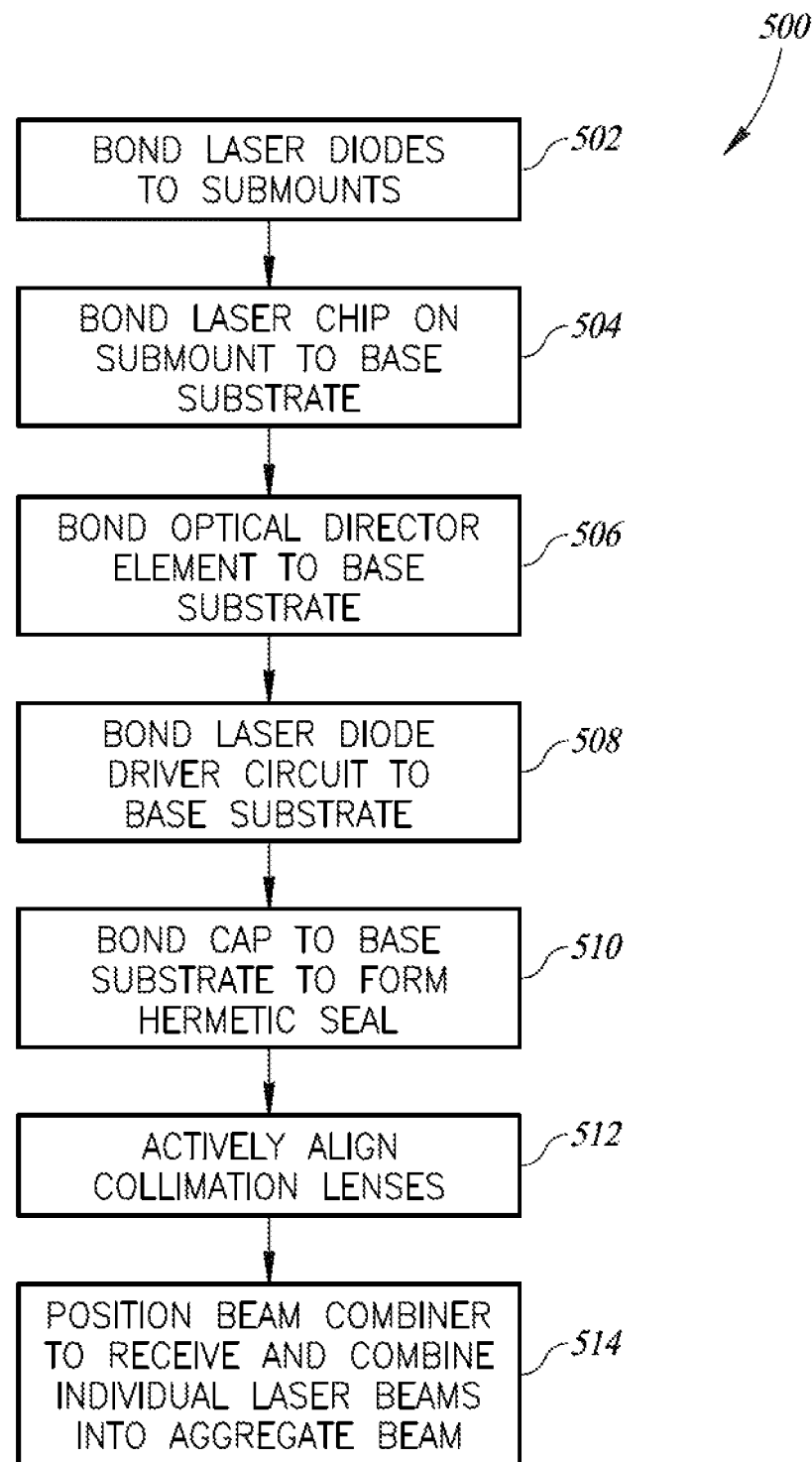
FIG. 5 is a flow diagram of a method of manufacturing an optical engine, in accordance with the present systems, devices, and methods.

FIG. 5 is a flow diagram of a method 500 of manufacturing an optical engine, in accordance with the present systems, devices, and methods. The method 500 may be implemented to manufacture the optical engine 100 of FIGS. 1A-1B or the optical engine 312 of FIG. 3, for example. It should be appreciated that methods of manufacturing optical engines according to the present disclosure may include fewer or additional acts than set forth in the method 500. Further, the acts discussed below may be performed in an order different than the order presented herein.

At 502, a plurality of laser diodes may be bonded to a respective plurality of submounts. In at least some implementations, this method may be performed by an entity different than that manufacturing the optical engine. For example, in at least some implementations, one or more of the plurality of laser diodes (e.g., green laser diode, blue laser diode) may be purchased as already assembled laser CoSs. For ease of handling and simplification of the overall process, in at least some implementations it may be advantageous to also bond laser diodes that cannot be procured on submounts to a submount as well. As a non-limiting example, in at least some implementations, one or more of the laser diodes may be bonded to a corresponding submount using an eutectic gold tin (AuSn) solder process, which is flux-free and requires heating up top 280° C.

At 504, the plurality of CoSs may be bonded to a base substrate. Alternatively, act 502 could be skipped for at least one or all of the laser diodes, and act 504 could comprise bonding the at least one or all of the laser diodes directly to the base substrate. The base substrate may be formed from a material that is RF compatible and is suitable for hermetic sealing. For example, the base substrate may be formed from low temperature co-fired ceramic (LTCC), aluminum nitride (AlN), alumina, aluminum nitride (AlN), Kovar®, etc. Since several CoSs are bonded next to each other on the same base substrate, it may be advantageous to either "step-solder" them sequentially or to use a bonding technique that does not rely on re-melting of solder materials. For step-soldering, each subsequent soldering step utilizes a process temperature that is less than the process temperatures of previous solder steps to prevent re-melting of solder materials. It may also be important that the laser diode-to-submount bonding does not re-melt during bonding of the CoSs to the base substrate. Bonding technologies other than step-soldering that may be used include parallel soldering of all CoS in reflow oven process, thermosonic or thermocompression bonding, transient liquid phase (TLP) bonding, laser soldering, etc. Some of these example bonding technologies are discussed below.

For parallel soldering of all CoSs in a reflow oven process, appropriate tooling is required to assure proper bonding and alignment during the process. An advantage of this process is the parallel and hence time efficient bonding of all CoSs at once and even many assemblies in parallel. A possible disadvantage of this process is the potential loss of the alignment of components during the reflow process. Generally, a soldering cycle ideally needs a few minutes of dwell time. Preheating may be used to reduce the soldering time, which requires a few minutes for such a process depending on the thermal mass of the components being bonded. Thus, a batch process may be used with regular soldering to reduce the assembly costs with high throughput at the expense of alignment tolerance.

For thermosonic or thermocompression bonding, thick gold metallization may be used but no extra solder layer is required. The temperatures for thermocompression bonding might be as high as 300 to 350° C. to have a good bond with a good thermal conductivity. Thermosonic bonding may be used to reduce the pressure and temperature needed for bonding, which may be required for at least some components that might not tolerate the temperatures required for thermocompression bonding.

Transient liquid phase (TLP) bonding may also be used. There are many different reaction couples that may be used, including gold-tin, copper-tin, etc. With this method, a liquid phase is formed during the bonding which will solidify at the same temperature. The re-melting temperatures of the bond are much higher than the soldering temperatures.

In at least some implementations, laser soldering may be used to bond some or all of the components of the optical engine. Generally, the thermal characteristic of the parts to be bonded may be important when implementing a laser soldering process.

Subsequent reflows of solder are not recommended due to liquid phase reaction or dissolution mechanisms which may reduce the reliability of the joint. This could result in voiding at the interface or a reduction in strength of the joint itself. In order to mitigate potential reflow dissolution problems, other options can be taken into consideration, which do not rely on extreme heating of the device and can be favorable in terms of production cost. For example, bonding of the base substrate with adhesives (electrically conductive for common mass, or non-conductive for floating) may be acceptable with respect to heat transfer and out-gassing as discussed regarding partial hermetic sealing above.

Further, in at least some implementations, a reactive multi-layer foil material (e.g., NanoFoil®) or a similar material may be used as a solder pre-form, which enables localized heat transfer. A reactive multi-layer foil material is a metallic material based on a plurality (e.g., hundreds, thousands) of reactive foils (aluminum and nickel) that enables die-attach soldering (e.g., silicon chip onto stainless steel part). In such implementations, dedicated heat transfer support metallizations may be deposited onto the two components being joined together. This method may be more advantageous for CoS-to-base substrate mounting compared to chip-to-submount bonding. Generally, bonding using reactive multi-layer foil materials enables furnace-free, low-temperature soldering of transparent or non-transparent components, without reaching the bonding temperatures for solder reflow processes. Reactive multi-layer foil materials can be patterned with a ps-laser into exact preform shapes.

At 506, the optical director element, if included, may be bonded to the base substrate proximate the laser CoSs. The optical director element may be bonded to the base substrate using any suitable bonding process, including the bonding processes discussed above with reference to act 504.

Figure 16A:
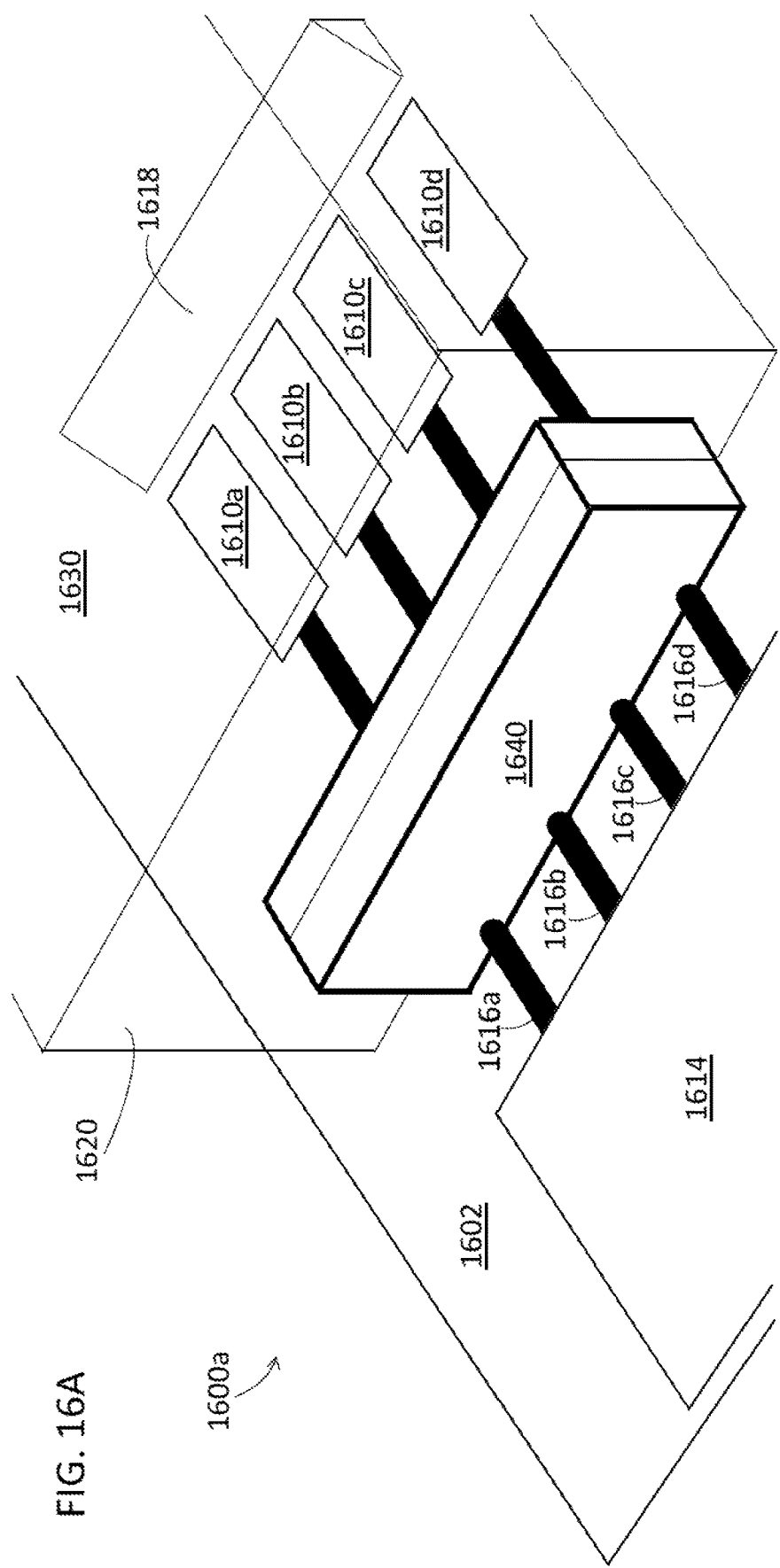
FIGS. 16A and 16B are isometric views of optical engines including an insulating cover which prevents undesired electrical signal transmission from electrical connections, and showing implementations of optical engines having differing positions for a laser diode driver circuit in accordance with the present systems, devices, and methods.
Figure 16B:
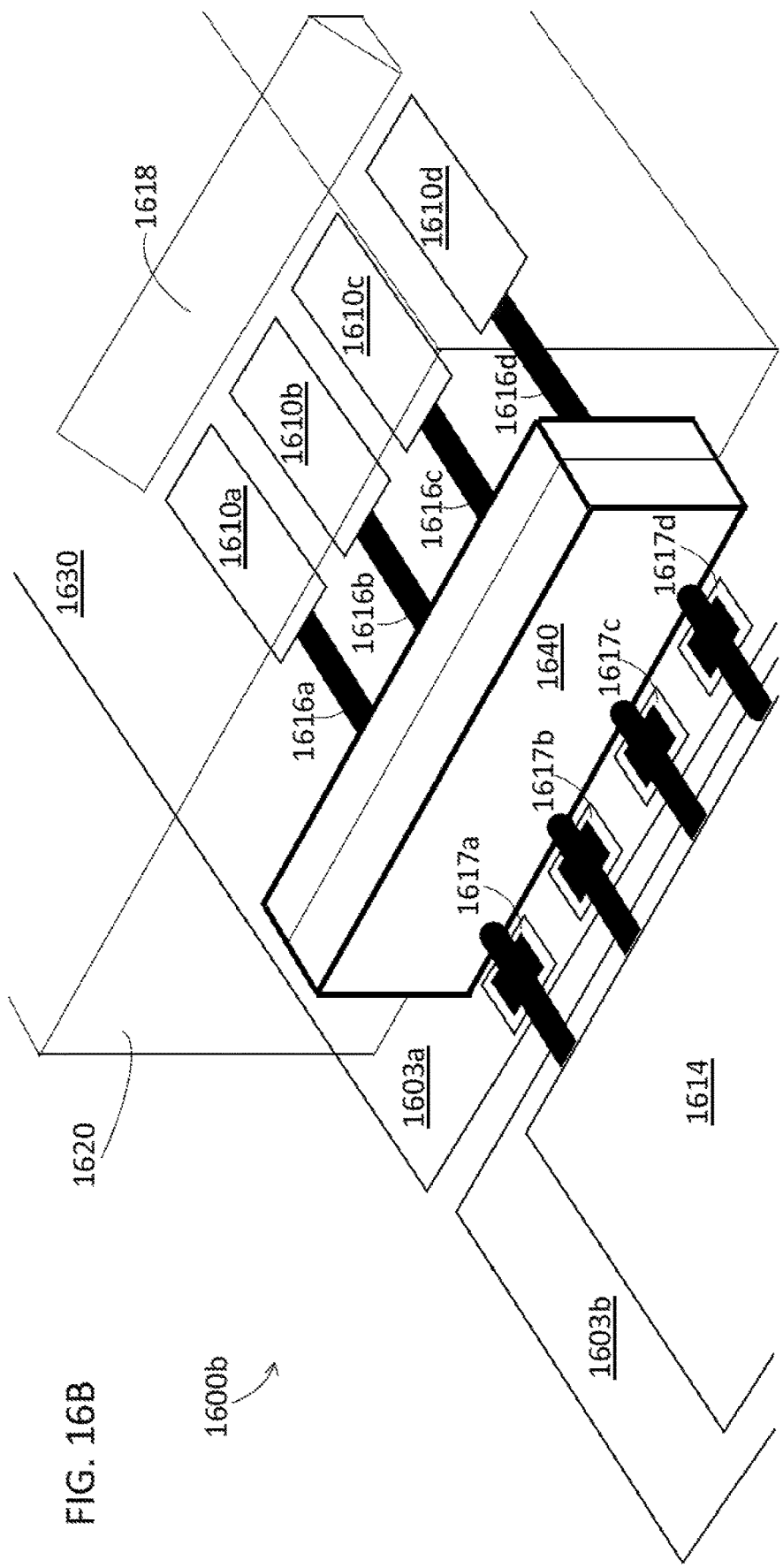

At 508, the laser diode driver circuit may optionally be bonded to the base substrate. As noted above, the laser diode driver circuit may be bonded to the base substrate such that the distance between the laser diode driver circuit and the laser CoSs is minimized. This may also comprise positioning a plurality of electrical connections which operatively couple the laser diode driver circuit to the plurality of laser diodes as shown in FIGS. 16A and 16B. In alternative implementations, the laser diode driver circuit may be bonded to a separate base substrate from the other components mentioned above as shown in FIG. 16B. The process used to bond the laser diode driver circuit to the base substrate may be any suitable bonding process, such as bonding processes commonly used to bond surface mount devices (SMD) to circuit boards. In other alternative implementations, the laser diode driver circuit may be mounted directly to a frame of a WHUD. For implementations where the laser diode drive circuit is not bonded to the same base substrate as the other components mentioned above, a plurality of electrical contacts and electrical connections could be bonded to the base substrate, each electrical connection operatively connecting a respective electrical contact to a respective laser diode. Subsequently, the at least one laser driver circuit could be operatively coupled to the electrical contacts, which will then electrically couple the laser diode drive circuit to the electrical connections and consequently to the laser diodes. Exemplary arrangements of electrical connections and electrical contacts is discussed later with reference to FIG. 16B.

At 510, the cap may optionally be bonded to the base substrate to form a hermetic or partially hermetic seal as discussed above between the interior volume of the encapsulated package and an exterior environment. As noted above, it may be desirable to maintain a specific atmosphere for the laser diode chips for reliability reasons. In at least some implementations, adhesive sealing may be undesirable because of the high permeability of gases. This is especially the case for blue laser diodes, which emit blue laser light that may bake contamination on facets and windows, thereby reducing transparency of the optical window. However, as detailed above regarding FIGS. 1A and 1B, partial hermeticity, a particulate dust cover, or even no protective cover may be acceptable for certain applications. In implementations where the cap would be bonded over electrical connections which connect the at least one laser diode driver circuit to the plurality of laser diodes, such as when the at least one laser diode driver circuit is bonded to the same side of a base substrate as the laser diodes, or when the at least one laser diode driver circuit is coupled to electrical contacts bonded to the same side of the base substrate as the laser diodes, an electrically insulating cover can first be bonded to the base substrate over the electrical connections. Subsequently, the cap can be bonded at least partially to the electrically insulating cover, and potentially to a portion of the base substrate if the insulating cover does not fully encircle the intended interior volume. In this way, at least a portion of the cap will be bonded to the base substrate indirectly by being bonded to the electrically insulating cover. In some implementations, the entire cap could be bonded to the base substrate indirectly by being bonded to an electrically insulating cover which encircles the intended interior volume. Exemplary electrically insulating covers are discussed later with reference to FIGS. 16A and 16B.

During the sealing process, the atmosphere may be defined by flooding the package accordingly. For example, the interior volume of the encapsulated package may be flooded with an oxygen enriched atmosphere that burns off contaminants which tend to form on interfaces where the laser beam is present. The sealing itself may also be performed so as to prevent the exchange between the package atmosphere and the environment. Due to limitations concerning the allowed sealing temperature, e.g., the components inside the package should not be influenced, in at least some implementations seam welding or laser assisted soldering/diffusion bonding may be used. In at least some implementations, localized sealing using a combination of seam welding and laser soldering may be used.

At 512, the collimation lenses may be actively aligned. For example, once the laser diode driver circuit has been bonded and the cap has been sealed, the laser diodes can be turned on and the collimations lenses for each laser diode can be actively aligned. In at least some implementations, each of the collimation lenses may be positioned to optimize spot as well as pointing for each of the respective laser diodes.

At 514, the beam combiner may be positioned to receive and combine individual laser beams into an aggregate beam. As discussed above, the beam combiner may include one or more diffractive optical elements and/or one or more refractive/reflective optical elements that function to combine the different color beams into an aggregate beam. The aggregate beam may be provided to other components or modules, such as a scan mirror of a laser projector, etc.

Figure 6:
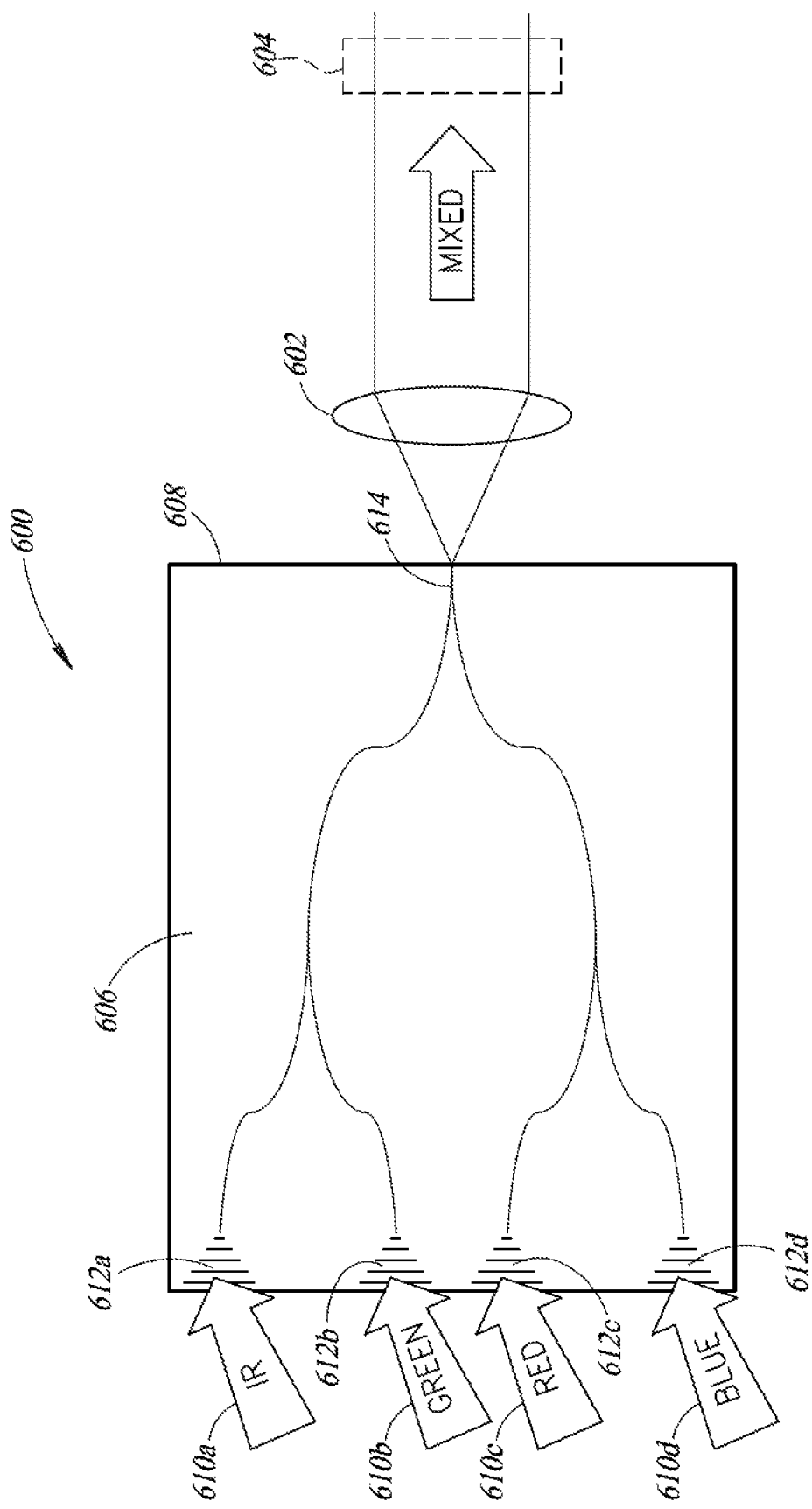
FIG. 6 is a top plan view of a photonic integrated circuit for wavelength multiplexing that includes a plurality of grating couplers on a surface thereof, the photonic integrated circuit followed by a common collimation lens and an optional diffractive optical element, in accordance with the present systems, devices, and methods.
Figure 12A:
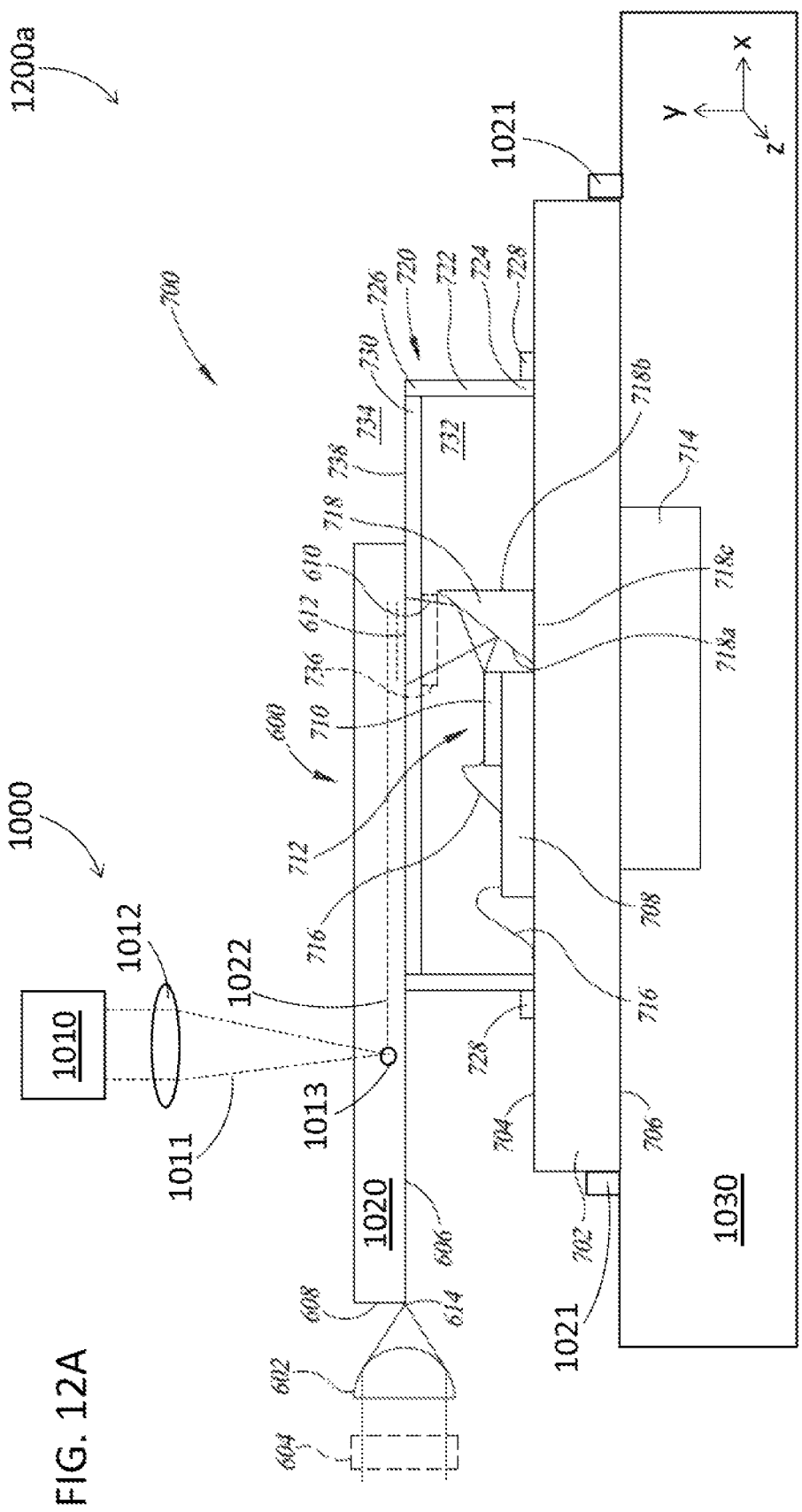
FIGS. 12A, 12B, and 13 are schematic diagrams of laser writing systems which can be used to write photonic integrated circuits in writeable glass already bonded to a substrate or circuit, according to at least two illustrated implementations.
Figure 12B:
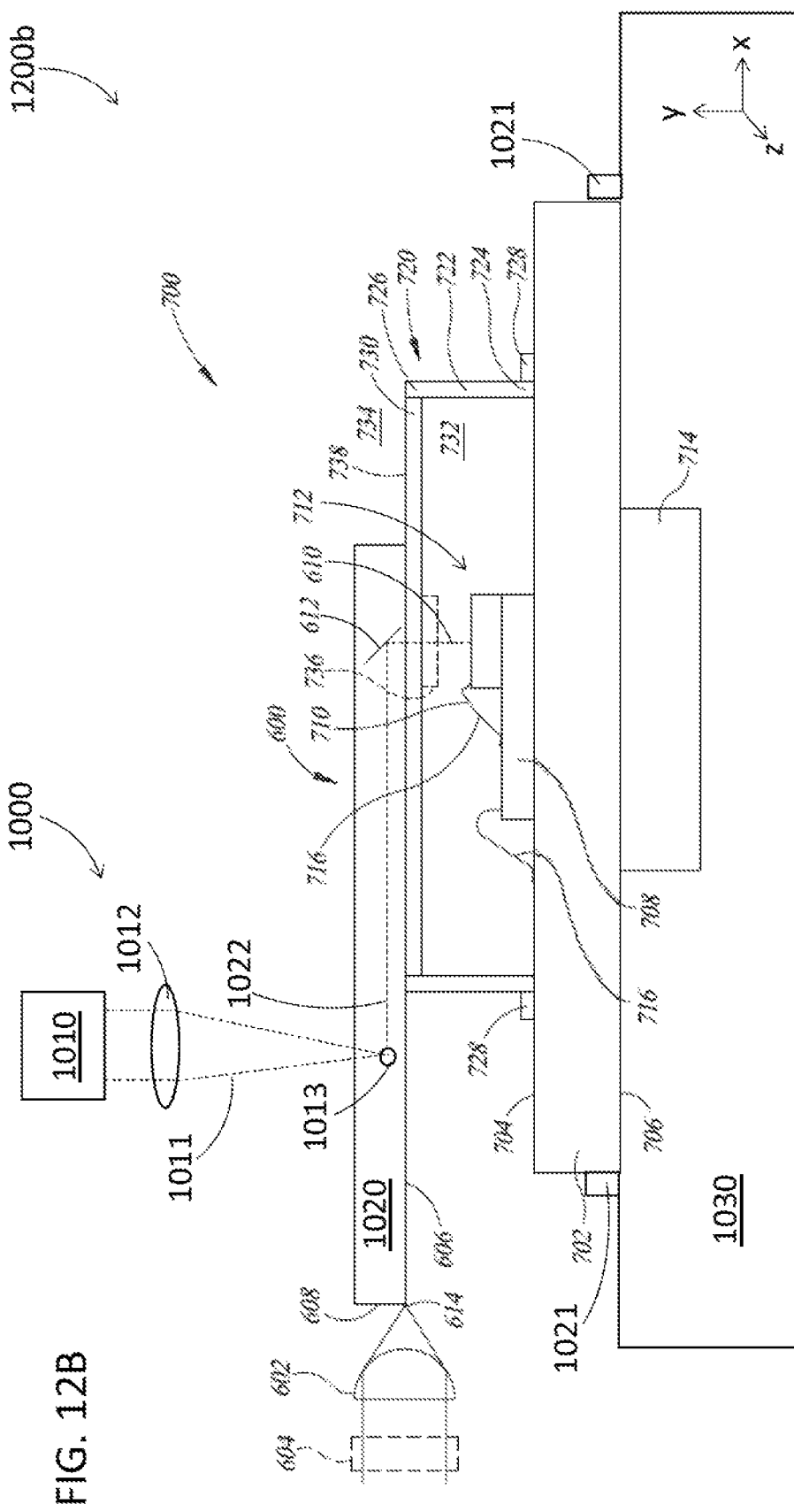

FIG. 6 is a top plan view of a photonic integrated circuit 600 for wavelength multiplexing followed by a common collimation lens 602 and an optional diffractive optical element 604. The photonic integrated circuit 600 may be a component in an optical engine, such as an optical engine 700 of FIG. 7, an optical engine as shown in FIG. 12A, or an optical engine as shown in FIG. 12B discussed further below. The photonic integrated circuit 600 includes a plurality of input facets 612a-612d and at least one output facet 608 (e.g., output optical coupler or grating output coupler). In FIG. 6, input facets 612a-612d are shown as grating couplers (also referred to as "diffractive grating couplers" or "grating input couplers") on a top surface 606 thereof, but other input facets are possible such as illustrated in FIG. 12B discussed below. In operation, the photonic integrated circuit 600 receives a plurality of beams of light 610a-610d that are coupled to the photonic integrated circuit via the input facets 612a-612d, respectively, and wavelength multiplexes the plurality of beams to provide a coaxially superimposed aggregate beam of light 614 that exits the photonic integrated circuit at the output facet 608, such as an output optical coupler or grating output coupler. Compared to edge coupling, in at least some applications using grating input couplers for input facets 612a-612d may allow for relaxed tolerances for beam alignment. Generally, the photonic integrated circuit 600 may include one or more diffractive optical elements (DOE) and/or refractive/reflective optical elements that combine the different color beams 610a-610d in order to achieve coaxial superposition.

Following out-coupling of the aggregate beam 614 from the output facet 608 of the photonic integrated circuit 600, the aggregated beam is collimated via the common collimation lens 602. In at least some implementations, the collimation lens 602 may be either an achromatic lens or an apochromatic lens (or lens assemblies), depending on the particular optical design and tolerances of the system. In at least some implementations, one or more diffractive optical elements 604 may be used to provide wavelength dependent focus correction.

Figure 7:
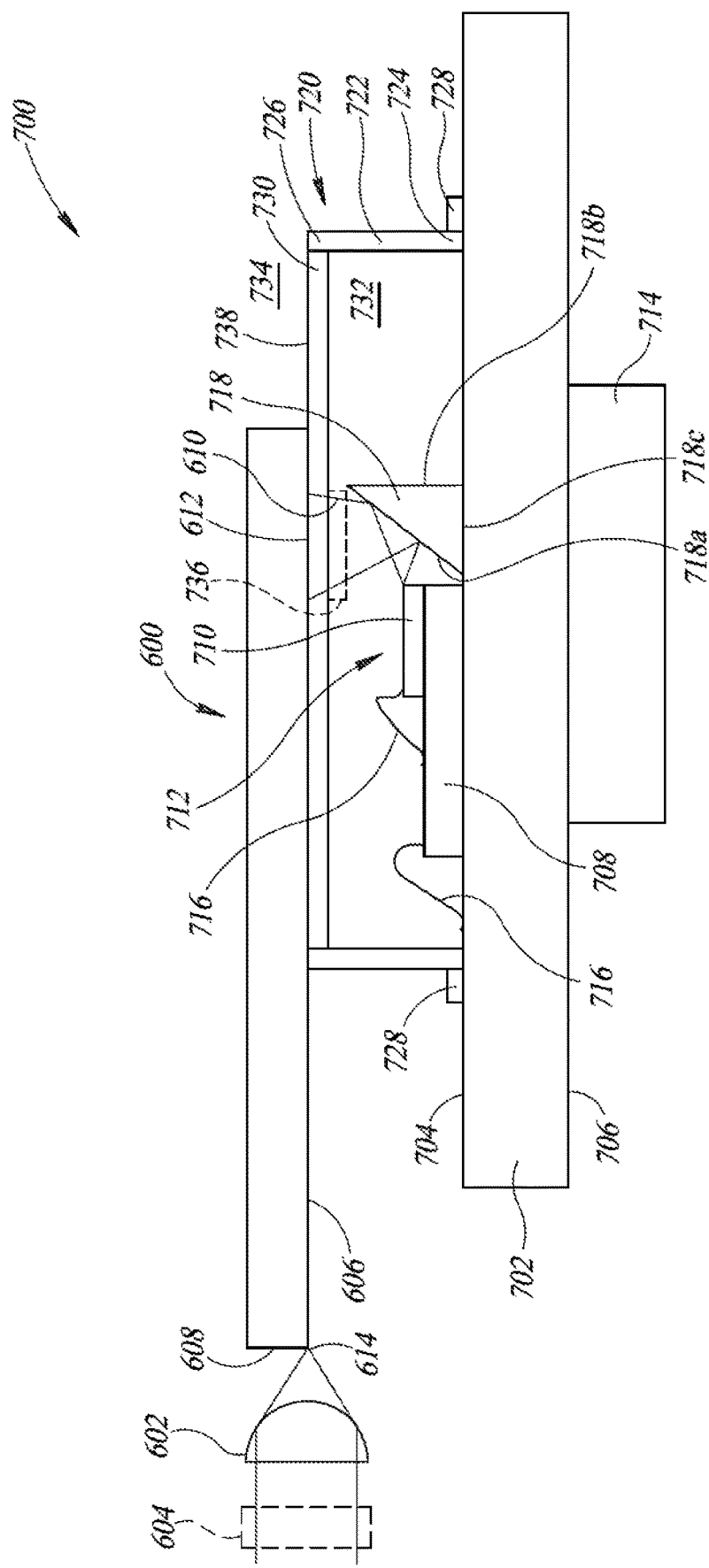
FIG. 7 is a left side sectional elevational view of an optical engine that includes a plurality of laser diodes inside a hermetically or partially hermetically sealed package coupled to the photonic integrated circuit of FIG. 6 for wavelength multiplexing, and a common collimation lens and an optional diffractive optical element, in accordance with the present systems, devices, and methods.

FIG. 7 is a left side sectional elevational view of the optical engine 700. The optical engine 700 includes several components that may be similar or identical to the components of the optical engine 100 of FIGS. 1A and 1B. Thus, some or all of the discussion above may be applicable to the optical engine 700.

The optical engine 700 includes a base substrate 702 having a top surface 704 and a bottom surface 706 opposite the top surface. The base substrate 702 may be formed from a material that is radio frequency (RF) compatible and is suitable for hermetic sealing. For example, the base substrate 702 may be formed from low temperature co-fired ceramic (LTCC), aluminum nitride (AlN), alumina, aluminum nitride (AlN), Kovar®, etc.

The optical engine 700 also includes a plurality of chip submounts 708 (only one chip submount visible in the sectional view of FIG. 7) that are bonded (e.g., attached) to the top surface 704 of the base substrate 702. The plurality of chip submounts 708 are aligned in a row across a width of the optical engine 700 between the left and right sides thereof. Each of the plurality of chip submounts 708 includes a laser diode 710, also referred to as a laser chip or laser die, bonded thereto. In particular, an infrared chip submount carries an infrared laser diode, a red chip submount carries a red laser diode, a green chip submount carries a green laser diode, and a blue chip submount carries a blue laser diode. In operation, the infrared laser diode provides infrared laser light, the red laser diode provides red laser light, the green laser diode provides green laser light, and the blue laser diode provides blue laser light. Each of the laser diodes 710 may comprise one of an edge emitter laser or a vertical-cavity surface-emitting laser (VCSEL), for example. Each of the four laser diode/chip submount pairs may be referred to collectively as a "laser chip on submount," or a laser CoS 712. Thus, the optical engine 700 includes an infrared laser CoS, a red laser CoS, a green laser CoS, and a blue laser CoS. In at least some implementations, one or more of the laser diodes 710 may be bonded directly to the base substrate 702 without use of a submount 708.

The optical engine 700 also includes a laser diode driver circuit 714 bonded to the bottom surface 706 of the base substrate 702. The laser diode driver circuit 714 is operatively coupled to the plurality of laser diodes 710 via suitable electrical connections 716 to selectively drive current to the plurality of laser diodes. Generally, the laser diode driver circuit 714 may be positioned relative to the CoSs 712 to minimize the distance between the laser diode driver circuit 714 and the CoSs 712. Although not shown in FIG. 7, the laser diode driver circuit 714 may be operatively coupleable to a controller (e.g., microcontroller, microprocessor, ASIC) that controls the operation of the laser diode driver circuit 714 to selectively modulate laser light emitted by the laser diodes 710. In at least some implementations, the laser diode driver circuit 714 may be bonded to another portion of the base substrate 702, such as the top surface 704 of the base substrate, similar to the implementations shown in FIG. 16A. In at least some implementations, the laser diode driver circuitry 714 may be remotely located and operatively coupled to the laser diodes 710. In order to not require the use of impedance matched transmission lines, the size scale may be small compared to a wavelength (e.g., lumped element regime), where the electrical characteristics are described by (lumped) elements like resistance, inductance, and capacitance.

Proximate the laser diodes 710 there is positioned an optical director element 718. Like the chip submounts 708, the optical director element 718 is bonded to the top surface 704 of the base substrate 702. In the illustrated example, the optical director element 718 has a triangular prism shape that includes a plurality of planar faces. In particular the optical director element 718 includes an angled front face 718a that extends along the width of the optical engine 700, a rear face 718b, a bottom face 718c that is bonded to the top surface 704 of the base substrate 702, a left face 718d, and a right face 718e opposite the left face. The optical director element 718 may comprise a mirror or a prism, for example. In at least some implementations, the angled front face 718a may be curved to provide fast axis collimation of the laser light from the laser diodes 710.

The optical engine 700 also includes a cap 720 that includes a vertical sidewall 722 having a lower first end 724 and an upper second end 726 opposite the first end. A flange 728 may be disposed around a perimeter of the sidewall 722 adjacent the lower first end 724. Proximate the upper second end 726 there of the sidewall 722 there is a horizontal (as shown) optical window 730 that forms the "top" of the cap 120. The sidewall 722 and the optical window 730, along with a portion of the top surface 704 of the base substrate 702, together define an interior volume 732 sized and dimensioned to receive the plurality of chip submounts 708, the plurality of laser diodes 710, and the optical director element 717. The lower first end 724 and the flange 728 of the cap 720 are bonded to the base substrate 702 to provide a hermetic or partially hermetic seal between the interior volume 732 of the cap and a volume 734 exterior to the cap.

The optical director element 718 is positioned and oriented to direct (e.g., reflect) laser light received from each of the plurality of laser diodes 710 upward (as shown) toward the optical window 730 of the cap 720, wherein the laser light exits the interior volume 732.

The cap 720 may have a round shape, rectangular shape, or other shape. Thus, the vertical sidewall 722 may comprise a continuously curved sidewall, a plurality (e.g., four) of adjacent planar portions, etc. The optical window 730 may comprise an entire top of the cap 720, or may comprise only a portion thereof. In at least some implementations, the optical window 730 may be located on the sidewall 722 rather than positioned as a top of the cap 720, and the laser diodes 710 and/or the optical director element 718 (if present) may be positioned and oriented to direct the laser light from the laser diodes toward the optical window on the sidewall 722. In at least some implementations, the cap 720 may include a plurality of optical windows instead of a single optical window 730.

In at least some implementations, the optical engine 700 optionally includes four collimation lenses 736 (only one visible in the sectional view of FIG. 7), one for each of the four laser diodes 710. In other implementations, the collimation lenses 736 are omitted. In the illustrated implementation, the collimation lenses 736 are bonded to a bottom surface of the optical window 730 in a row, although the collimation lenses may be positioned differently in other implementations. For example, in at least some implementations, the collimation lenses 736 may be positioned outside of the package (e.g., outside of the interior volume 732) rather than inside the package as shown in FIG. 7. Each of the plurality of collimation lenses 736 may be positioned and oriented to receive light from a corresponding one of the laser diodes 710, and to direct collimated light upward (as shown) through the optical window 730 toward the photonic integrated circuit 600, which is shown "inverted" in FIG. 7 (relative to FIG. 6) so that the input facets 612a-612d (collectively, 612) on the surface 606 of the photonic integrated circuit face a top surface 738 of the optical window 730 of the cap 720.

The optical director element 718 and the collimation lenses 736 (when present) direct the beams of light 610a-610d (see FIG. 6) into the photonic integrated circuit 600 via the input facets 612a-612d. The photonic integrated circuit 600 may be bonded to the top surface of the optical window 730, as shown in FIG. 7. In at least some implementations, the photonic integrated circuit 600 may be bonded to the top surface 704 of the base substrate 702 instead. As discussed above, in operation, the photonic integrated circuit 600 receives a plurality of beams of light 610a-610d via the input facets 612a-612d (e.g. grating couplers), respectively, and wavelength multiplexes the plurality of beams to provide a coaxially superimposed aggregate beam of light 614 that exits the photonic integrated circuit at the output optical coupler 608.

In at least some implementations, the laser diodes 710 may be directly coupled to the photonic integrated circuit 600. In such implementations, the laser diodes 710 may be positioned immediately adjacent to a waveguide structure (e.g., photonic integrated circuit or other waveguide structure) such that sufficient coupling (e.g., acceptable insertion loss) is achieved. For example, in at least some implementations, the photonic integrated circuit 600 may function as the optical window of the package itself.

Following out-coupling of the aggregate beam 614 from the output facet 608 of the photonic integrated circuit 600, the aggregated beam may be collimated via the common collimation lens 602. In at least some implementations, the common collimation lens 602 may be bonded to the top surface 704 proximate the photonic integrated circuit 600. In at least some implementations, the collimation lens 602 may be either an achromatic lens or an apochromatic lens, depending on the particular optical design and tolerances of the system. In at least some implementations, the optical engine 700 may include one or more diffractive optical elements 604 to provide wavelength dependent focus correction.

In at least some implementations, at least some of the components may be positioned differently. As noted above, the laser diode driver circuit 714 may be mounted on the top surface 704 or the bottom surface 706 of the base substrate 702, or may be positioned remotely therefrom, depending on the RF design and other constraints (e.g., package size), similarly to as discussed with reference to FIGS. 16A and 16B below. In at least some implementations, the optical engine 700 may not include an optical director element (e.g., optical director element 718 of FIG. 7), and the laser light may be directed from the laser diodes 710 toward the optical window 730 directly, with our without collimation lenses 736. Additionally, in at least some implementations, one or more of the laser diodes 710 may be mounted directly on the base substrate 702 without use of a submount. Further, in at least some implementations, in the case of an inorganic or acceptably organic waveguide (e.g., photonic integrated circuit), coupling may be accomplished inside the encapsulated package. Such feature eliminates the requirement for a separate window, as the waveguide 600 services as the window (e.g., optical window 730). In such implementations, the plurality of grating couplers of the photonic integrated circuit may be positioned inside the interior volume of the encapsulated package and the at least one optical output coupler of the photonic integrated circuit may be positioned outside of the interior volume, for example.

For the sake of a controlled atmosphere inside the interior volume 732, it may be desirable to have no organic compounds inside the interior volume 732. In at least some implementations, the components of the optical engine 700 may be bonded together using no adhesives. In other implementations, a low amount of adhesives may be used to bond at least one of the components, which may reduce cost while providing a relatively low risk of organic contamination for a determined lifetime (e.g., 2 or more years) of the optical engine 700. Similarly to as detailed above regarding FIGS. 1A and 1B, partial hermeticity, a particulate dust cover, or even no protective cover may be acceptable for certain applications. Various bonding processes (e.g., attaching processes) for the optical engine 700 are discussed above with reference to FIG. 5.

In at least some implementations, the collimation lenses 736 (when present) and the collimation lens 602 may be actively aligned. In at least some implementations, the CoSs 712, the cap 720 (including optical window 730), and/or the photonic integrated circuit 600 may be passively aligned. Further, depending on the particular design, it may be advantageous to utilize a smaller base substrate 702 and use an additional carrier substrate instead.

Figure 8:
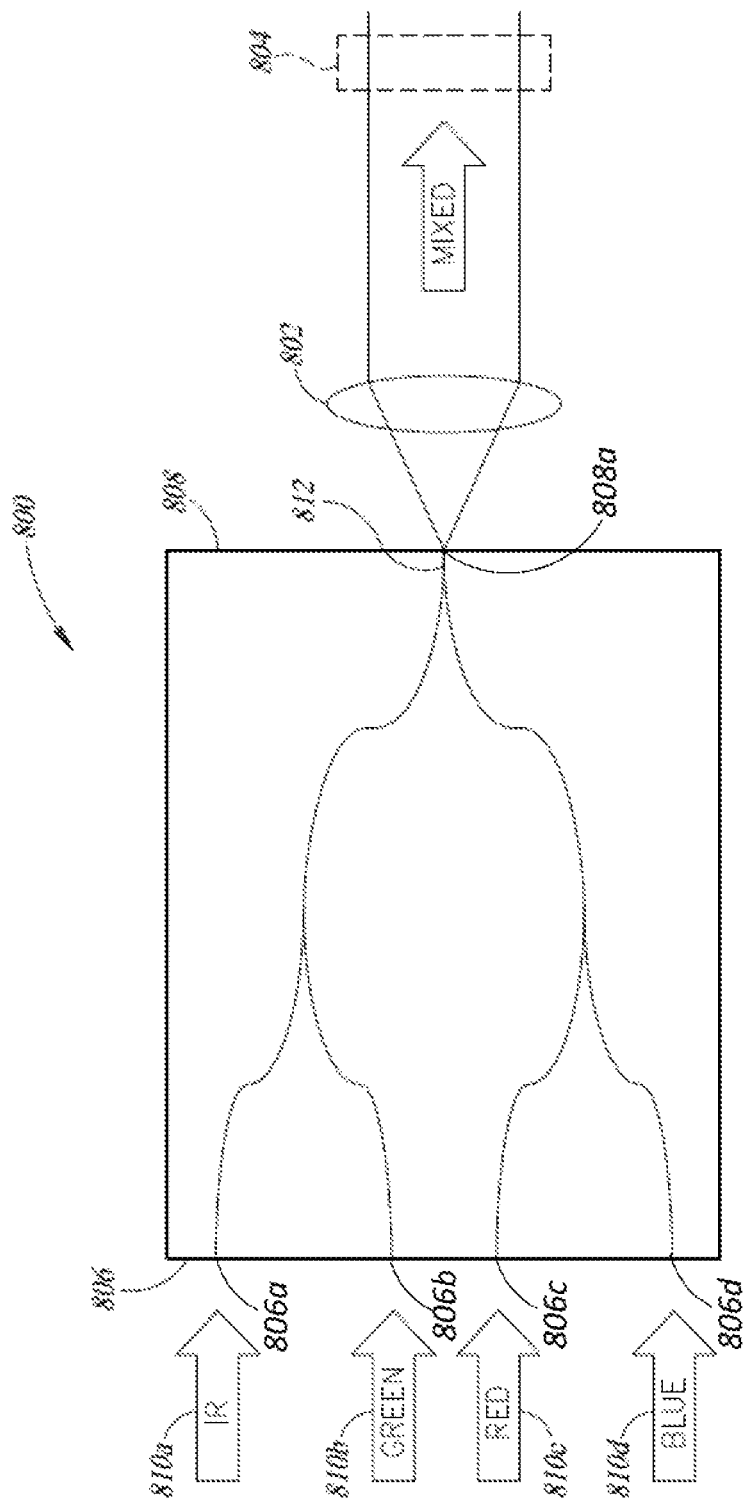
FIG. 8 is a top plan view of a photonic integrated circuit for wavelength multiplexing followed by a common collimation lens and an optional diffractive optical element, in accordance with the present systems, devices, and methods.

FIG. 8 is a top plan view of a photonic integrated circuit 800 for wavelength multiplexing followed by a common collimation lens 802 and an optional diffractive optical element 804. The photonic integrated circuit 800 may be a component in an optical engine, such as an optical engine 900 of FIG. 9 or an optical engine of FIG. 13 discussed further below. The photonic integrated circuit 800 includes at least one input optical edge 806 having at least one input facet and at least one output optical edge 808 having at least one output facet. In the example of FIG. 8, input edge 806 includes four input facets 806a, 806b, 806c, and 806d, whereas output edge 808 includes one output facet 808a. However, it is within the scope of the present systems, devices, and methods to include any appropriate number of input facets and output facets. Similar to the photonic integrated circuit 600 of FIG. 6, in operation the photonic integrated circuit 800 receives a plurality of beams of light 810a-810d that are edge coupled to the photonic integrated circuit at the input optical edge 806, and wavelength multiplexes the plurality of beams to provide a coaxially superimposed aggregate beam of light 812 that exits the photonic integrated circuit at the output optical edge 808 through output facet 808a. Generally, the photonic integrated circuit 800 may include one or more diffractive optical elements (DOE) and/or refractive/reflective optical elements that combine the different color beams 810a-810d in order to achieve coaxial superposition.

Following out-coupling of the aggregate beam 812 from the output optical edge 808 of the photonic integrated circuit 800, the aggregated beam is collimated via the common collimation lens 802. In at least some implementations, the collimation lens 802 may be either an achromatic lens or an apochromatic lens (or lens assemblies), depending on the particular optical design and tolerances of the system. In at least some implementations, one or more diffractive optical elements 804 may be used to provide wavelength dependent focus correction.

Figure 9:
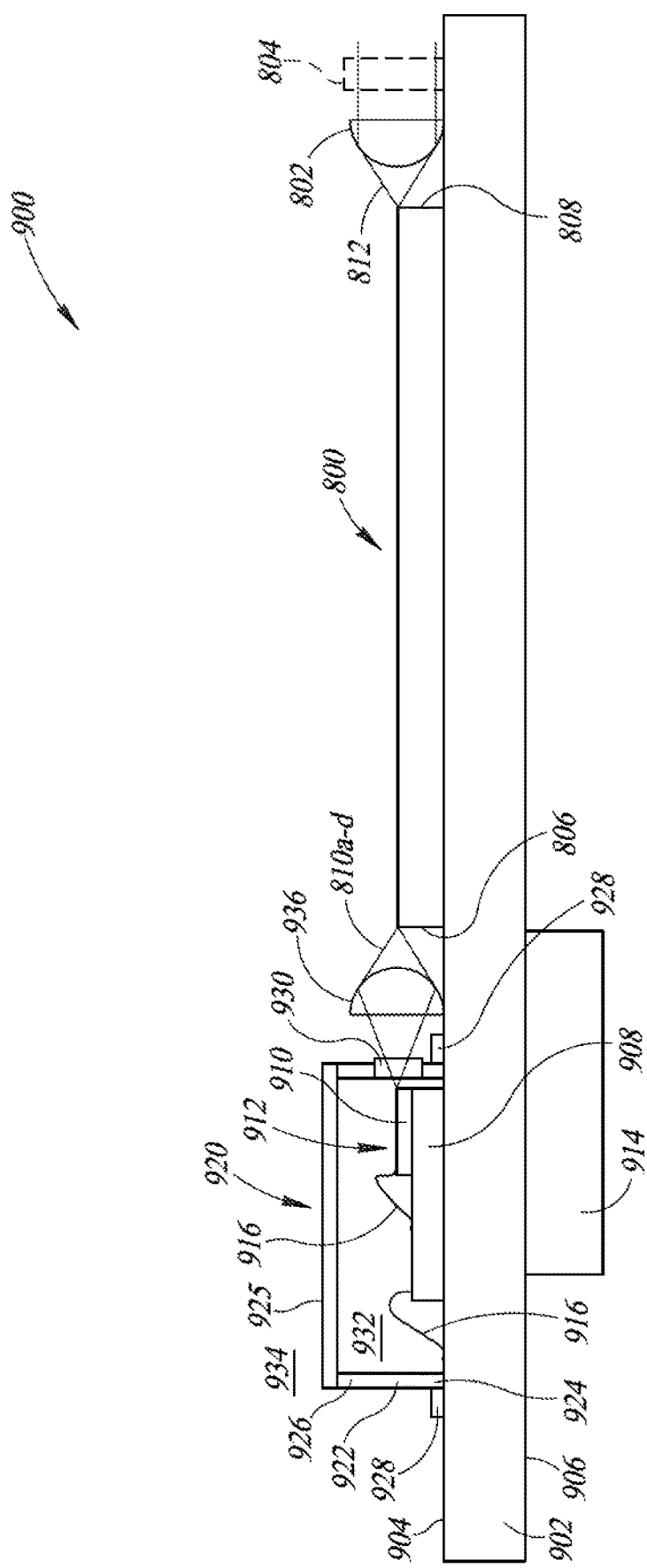
FIG. 9 is a left side sectional elevational view of an optical engine that includes a plurality of laser diodes inside a hermetically or partially hermetically sealed package coupled to a photonic integrated circuit of FIG. 8 for wavelength multiplexing, and a common collimation lens and an optional diffractive optical element, in accordance with the present systems, devices, and methods.

FIG. 9 is a left side sectional elevational view of the optical engine 900. The optical engine 900 includes several components that may be similar or identical to the components of the optical engine 100 of FIGS. 1A and 1B. Thus, some or all of the discussion above may be applicable to the optical engine 900.

The optical engine 900 includes a base substrate 902 having a top surface 904 and a bottom surface 906 opposite the top surface. The base substrate 902 may be formed from a material that is radio frequency (RF) compatible and is suitable for hermetic sealing. For example, the base substrate 902 may be formed from low temperature co-fired ceramic (LTCC), alumina, aluminum nitride (AlN), Kovar®, etc.

The optical engine 900 also includes a plurality of chip submounts 908 (only one chip submount visible in the sectional view of FIG. 9) that are bonded (e.g., attached) to the top surface 904 of the base substrate 902. The plurality of chip submounts 908 are aligned in a row across a width of the optical engine 900 between the left and right sides thereof. Each of the plurality of chip submounts 908 includes a laser diode 910, also referred to as a laser chip or laser die, bonded thereto. In particular, an infrared chip submount carries an infrared laser diode, a red chip submount carries a red laser diode, a green chip submount carries a green laser diode, and a blue chip submount carries a blue laser diode. In operation, the infrared laser diode provides infrared laser light, the red laser diode provides red laser light, the green laser diode provides green laser light, and the blue laser diode provides blue laser light. Each of the laser diodes 910 may comprise one of an edge emitter laser or a vertical-cavity surface-emitting laser (VCSEL), for example. Each of the four laser diode/chip submount pairs may be referred to collectively as a "laser chip on submount," or a laser CoS 912. Thus, the optical engine 900 includes an infrared laser CoS, a red laser CoS, a green laser CoS, and a blue laser CoS. In at least some implementations, one or more of the laser diodes 910 may be bonded directly to the base substrate 902 without use of a submount 908.

The optical engine 900 also includes a laser diode driver circuit 914 bonded to the bottom surface 906 of the base substrate 902. The laser diode driver circuit 914 is operatively coupled to the plurality of laser diodes 910 via suitable electrical connections 916 to selectively drive current to the plurality of laser diodes. Generally, the laser diode driver circuit 914 may be positioned relative to the CoSs 912 to minimize the distance between the laser diode driver circuit 914 and the CoSs 912. Although not shown in FIG. 9, the laser diode driver circuit 914 may be operatively coupleable to a controller (e.g., microcontroller, microprocessor, ASIC) that controls the operation of the laser diode driver circuit 914 to selectively modulate laser light emitted by the laser diodes 910. In at least some implementations, the laser diode driver circuit 914 may be bonded to another portion of the base substrate 902, such as the top surface 904 of the base substrate, similar to the implementation shown in FIG. 16A. In at least some implementations, the laser diode driver circuitry 914 may be remotely located and operatively coupled to the laser diodes 910, similar to the implementations shown in FIG. 16B. In order to not require the use of impedance matched transmission lines, the size scale may be small compared to a wavelength (e.g., lumped element regime), where the electrical characteristics are described by (lumped) elements like resistance, inductance, and capacitance.

The optical engine 900 also includes a cap 920 that includes a vertical sidewall 922 and a horizontal wall or top portion 925. The vertical sidewall 922 includes a lower first end 924 and an upper second end 926 opposite the first end. A flange 928 may be disposed around a perimeter of the sidewall 922 adjacent the lower first end 924. Within a portion of the vertical sidewall 922 there is an optical window 930 positioned proximate the laser diodes 910 to pass light therefrom out of the cap 920. In some implementations, optical window 930 can extend from base substrate 902 to top portion 925, such that one side of cap 920 is formed entirely by optical window 930. The sidewall 922 and the optical window 930 together define an interior volume 932 sized and dimensioned to receive the plurality of chip submounts 908 and the plurality of laser diodes 910. The lower first end 924 and the flange 928 of the cap 920 are bonded to the base substrate 902 to provide a hermetic or partially hermetic seal between the interior volume 932 of the cap and a volume 934 exterior to the cap.

The cap 920 may have a round shape, rectangular shape, or other shape. Thus, the vertical sidewall 922 may comprise a continuously curved sidewall, a plurality (e.g., four) of adjacent planar portions, etc. The optical window 930 may comprise an entire side of the cap 920, or may comprise only a portion thereof. In at least some implementations, the cap 920 may include a plurality of optical windows instead of a single optical window 930.

The optical engine 900 also includes four coupling lenses 936 (only one visible in the sectional view of FIG. 9), one for each of the four laser diodes 910 that are bonded to the top surface 904 of the base substrate 902 in a row. Each of the plurality of coupling lenses 936 is positioned and oriented to receive light from a corresponding one of the laser diodes 910 through the optical window 930.

The coupling lenses 936 couple the beams of light 810a-810d (see FIG. 8) into the photonic integrated circuit 800 via the input optical edge 806. The photonic integrated circuit 800 may be bonded to the top surface 904 of the base substrate 902 proximate the row of coupling lenses 936. As discussed above, in operation, the photonic integrated circuit 800 receives a plurality of beams of light 810a-810d at the input optical edge 806, and wavelength multiplexes the plurality of beams to provide a coaxially superimposed aggregate beam of light 812 that exits the photonic integrated circuit at the output optical edge 808.

In at least some implementations, the laser diodes 910 may be "butt" coupled to the photonic integrated circuit 800. In such implementations, the laser diodes 910 may be positioned immediately adjacent to a waveguide structure (e.g., photonic integrated circuit or other waveguide structure) such that sufficient coupling (e.g., acceptable insertion loss) is achieved without the use of a coupling lens.

Following out-coupling of the aggregate beam 812 from the output optical edge 808 of the photonic integrated circuit 800, the aggregated beam may be collimated via the common collimation lens 802, which may be bonded to the top surface 904 proximate the photonic integrated circuit 800. In at least some implementations, the collimation lens 802 may be either an achromatic lens or an apochromatic lens, depending on the particular optical design and tolerances of the system. In at least some implementations, the optical engine 900 may include one or more diffractive optical elements 804 bonded to the top surface 904 of the base substrate 902 to provide wavelength dependent focus correction.

In at least some implementations, at least some of the components may be positioned differently. As noted above, the laser diode driver circuit 914 may be mounted on the top surface 904 or the bottom surface 906 of the base substrate 902, or may be positioned remotely therefrom, depending on the RF design and other constraints (e.g., package size). In at least some implementations, the optical engine 900 may include optical director element (e.g., optical director element 118 of FIG. 1), and the laser light may be directed from the laser diodes 910 toward the coupling lenses 936 via an intermediate optical director element. Additionally, in at least some implementations, one or more of the laser diodes 910 may be mounted directly on the base substrate 902 without use of a submount. Further, in at least some implementations, in the case of an inorganic or acceptably organic waveguide (e.g., photonic integrated circuit), coupling may be accomplished inside the encapsulated package. Such feature eliminates the requirement for a separate window, as the waveguide services as the window (e.g., optical window 930). In such implementations, the at least one optical input edge of the photonic integrated circuit may be positioned inside the interior volume of the encapsulated package and the at least one optical output edge of the photonic integrated circuit may be positioned outside of the interior volume, for example.

For the sake of a controlled atmosphere inside the interior volume 932, it may be desirable to have no organic compounds inside the interior volume 932. In at least some implementations, the components of the optical engine 900 may be bonded together using no adhesives. In other implementations, a low amount of adhesives may be used to bond at least one of the components, which may reduce cost while providing a relatively low risk of organic contamination for a determined lifetime (e.g., 2 or more years) of the optical engine 900. Similarly to as detailed above regarding FIGS. 1A and 1B, partial hermeticity, a particulate dust cover, or even no protective cover may be acceptable for certain applications. Various bonding processes (e.g., attaching processes) for the optical engine 900 are discussed above with reference to FIG. 5.

Due to the divergent beam from each of the laser diodes 910 and the lateral distances between the laser diodes, the coupling lenses 936, and the photonic integrated circuit 800, it may be advantageous to minimize a distance between the respective output facets of the laser diodes 910 and the optical window 930. For the same reason, it may be advantageous to minimize the thickness of the optical window 930 and the size of the flange 928 of the cap 920 so that the coupling lenses 936 can be positioned relatively close to the output facets of the laser diodes 910. In at least some implementations, output window 930 and coupling lenses 936 could be formed as a single element.

In at least some implementations, the coupling lenses 936 and the collimation lens 802 may be actively aligned. In at least some implementations, the CoSs 912, the cap 920 (including optical window 930), and/or the photonic integrated circuit 800 may be passively aligned. Further, depending on the particular design, it may be advantageous to utilize a smaller base substrate 902 and use an additional carrier substrate instead.

Figure 10:
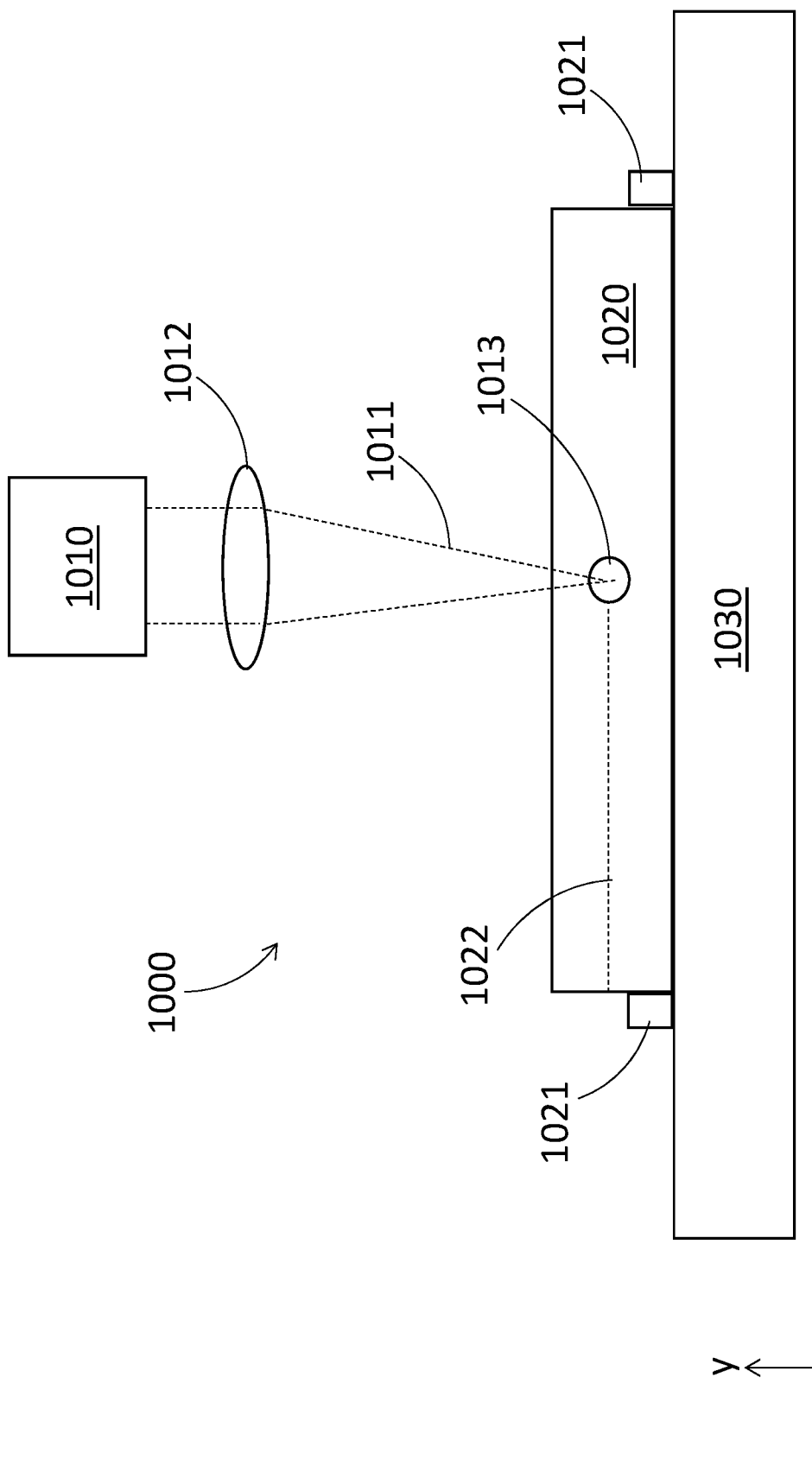
FIG. 10 is a schematic diagram of a laser writing system which can be used to write photonic integrated circuits in accordance with the present systems, devices, and methods.

FIG. 10 is a schematic diagram of a laser writing system 1000 in accordance with the present systems, designs and methods. Laser writing system 1000 comprises at least writing laser 1010, focusing optic 1012, writeable glass 1020 and translatable mount 1030. Although the term "glass" is used herein for convenience, any appropriate laser-writable material could be used in place of writeable glass 1020, such as organically modified ceramics (ORMO-CER), for example. Writing laser 1010 emits laser light 1011. Laser light 1011 comprises short (femtosecond and/or picosecond length) pulses of laser light; consequently, laser light 1011 has extremely high peak instantaneous power. Focusing optic 1012 focuses laser light 1011 to focal point 1013. Writeable glass 1020 may comprise a contiguous piece of glass or similar transparent material, which is typically transparent to the laser light 1011 emitted by the writing laser 1010; in other words the light emitted by the writing laser generally will not be absorbed by the glass via typical (linear) optical processes. At the focal point 1013, the intensity of laser light 1011 is very high due to the combination of spatial focusing (focusing the beam of writing laser light 1011 to a small point 1013) and temporal focusing (emitting the laser light 1011 as extremely short femptosecond or picosecond pulses). The high intensity of light at the focal point 1013 allows nonlinear optical processes such as multiphoton absorption, avalanche ionization, Coulomb collisions (causing lattice ionization and breakdown), and heat conduction to occur in the writeable glass 1020, absorbing the light and changing the refractive index of the glass. The change in refractive index may be a positive increase in refractive index.

Writeable glass 1020 can be physically coupled to translatable mount 1030, such as by using clamps 1021, adhesive, or any other appropriate coupling mechanism. Such coupling mechanism is preferably removable, such that writeable glass 1020 can be detached from translatable mount 1030 after laser writing is complete. Translation of translatable mount 1030 in the X, Y, and/or Z direction will result in corresponding translation of writeable glass 1020, moving the location of focal point 1013 within writeable glass 1020. Translating the writeable glass 1020 relative to focal point 1013 can create a region of changed refractive index in the writeable glass 1020. An increased refractive index in this region causes any light channeled therethrough to experience total internal reflection, thus forming waveguide 1022. In other words, waveguide 1022 can be formed as a continuous path of increased refractive index within writeable glass 1020 created by laser light 1011 at focal point 1013.

The technique of FIG. 10 can be used to laser write at least one waveguide into writeable glass 1020. For example, a photonic integrated circuit could be written, such as photonic integrated circuit 600 described with regards to FIG. 6 or photonic integrated circuit 800 described with regards to FIG. 8. Inputs facets 612a, 612b, 612c, and 612d (such as grating couplers), or input facets 806a, 806b, 806c, and 806d could also be written using this technique.

Writing at least one waveguide may include writing an individual waveguide for each wavelength of light impinging on the writeable glass 1020, where each waveguide comprises a respective input facet (such as an input grating coupler) and a respective output facet. Each output facet may be positioned to provide light to other components or modules, such as a scan mirror of a laser projector, etc. In one implementation, four waveguides could be written into writeable glass 1020, one waveguide for each beam of light 610a, 610b, 610c, and 610d. Four grating couplers could also be written, one for each waveguide. In another implementation, four waveguides could be written into writeable glass 1020, one waveguide for each beam of light 810a, 810b, 810c, and 810d.

Writing at least one waveguide may include writing a waveguide combiner, wherein the waveguide combiner combines individual laser beams into a coaxially superimposed aggregate beam. Writing a waveguide combiner may include writing at least one: directional coupler (DC), Y-branch, whispering gallery mode coupler, or multi-mode interference coupler. The aggregate beam may be provided to other components or modules, such as a scan mirror of a laser projector, etc.

In other implementations, the photonic integrated circuit 600 or the photonic integrated circuit 800 may include one or more diffractive optical elements (DOE) and/or refractive/reflective optical elements that combine the different color beams 610a-d or 810a-d in order to achieve coaxial superposition.

Alternatively, instead of writing a waveguide combiner, individual waveguides could be written which do not strictly coaxially superimpose the beams of light, but instead bring each beam of light close together. That is, the input facet (e.g., grating coupler) for each waveguide in the photonic integrated circuit can be positioned relatively far from the other input facets, to receive laser light from a respective laser diode, but the output facets for each of the waveguides can be positioned relatively close together. In other words, a spacing between the output facets of each waveguide can be smaller than a spacing of the input facets of each waveguide. In such an implementation, each waveguide can be optimized for performance with light of a corresponding wavelength, for example to ensure that each wavelength of light exits the photonic integrated circuit with the same divergence angle as each other wavelength. The output of each individual waveguide can be placed close enough together (on the order of 10s of microns) such that that the light output by each individual waveguide may still follow the same optical path through the rest of a projector, display, or WHUD assembly where the photonic integrated circuit is implemented.

Figure 11:
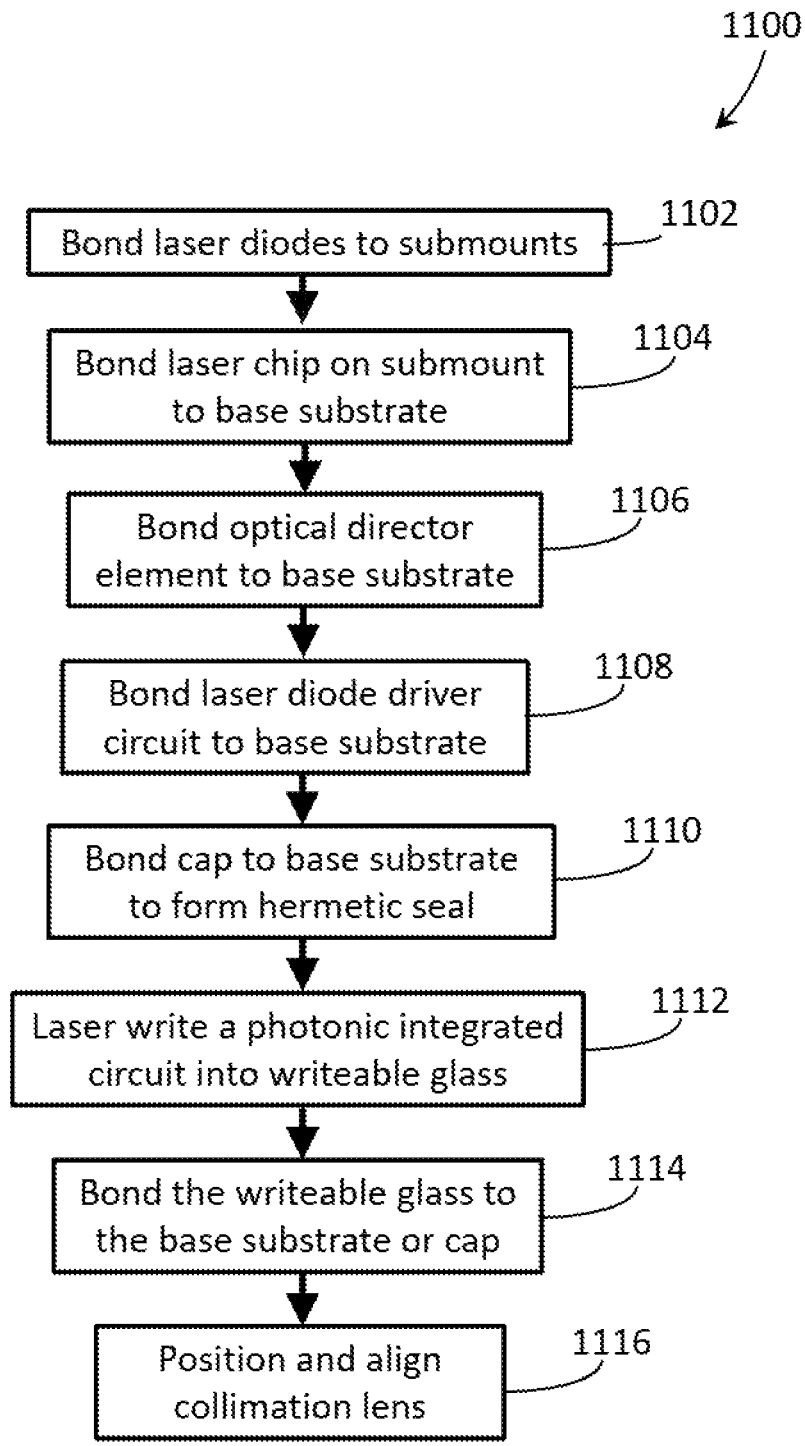
FIG. 11 is a flow diagram of a method of manufacturing an optical engine including writing a photonic integrated circuit, in accordance with the present systems, devices, and methods.

FIG. 11 is a flow diagram of a method 1100 of manufacturing an optical engine, in accordance with the present systems, devices, and methods. The method 1100 may be implemented to manufacture the optical engine 700 of FIG. 7 or the optical engine 900 of FIG. 9, for example. It should be appreciated that methods of manufacturing optical engines according to the present disclosure may include fewer or additional acts than set forth in the method 1100. Further, the acts discussed below may be performed in an order different than the order presented herein.

Method 1100 can include at least acts 1102, 1104, 1106, 1108, 1110, 1112, 1114, and 1116. Acts 1102, 1104, 1106, 1108, and 1110 substantially correspond to acts 502, 504, 506, 508, and 510, respectively, of method 500 in FIG. 5, such that the disclosure of these acts with reference to FIG. 5 is also applicable to FIG. 11. As such, the details of these acts in FIG. 11 will not be repeated in the interests of brevity.

At 1112, a photonic integrated circuit is laser written in writeable glass, using for example the techniques described with regards to FIG. 10. The photonic integrated circuit may be similar to photonic integrated circuit 600 described with reference to FIG. 6 or photonic integrated circuit 800 described with reference to FIG. 8. Specifically, the photonic integrated circuit can include at least one input facet and at least one output facet. In operation, the photonic integrated circuit can receive a plurality of beams of light that are coupled to the photonic integrated circuit at a plurality of input facets (e.g., grating couplers), and wavelength multiplex the plurality of beams of light to provide a coaxially superimposed aggregate beam of light that exits the photonic integrated circuit at the output facet. Alternatively, in operation, the photonic integrated circuit can receive a plurality of beams of light that are coupled to the photonic integrated circuit at a plurality of input facets (e.g., grating couplers), redirect the plurality of beams of light to exit the photonic integrated circuit at a plurality of spatially close output facets.

At 1114, the writeable glass including the photonic integrated circuit is bonded to the cap or the base substrate. Any appropriate bonding technique may be used, including those described with reference to acts 502, 504, 506, 508, and 510 in FIG. 5. In some implementations, the photonic integrated circuit may be positioned against an optical window of the cap, such that laser light from the laser diodes may pass through the optical window directly into the input facets of the photonic integrated circuit. Alternatively, the photonic integrated circuit may be positioned directly against the cap, such that the photonic integrated circuit acts as the optical window, and laser light from the laser diodes may directly enter the input facets of the photonic integrated circuit. In other implementations, the photonic integrated circuit may be spatially separated from the cap.

In order for light to travel through a photonic integrated circuit, the light emitted by each laser diode should preferably be aligned with a respective input facet of the photonic integrated circuit with high precision; mis-alignment of greater than 10 micrometers may significantly reduce the efficiency of the photonic integrated circuit. An output facet of each laser diode may have dimensions smaller than four square micrometers; aligning such small components to such high precision presents a non-trivial technical challenge.

In one implementation, each input facet of the photonic integrate circuit could be written as a grating coupler as shown in FIG. 6, which increases the tolerances for mis-alignment.

Act 1116, a collimation lens may be provided such that a coaxially superimposed beam of light from the output edge of the photonic integrated circuit will be collimated by the collimation lens. The collimation lens may optionally optimize the spot (e.g., circularize) the coaxially superimposed beam. In some implementations, more than one collimation lens may be provided if the light output from the photonic integrated circuit is not a fully coaxially superimposed beam. The collimation lens or lenses may be actively aligned after the other components are assembled, or may be passively aligned such that appropriate alignment is achieved during assembly.

As mentioned above, aligning a photonic integrated circuit such that each input facet of the photonic integrated circuit lines up with a beam of light emitted by each laser diode with high-precision presents a non-trivial challenge. The present systems, devices, and methods provide a solution to this challenge, by producing photonic integrated circuits where the fabrication process includes an alignment process, obviating the need for a later mechanical alignment process, as discussed below with reference to FIGS. 12, 12B, and 13. Direct laser writing (DLW) as disclosed herein is a process by which photonic integrated circuits may be fabricated with high precision that allows for intrinsic alignment.

FIG. 12A is a left side sectional view of photonic integrated circuit writing system 1200a. Photonic integrated circuit writing system 1200a includes components that may be substantively similar to components of optical engine 700 and components of laser writing system 1000. Unless context below dictates otherwise, the disclosure of components in FIG. 7 and FIG. 10 is applicable to similarly numbered components in FIG. 12A and will not be repeated in the interests of brevity. Photonic integrated circuit writing system 1200a includes laser writing system 1000, which, during operation, writes a photonic integrated circuit in a block of writeable glass 1020 in a manner similar to the operation of laser writing system 1000 described above with reference to FIG. 10. Photonic integrated circuit writing system 1200a can be utilized to manufacture an optical engine using a process that is similar in at least some respects to method 1100 of FIG. 11, but with photonic integrated circuit writing system 1200a, act 1114 can be performed before act 1112, as detailed below.

Writeable glass 1020 is bonded to cap 720 prior to writing a photonic integrated circuit therein, using any of the bonding techniques discussed above. The writeable glass 1020 may comprise a contiguous piece of glass or similar transparent material that undergoes a change in refractive index when exposed to high-intensity laser light. Bonding the writeable glass to the cap includes positioning and orienting the writeable glass 1020 relative to each laser diode 710 to place the writeable glass 1020 in the path of the beam of light emitted by each laser diode 710, such that the beam of light emitted by each laser diode 710 impinges on the writeable glass.

Writeable glass 1020 can be positioned against optical window 730, such that beams of light from laser diodes 710 pass through optical window 730 directly into writeable glass 1020. Alternatively, the writeable glass 1020 may optionally form optical window 730.

The entire base substrate 702 and all components bonded thereto can be physically coupled to translatable mount 1030, such as with clamps 1021, adhesives, and/or any other appropriate coupling mechanism. Such coupling mechanism is preferably removable, such that base substrate 702 and all components bonded thereto can be detached from translatable mount 1030 after laser writing of writeable glass 1020 is complete.

With writeable glass 1020 bonded indirectly to base substrate 702 via cap 720, and base substrate 702 physically coupled to translatable mount 1030, at least one waveguide 1022 can be laser written into writeable glass 1020 by translating base substrate 702 and all components thereon using translatable mount 1030. At least one input facet 612 (for example at least one grating input coupler) can also be written into writeable glass 1020 by translating base substrate 702 and all components thereon using translatable mount 1030. Consequently, writeable glass 1020 becomes a photonic integrated circuit.

To determine where the at least one waveguide 1022 should be written, laser diodes 710 could be activated, thus causing beams of light therefrom to impinge on writeable glass 1020. Writing laser 1010 can be aligned to directly write waveguides and input facets (e.g., grating couplers as shown in FIG. 12A) at the exact location where the beams of light from laser diodes 710 impinge on the writeable glass 1020. In this way, the input facets of the resulting photonic integrated circuit will be accurately aligned with the laser diodes, ensuring efficient incoupling of the beams of light into the photonic integrated circuit.

Alternatively, the writeable glass 1020 could be illuminated, such as by being backlit if base substrate 702 is at least partially transparent. Writing laser 1010 can then be aligned to directly write waveguides based on locations of shadows caused by laser diodes 710, CoS's 712 and optical redirector element 718. In this way, the input facets of the resulting photonic integrated circuit will be accurately aligned with the laser diodes, ensuring efficient incoupling of the beams of light into the photonic integrated circuit.

Aligning the input facets of the photonic integrated circuit to the beams of light during the writing stage will be more accurate than trying to mechanically align a pre-fabricated photonic integrated circuit, due to deviations that can arise in the bonding processes of not only the pre-fabricated photonic integrate circuit, but also the laser diodes. As one example, if each of four laser diodes is randomly misaligned, it would be difficult to align a prefabricated photonic integrated circuit to match the beam of light from each diode, since not only could the photonic integrated circuit be misaligned during the bonding processes, but also the spacing between each laser diode may not match the spacing between each waveguide in the photonic integrated circuit due to the random misalignment of each of the laser diodes. Direct laser writing the photonic integrated circuit after all of the components have been mechanically bonded obviates these issues, by allowing the position and spacing of each laser diode relative to the writeable glass to be accounted for after bonding is complete.

FIG. 12B is a left side sectional view of photonic integrated circuit writing system 1200b. Photonic integrated circuit writing system 1200b includes components that may be substantively similar to components of photonic integrated circuit writing system 1200a as discussed with regards to FIG. 12A. Unless context below dictates otherwise, the disclosure related to components in FIG. 12A is applicable to similarly numbered components in FIG. 12B and will not be repeated in the interests of brevity.

In FIG. 12B, instead of writing the input facets 612 of the photonic integrated circuit 600 as grating input couplers, a reflective surface is instead written to redirect input beams of light 610 into at least one waveguide 1022 of photonic integrated circuit 600. For example, the at least one reflective surface could be a planar region with lower index of refraction than the material from which writeable glass 1020 is formed. Consequently, laser light 610 can be redirected by the planar region with lower index of refraction due to total internal reflection.

Additionally, FIG. 12B illustrates an implementation in which at least one laser diode 710 is a vertical-cavity surface-emitting laser (VCSEL), such that laser light emitted by the laser diode is directed towards optical window 730 without the need for an optical redirecting element. Such a laser diode setup could be implemented in any of the implementations discussed herein. The implementation of FIG. 12B does not require the use of a VCSEL, but could instead use a side emitting laser with an optical redirecting element such as shown in FIGS. 1A and 1B.

Figure 13:
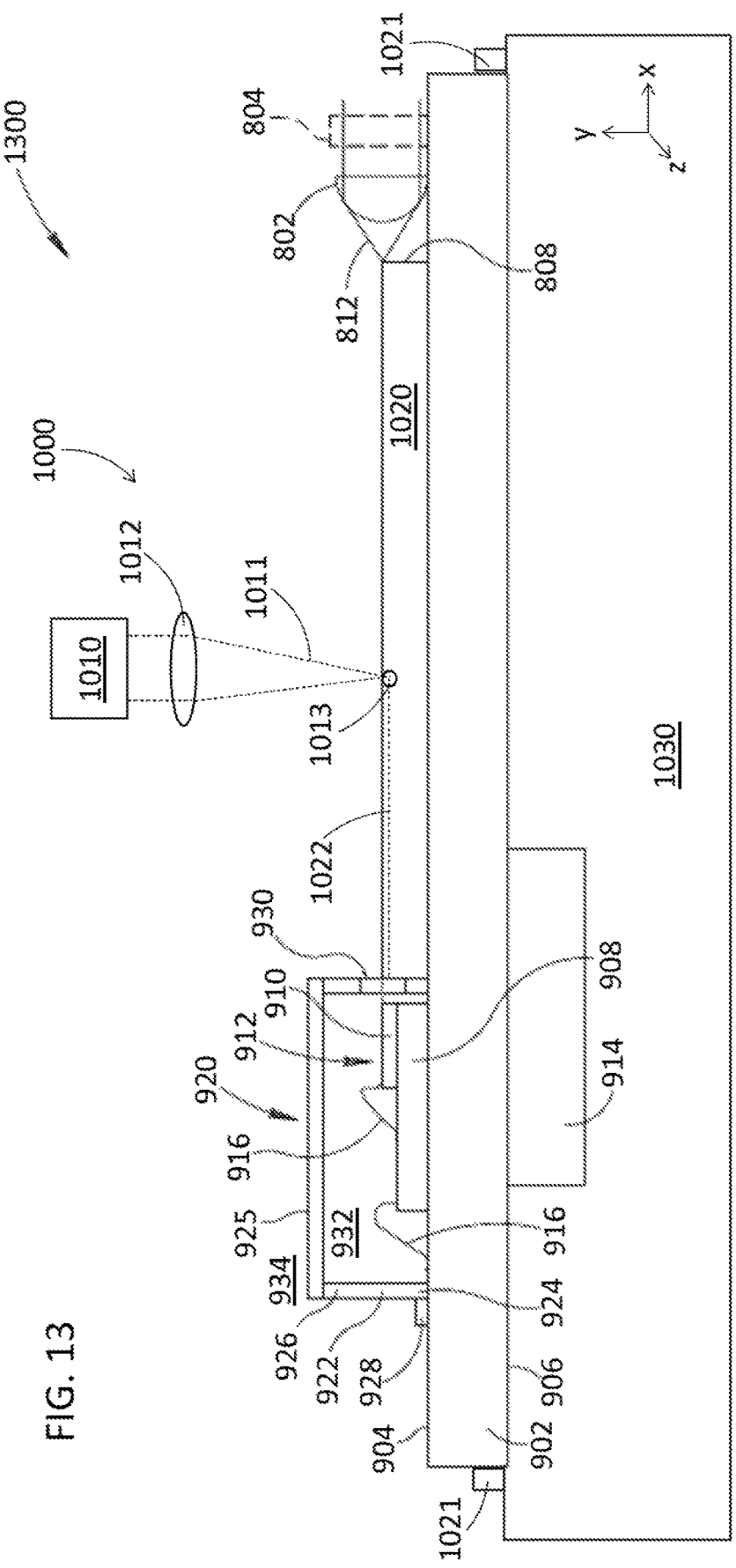

FIG. 13 is a left side sectional view of photonic integrated circuit writing system 1300. Photonic integrated circuit writing system 1300 includes components that may be substantively similar to components of optical engine 900 and components of laser writing system 1000. Unless context below dictates otherwise, the disclosure of components in FIG. 9 and FIG. 10 is applicable to similarly numbered components in FIG. 13 and will not be repeated in the interests of brevity. Photonic integrated circuit writing system 1300 includes laser writing system 1000, which, during operation, writes a photonic integrated circuit in a block of writeable glass 1020 in a manner similar to the operation of laser writing system 1000 described above with reference to FIG. 10. Photonic integrated circuit writing system 1300 can be utilized to manufacture an optical engine using a process that is similar in at least some respects to method 1100 of FIG. 11, but with photonic integrated circuit writing system 1300, act 1114 can be performed before act 1112, as detailed below.

Writeable glass 1020 is bonded to base substrate 902 prior to writing a photonic integrated circuit therein, using any of the bonding techniques discussed above. The writeable glass 1020 may comprise a contiguous piece of glass or similar transparent material that undergoes a change in refractive index when exposed to high-intensity laser light. Bonding the writeable glass to the base substrate includes positioning and orienting the writeable glass 1020 relative to each laser diode 910 to place the writeable glass 1020 in the path of the beam of light emitted by each laser diode 910, such that the beam of light emitted by each laser diode 910 impinges on an input edge of the writeable glass.

Writeable glass 1020 can be butted up against optical window 930, such that beams of light from laser diodes 910 passes through optical window 930 directly into writeable glass 1020. Alternatively, the writeable glass 1020 may optionally form optical window 930. Further, writeable glass 1020 may be bonded directly to at least one of the laser diodes 910 and/or at least one laser CoS 912.

The entire base substrate 902 and all components bonded thereto can be physically coupled to translatable mount 1030, such as with clamps 1021, adhesives, and/or any other appropriate coupling mechanism. Such coupling mechanism is preferably removable, such that base substrate 902 and all components bonded thereto can be detached from translatable mount 1030 after laser writing of writeable glass 1020 is complete.

With writeable glass 1020 bonded to base substrate 902 and base substrate 902 physically coupled to translatable mount 1030, at least one waveguide 1022 can be laser written into writeable glass 1020 by translating base substrate 902 and all components thereon using translatable mount 1030. Consequently, writeable glass 1020 becomes a photonic integrated circuit.

To determine where the at least one waveguide 1022 should be written, laser diodes 910 could be activated, thus causing beams of light therefrom to impinge on an input edge of writeable block 1020. Writing laser 1010 can be aligned to directly write waveguides at the exact location where the beams of light from laser diodes 910 impinge on the writeable block 1020. In this way, the input of the resulting photonic integrated circuit will be accurately aligned with the laser diodes, ensuring efficient incoupling of the beams of light into the photonic integrated circuit.

Alternatively, the writeable glass 1020 could be illuminated, such as by being backlit if base substrate 902 is at least partially transparent. Writing laser 1010 can then be aligned to directly write waveguides at locations where shadows of laser diodes 910 and/or CoS's 912 appear. In this way, the input of the resulting photonic integrated circuit will be accurately aligned with the laser diodes, ensuring efficient incoupling of the beams of light into the photonic integrated circuit.

Aligning the input facets of the photonic integrated circuit to the beams of light during the writing stage will be more accurate than trying to mechanically align a pre-fabricated photonic integrated circuit, due to deviations that can arise in the bonding processes of not only the pre-fabricated photonic integrate circuit, but also the laser diodes. As one example, if each of four laser diodes is randomly misaligned, it would be difficult to align a prefabricated photonic integrated circuit to match the beam of light from each diode, since not only could the photonic integrated circuit be misaligned during the bonding processes, but also the spacing between each laser diode may not match the spacing between each waveguide in the photonic integrated circuit due to the random misalignment of each of the laser diodes. Direct laser writing the photonic integrated circuit after all of the components have been mechanically bonded obviates these issues, by allowing the position and spacing of each laser diode relative to the writeable glass to be accounted for after bonding is complete.

In some implementations, a photonic integrated circuit could be manufactured using a combination of the techniques described with reference to FIGS. 10, 11, 12A, 12B, and 13 as discussed below.

In one example, a large portion of a photonic integrated circuit could be first written, except for a small portion of the photonic integrated circuit at the input of writeable glass. Subsequently, the photonic integrated circuit could be bonded to the cap or the base substrate such as in FIG. 12A, 12B, or 13, and the remaining small portion of the photonic integrated circuit at the input of the writeable glass could be written to couple the output of each laser diode to the portion of the photonic integrated circuit which is already written.

Figure 14:
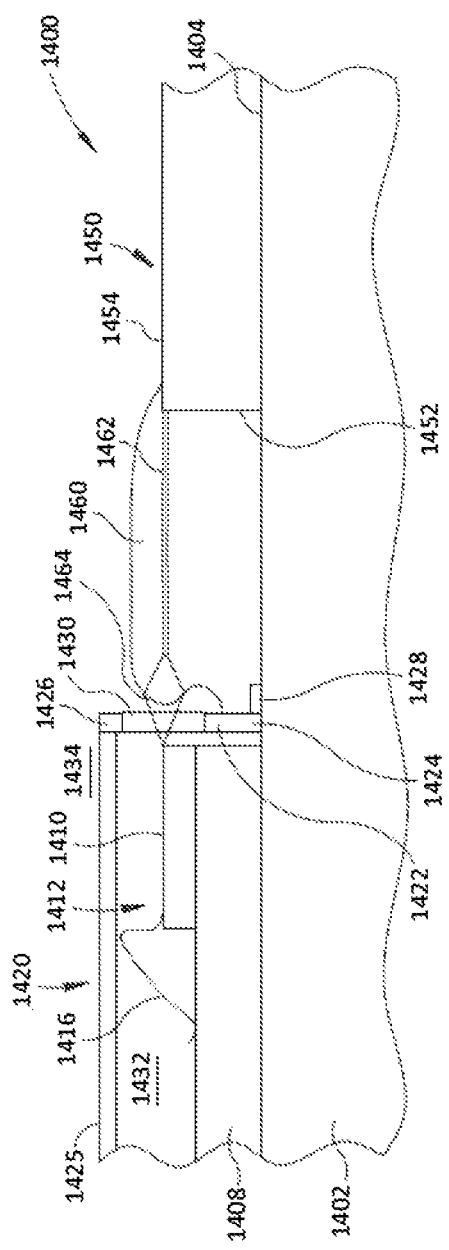
FIG. 14 is a left side sectional elevational view of an optical engine that includes a plurality of laser diodes inside a hermetically or partially hermetically sealed package coupled to a photonic integrated circuit for wavelength multiplexing via a directly written waveguide, in accordance with the present systems, devices, and methods.
Figure 15:
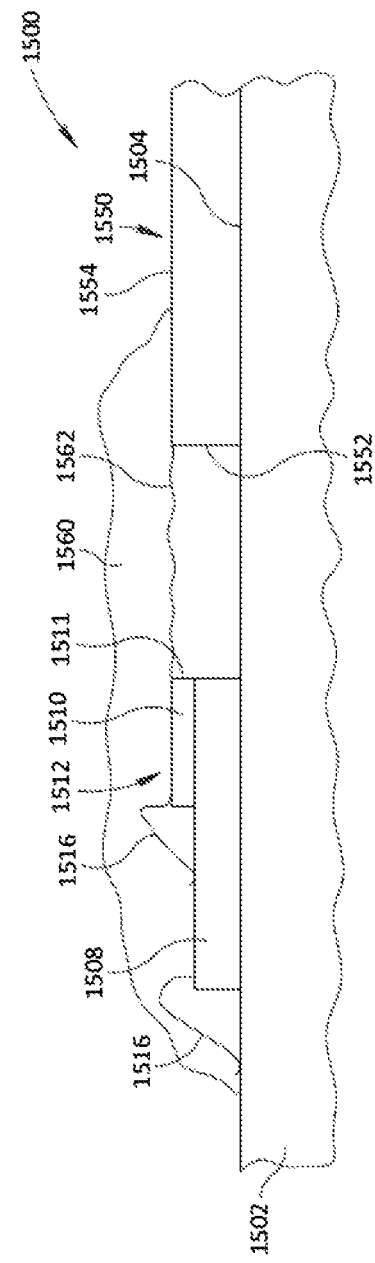
FIG. 15 is a left side sectional elevational view of an optical engine that includes a plurality of laser diodes coupled to a photonic integrated circuit for wavelength multiplexing via a directly written waveguide, wherein the waveguide is formed in a waveguide medium that also provides a hermetic or partially hermetic seal for the plurality of laser diodes, in accordance with the present systems, devices, and methods.

In another example, a first photonic integrated circuit could be written as in FIG. 10. Subsequently, the first photonic integrated circuit could be bonded to the cap similar to as in FIG. 7, 12A, or 12B, or to the base substrate as in FIG. 9 or 13, with the first photonic integrated circuit being spatially separated from the output of each laser diode such that there is a gap between the output from each laser diode and the first photonic integrated circuit. In the area in the output path of each laser diode, a block of writeable glass could be bonded to the cap or to the base substrate in the gap between the output from each laser diode and the first photonic integrated circuit. Subsequently, a second photonic integrated circuit could be written in the writeable glass similar to in FIGS. 12A, 12B, and 13 to couple the output of each laser diode to an input edge of the previously written first photonic integrated circuit. In such an example, the writeable glass could be formed as the optical window, and/or could be formed to cover a portion of the first photonic integrate circuit. FIGS. 14 and 15 illustrate exemplary implementations of this setup.

FIG. 14 is a left side sectional elevational view of a portion of an optical engine 1400. The optical engine 1400 includes several components that may be similar or identical to the components of the optical engines 100, 700 or 900. Thus, some or all of the discussion above may be applicable to the optical engine 1400, and is not repeated herein for the sake of brevity. For example, portions of the optical engine 1400 not shown in FIG. 14 may be similar or identical to corresponding portions of the optical engine 900 of FIG. 9.

The optical engine 1400 includes a base substrate 1402 having a top surface 1404 and a bottom surface (not shown) opposite the top surface. The base substrate 1402 may be formed from a material that is radio frequency (RF) compatible and is suitable for hermetic sealing. For example, the base substrate 1402 may be formed from low temperature co-fired ceramic (LTCC), alumina, aluminum nitride (AlN), Kovar®, etc.

The optical engine 1400 also includes a plurality of chip submounts 1408 (only one chip submount visible in the sectional view of FIG. 14) that are bonded (e.g., attached) to the top surface 1404 of the base substrate 1402. The plurality of chip submounts 1408 are aligned in a row across a width of the optical engine 1400 between the left and right sides thereof. Each of the plurality of chip submounts 1408 includes a laser diode 1410, also referred to as a laser chip or laser die, bonded thereto. In particular, an infrared chip submount carries an infrared laser diode, a red chip submount carries a red laser diode, a green chip submount carries a green laser diode, and a blue chip submount carries a blue laser diode. In operation, the infrared laser diode provides infrared laser light, the red laser diode provides red laser light, the green laser diode provides green laser light, and the blue laser diode provides blue laser light. Each of the laser diodes 1410 may comprise one of an edge emitter laser or a vertical-cavity surface-emitting laser (VCSEL), for example. Each of the four laser diode/chip submount pairs may be referred to collectively as a "laser chip on submount," or a laser CoS 1412. Thus, the optical engine 1400 includes an infrared laser CoS, a red laser CoS, a green laser CoS, and a blue laser CoS. In at least some implementations, one or more of the laser diodes 1410 may be bonded directly to the base substrate 1402 without use of a submount 1408.

Although not shown in FIG. 14, the optical engine 1400 also includes a laser diode driver circuit (e.g., similar or identical to the laser diode driver circuit 914) bonded to a surface of the base substrate 1402 or located remotely therefrom. The laser diode driver circuit 1414 is operatively coupled to the plurality of laser diodes 1410 via suitable electrical connections 1416 to selectively drive current to the plurality of laser diodes. Generally, the laser diode driver circuit 1414 may be positioned relative to the CoSs 1412 to minimize the distance between the laser diode driver circuit 1414 and the CoSs 1412. Although not shown in FIG. 14, the laser diode driver circuit 1414 may be operatively coupleable to a controller (e.g., microcontroller, microprocessor, ASIC) that controls the operation of the laser diode driver circuit 1414 to selectively modulate laser light emitted by the laser diodes 1410. In at least some implementations, the laser diode driver circuit 1414 may be bonded to another portion of the base substrate 1402, such as the top surface 1404 of the base substrate. In at least some implementations, the laser diode driver circuitry 1414 may be remotely located and operatively coupled to the laser diodes 1410. In order to not require the use of impedance matched transmission lines, the size scale may be small compared to a wavelength (e.g., lumped element regime), where the electrical characteristics are described by (lumped) elements like resistance, inductance, and capacitance. Exemplary placements for laser diode driver circuitry are described below with reference to FIGS. 16A and 16B.

In at least some implementations, the optical engine 1400 also includes a cap 1420 that includes a vertical sidewall 1422 and a horizontal wall or top portion 1425. The vertical sidewall 1422 includes a lower first end 1424 and an upper second end 1426 opposite the first end. A flange 1428 may be disposed around a perimeter of the sidewall 1422 adjacent the lower first end 1424. Within a portion of the vertical sidewall 1422 there is an optical window 1430 positioned proximate the laser diodes 1410 to pass light therefrom out of the cap 1420. The sidewall 1422 and the optical window 1430 together define an interior volume 1432 sized and dimensioned to receive the plurality of chip submounts 1408 and the plurality of laser diodes 1410. The lower first end 1424 and the flange 1428 of the cap 1420 are bonded to the base substrate 1402 to provide a hermetic or partially hermetic seal between the interior volume 1432 of the cap and a volume 1434 exterior to the cap.

The cap 1420 may have a round shape, rectangular shape, or other shape. Thus, the vertical sidewall 1422 may comprise a continuously curved sidewall, a plurality (e.g., four) of adjacent planar portions, etc. The optical window 1430 may comprise an entire side of the cap 1420, or may comprise only a portion thereof. In at least some implementations, the cap 1420 may include a plurality of optical windows instead of a single optical window 1430.

The optical engine 1400 also includes a waveguide medium or material 1460 disposed on the top surface 1404 of the base substrate 1404 between the optical window 1430 of the cap 1420 and a photonic integrated circuit 1450. The waveguide medium 1460 includes waveguides 1462 (e.g., four waveguides, only one visible in the sectional view of FIG. 14) that are operative to couple the plurality of beams of light emitted by the plurality of laser diodes 1410 from the optical window 1430 of the cap 1420 to input couplers (e.g., edge couplers, grating couplers) on an edge 1452 or top surface 1454 of the photonic integrated circuit 1450. Each of the plurality of waveguides 1462 is positioned and dimensioned to receive light from a corresponding one of the laser diodes 1410 through the optical window 1430. The waveguides 1462 may be directly written using the direct laser writing process described above with reference to FIG. 10, 11, 12A, 12B, or 13, or any other suitable process.

The waveguides 1462 couple the beams of light into the photonic integrated circuit 1450 via input optical edge couplers or grating couplers. The photonic integrated circuit 1450 may be bonded to the top surface 1404 of the base substrate 1402 proximate the waveguide medium 1460. As discussed above, in operation, the photonic integrated circuit 1450 receives a plurality of beams of light at the input couplers, and wavelength multiplexes the plurality of beams to provide a coaxially superimposed aggregate beam of light that exits the photonic integrated circuit at an output optical edge.

In at least some implementations, at least some of the components may be positioned differently. As noted above, a laser diode driver circuit operatively coupled to the laser diodes 1410 may be mounted on the top surface 1404 or the bottom surface of the base substrate 1402, or may be positioned remotely therefrom, depending on the RF design and other constraints (e.g., package size). In at least some implementations, the optical engine 1400 may include optical director element (e.g., optical director element 118 of FIG. 1), and the laser light may be directed from the laser diodes 1410 toward the waveguide medium 1460 via an intermediate optical director element. In at least some implementations, photonic integrated circuit 1450 and waveguide medium 1460 may be positioned on top of cap 1420, and the optical window 1430 may be in top portion 1425 of cap 1420, with light beams from laser diodes 1410 passing through the optical window 1430 on the top portion of cap 1420 into waveguide medium 1460 and subsequently photonic integrated circuit 1450. Additionally, in at least some implementations, one or more of the laser diodes 1410 may be mounted directly on the base substrate 1402 without use of a submount. Further, in at least some implementations, in the case of an inorganic or acceptably organic waveguide, coupling may be accomplished inside the encapsulated package. Such feature eliminates the requirement for a separate window, as the waveguide medium 1460 services as the window (e.g., optical window 1430). In such implementations, the at least one optical input coupler of the photonic integrated circuit may be positioned inside the interior volume of the encapsulated package and the at least one optical output edge of the photonic integrated circuit may be positioned outside of the interior volume, for example.

In at least some implementations, the waveguides 1462 may be directly written into the waveguide medium 1460 using any suitable direct writing process, such as that described above with reference to FIGS. 10, 12A, 12B, and 13. The waveguide medium 1460 may comprise any suitable photosenstive material. In at least some implementations, the waveguide medium comprises organically modified ceramic (ORMOCER) material, for example. As noted above, coupling to the photonic integrated circuit 1450 may be done either via edge coupling or grating coupling.

In the illustrated implementation, the written waveguide 1462 and medium 1460 is spaced apart from the optical window 1430, and a lens shaped surface 1464 is formed in the medium 1460. The lens shaped surface 1464 may be sized, dimensioned and oriented to couple beams of light from the laser diodes 1410 into the waveguides 1462 of the waveguide medium 1460. In other implementations, the waveguide 1462 and or waveguide medium 1460 may be positioned adjacent (e.g., in contact with) at least one of the optical window 1430 of the cap 1430 or the photonic integrated circuit 1450.

FIG. 15 shows a left side sectional elevational view of a portion of an optical engine 1500. The optical engine 1500 includes several components that may be similar or identical to the components of the optical engines 100, 700, 900, or 1400. Thus, some or all of the discussion above may be applicable to the optical engine 1500, and is not repeated herein for the sake of brevity. For example, portions of the optical engine 1500 not shown in FIG. 15 may be similar or identical to corresponding portions of the optical engine 900 of FIG. 9.

The optical engine 1500 includes a base substrate 1502 having a top surface 1504 and a bottom surface (not shown) opposite the top surface. The base substrate 1502 may be formed from a material that is radio frequency (RF) compatible and is suitable for hermetic sealing. For example, the base substrate 1502 may be formed from low temperature co-fired ceramic (LTCC), alumina, aluminum nitride (AlN), Kovar®, etc.

The optical engine 1500 also includes a plurality of chip submounts 1508 (only one chip submount visible in the sectional view of FIG. 15) that are bonded (e.g., attached) to the top surface 1504 of the base substrate 1502. The plurality of chip submounts 1508 are aligned in a row across a width of the optical engine 1500 between the left and right sides thereof. Each of the plurality of chip submounts 1508 includes a laser diode 1510, also referred to as a laser chip or laser die, bonded thereto. In particular, an infrared chip submount carries an infrared laser diode, a red chip submount carries a red laser diode, a green chip submount carries a green laser diode, and a blue chip submount carries a blue laser diode. In operation, the infrared laser diode provides infrared laser light, the red laser diode provides red laser light, the green laser diode provides green laser light, and the blue laser diode provides blue laser light. Each of the laser diodes 1510 may comprise one of an edge emitter laser or a vertical-cavity surface-emitting laser (VCSEL), for example. Each of the four laser diode/chip submount pairs may be referred to collectively as a "laser chip on submount," or a laser CoS 1512. Thus, the optical engine 1500 includes an infrared laser CoS, a red laser CoS, a green laser CoS, and a blue laser CoS. In at least some implementations, one or more of the laser diodes 1510 may be bonded directly to the base substrate 1502 without use of a submount 1508.

Although not shown in FIG. 15, the optical engine 1500 also includes a laser diode driver circuit (e.g., similar or identical to the laser diode driver circuit 914) bonded to a surface of the base substrate 1502 or located remotely therefrom, similarly to as described with regards to FIGS. 16A and 16B below. The laser diode driver circuit 1514 is operatively coupled to the plurality of laser diodes 1510 via suitable electrical connections 1516 to selectively drive current to the plurality of laser diodes.

The optical engine 1500 also includes a photonic integrated circuit 1550 bonded to the top surface 1504 of the base substrate 1502 proximate facets 1511 of the laser diodes 1510. In operation, the photonic integrated circuit 1550 receives a plurality of beams of light at input couplers (e.g., edge couplers, grating couplers), and wavelength multiplexes the plurality of beams to provide a coaxially superimposed aggregate beam of light that exits the photonic integrated circuit at an output optical edge (not shown in FIG. 15).

In the illustrated implementation, the laser CoSs 1512 and electrical connections 1516 (e.g., wirebonds) are covered with a waveguide and sealing medium 1560, which may also cover at least a portion of an edge 1552 and a top surface 1554 of the photonic integrated circuit 1550. Advantageously, the waveguide and sealing medium acts as a sealing material for the laser CoSs 1512, eliminating the need for a separate cap (e.g., cap 1420 of FIG. 14) to provide a hermetically or partially hermetically sealed package.

The waveguide medium 1560 includes directly written waveguides 1562 (e.g., four waveguides, only one visible in the sectional view of FIG. 15) that are operative to couple the plurality of beams of light emitted at the facets 1511 of the plurality of laser diodes 1510 to input couplers (e.g., edge couplers, grating couplers) on the edge 1552 or top surface 1554 of the photonic integrated circuit 1550. Each of the plurality of waveguides 1562 is positioned and dimensioned to receive light from a corresponding one of the laser diodes 1510. The waveguides 1562 may be directly written using any suitable process, such as direct laser writing as described with reference to FIGS. 10, 12A, 12B, and 13 above.

The waveguides 1562 couple the beams of light into the photonic integrated circuit 1550 via an input optical edge couplers or grating couplers. The photonic integrated circuit 1550 may be bonded to the top surface 1504 of the base substrate 1502 proximate the waveguide medium 1560. As discussed above, in operation, the photonic integrated circuit 1550 receives a plurality of beams of light at the input couplers, and wavelength multiplexes the plurality of beams to provide a coaxially superimposed aggregate beam of light that exits the photonic integrated circuit at an output optical edge.

In at least some implementations, photonic integrated circuit 1550 may be positioned above laser diodes 1510, and waveguide and sealing medium 1560 may be formed to cover laser diodes 1510 and photonic integrated circuit 1550. At least one waveguide 1562 can be directly written in waveguide medium 1560 to couple beams of light emitted by laser diodes 1510 to input couplers on photonic integrated circuit 1550, using for example the techniques discussed above regarding FIGS. 10, 12A, 12B, and 13.

Although several different materials may be used for direct waveguide writing, in at least some implementations, an ORMOCER material may be used which is tailored to the particular needs concerning writing as well as transmission wavelengths.

FIGS. 16A and 16B are isometric views showing implementations of optical engines having differing positions for a laser diode driver circuit. The implementations shown in FIGS. 16A and 16B are similar in at least some respects to the implementations of FIGS. 1A, 1B, 7, 9, 12A, 12B, 13, 14, and 15, and one skilled in the art will appreciate that the description regarding FIGS. 1A, 1B, 7, 9, 12A, 12B, 13, 14, and 15 are applicable to the implementations of FIGS. 16A and 16B unless context clearly dictates otherwise.

FIG. 16A shows an optical engine 1600a which includes a base substrate 1602. The base substrate 1602 may be formed from a material that is radio frequency (RF) compatible and is suitable for hermetic sealing. For example, the base substrate 1602 may be formed from low temperature co-fired ceramic (LTCC), aluminum nitride (AlN), alumina, Kovar®, etc.

The optical engine 1600a also includes a plurality of laser diodes aligned in a row across a width of the optical engine 1600a, including an infrared laser diode 1610a, a red laser diode 1610b, a green laser diode 1610c, and a blue laser diode 1610d. In operation, the infrared laser diode 1610a provides infrared laser light, the red laser diode 1610b provides red laser light, the green laser diode 1610c provides green laser light, and the blue laser diode 1610d provides blue laser light. Each of the laser diodes may comprise one of an edge emitter laser or a vertical-cavity surface-emitting laser (VCSEL), for example. In FIG. 16A, laser diodes 1610a, 1610b, 1610c, and 1610d are shown as being bonded (e.g., attached) directly to base substrate 1602, as described above with regards to act 504 in FIG. 5, but one skilled in the art will appreciate that laser diodes 1610a, 1610b, 1610c, and 1610d could each be mounted on a respective submount, similar to as in FIGS. 1A and 1B.

The optical engine 1600a also includes a laser diode driver circuit 1614 which can be bonded to the same surface of base substrate 1602 as the laser diodes 1610a, 1610b, 1610c, 1610d. In alternative implementations, laser diode driver circuit 1614 can be bonded to a separate base substrate, such as in FIG. 16B discussed later. The laser diode driver circuit 1614 is operatively coupled to the plurality of laser diodes 1610a, 1610b, 1610c, and 1610d via respective electrical connections 1616a, 1616b, 1616c, 1616d to selectively drive current to the plurality of laser diodes. In at least some implementations, the laser diode driver circuit 1614 may be positioned relative to the laser diodes 1610a, 1610b, 1610c, and 1610d to minimize the distance between the laser diode driver circuit 1614 and the laser diodes. Although not shown in FIG. 16A, the laser diode driver circuit 1614 may be operatively coupleable to a controller (e.g., microcontroller, microprocessor, ASIC) which controls the operation of the laser diode driver circuit 1614 to selectively modulate laser light emitted by the laser diodes 1610a, 1610b, 1610c, and 1610d. In at least some implementations, the laser diode driver circuit 1614 may be bonded to another portion of the base substrate 1602, such as the bottom surface of the base substrate 1602. In at least some implementations, the laser diode driver circuitry 1614 may be remotely located and operatively coupled to the laser diodes 1610a, 1610b, 1610c, and 1610d. In order to not require the use of impedance matched transmission lines, the size scale may be small compared to a wavelength (e.g., lumped element regime), where the electrical characteristics are described by (lumped) elements like resistance, inductance, and capacitance.

Proximate the laser diodes 1610a, 1610b, 1610c, and 1610d there is optionally positioned an optical director element 1618. Like the laser diodes 1610a, 1610b, 1610c, and 1610d, the optical director element 1618 is bonded to the top surface of the base substrate 1602. The optical director element 1618 may be bonded proximate to or adjacent each of the laser diodes 1610a, 1610b, 1610c, and 1610d. In the illustrated example, the optical director element 1618 has a triangular prism shape that includes a plurality of planar faces, similar to optical director element 168 in FIGS. 1A and 1B. The optical director element 1618 may comprise a mirror or a prism, for example.

The optical engine 1600a also includes a cap 1620 similar to cap 120 in FIGS. 1A and 1B or cap 920 in FIG. 9. For clarity, cap 1620 is shown as being transparent in FIG. 16A, though this is not necessarily the case, and cap 1620 can be at least partially formed of an opaque material. In the illustrated implementation, cap 1620 can include a horizontal optical window 1630 that forms the "top" of the cap 1620. Although optical window 1630 in FIG. 16A is shown as comprising the entire top of cap 1620, in alternative implementations optical window could comprise only a portion of the top of cap 1620. Cap 1620 including optical window 1630 defines an interior volume sized and dimensioned to receive the plurality of laser diodes 1610a, 1610b, 1610c, 1610d, and the optical director element 1618. Cap 1620 is bonded to the base substrate 1602 to provide a hermetic or partially hermetic seal between the interior volume of the cap 1620 and a volume exterior to the cap 1620. The optical director element 1618 is positioned and oriented to direct (e.g., reflect) laser light received from each of the plurality of laser diodes 1610a, 1610b, 1610c, and 1610d upward toward the optical window 1630 of the cap 1620, wherein the laser light exits the interior volume, similar to FIGS. 1A and 1B.

The cap 1620 may have a round shape, rectangular shape, or other shape, similarly to as described regarding FIGS. 1A and 1B above. The optical window 1630 may comprise an entire top of the cap 1620, or may comprise only a portion thereof. In alternative implementations, optical window 1630 could be positioned on a side of cap 1620 to allow beams of light from laser diodes 1610a, 1610b, 1610c, and 1610d to exit the cap through a side portion thereof. In such an implementation, each of laser diodes 1610a, 1610b, 1610c, and 1610d can be a side-emitting laser, and optical engine 1600a may not include optical redirector element 1618.

In at least some implementations, the cap 1620 may include a plurality of optical windows instead of a single optical window.

The optical engine 1600a can also include four collimation/pointing lenses similarly to as discussed regarding FIGS. 1A and 1B above. Each of the collimation lenses can be operative to receive laser light from a respective one of the laser diodes 1610a, 1610b, 1610c, or 1610d, and to generate a single color beam.

The optical engine 1600a may also include, or may be positioned proximate to, a beam combiner that is positioned and oriented to combine the light beams received from each of the collimation lenses or laser diodes 1610a, 1610b, 1610c, or 1610d into a single aggregate beam. As an example, the beam combiner may include one or more diffractive optical elements (DOE) and/or one or more refractive/reflective optical elements that combine the different color beams in order to achieve coaxial superposition. Exemplary beam combiners are shown and discussed with reference to FIG. 3, 7, 9, 12A, 12B, or 13.

In at least some implementations, the laser diodes 1610a, 1610b, 1610c, 1610d, the optical director element 1618, and/or the collimation lenses may be positioned differently. As noted above, laser diode driver circuit 1614 may be mounted on a top surface or a bottom surface of the base substrate 1602, depending on the RF design and other constraints (e.g., package size). In at least some implementations, the optical engine 1600a may not include the optical director element 1618, and the laser light may be directed from the laser diodes 1610a, 1610b, 1610c, and 1610d toward collimation lenses without requiring an intermediate optical director element. Additionally, in at least some implementations, one or more of the laser diodes may be mounted indirectly on the base substrate 1602 with a submount.

Optical engine 1600a in FIG. 16A also includes an electrically insulating cover 1640. In FIG. 16A, laser diodes 1610a, 1610b, 1610c, and 1610d are each connected to laser diode driver circuitry 1614 by a respective electrical connection 1616a, 1616b, 1616c, or 1616d positioned as described above with regards to act 508 in FIG. 5. Electrical connections 1616a, 1616b, 1616c, and 1616d run across a surface of the base substrate 1602. As described above with regards to act 510 in FIG. 5, electrically insulating cover 1640 is placed, adhered, formed, or otherwise positioned over electrical connections 1616a, 1616b, 1616c, and 1616d, such that each of the electrical connections 1616a, 1616b, 1616c, and 1616d run through electrically insulating cover 1640. Also as described above with regards to act 510 in FIG. 5, cap 1620 is placed, adhered, formed, or otherwise positioned over electrically insulating cover 1640, such that cap 1620 does not contact any of the electrical connections 1616a, 1616b, 1616c, or 1616d. For clarity, cap 1620 is shown as being transparent in FIG. 16A, though this is not necessarily the case, and cap 1620 can be at least partially formed of an opaque material. Electrically insulating cover 1640 can be formed of a material with low electrical permittivity such as a ceramic, such that electrical signals which run through electrical connections 1616a, 1616b, 1616c, and 1616d do not run into or through electrically insulating cover 1640. In this way, electrical signals which run through electrical connections 1616a, 1616b, 1616c, and 1616d can be prevented from running into or through cap 1620, which can be formed of an electrically conductive material. Although FIG. 16A shows electrically insulating cover 1640 as extending along only part of a side of cap 1620, one skilled in the art will appreciate that electrically insulating cover 1640 can extend along an entire side length of cap 1620.

One skilled in the art will appreciate that the positions of laser diode driver circuitry 1614, electrical connections 1616a, 1616b, 1616c, 1616d, and electrically insulating cover 1640 as shown in FIG. 16A could also be applied in other implementations of the subject systems, devices and methods. For example, in the implementations of FIGS. 1A and 1B, laser diode driver circuitry 114 could be positioned on top surface 104 of base substrate 102, and electrical connections 116 could run across top surface 104 under an electrically insulating cover, such that electrical connections 116 do not contact any conductive portion of cap 120.

FIG. 16B is an isometric view an optical engine 1600b similar in at least some respects to optical engine 1600a of FIG. 16A. One skilled in the art will appreciate that the description of optical engine 1600a in FIG. 16A is applicable to optical engine 1600b in FIG. 16B, unless context clearly dictates otherwise. The optical engine 1600b includes a base substrate 1603a. Similar to base substrate 1602 in FIG. 16A, base substrate 1603a may be formed from a material that is radio frequency (RF) compatible and is suitable for hermetic sealing. For example, the base substrate 1603a may be formed from low temperature co-fired ceramic (LTCC), alumina, Kovar®, etc.

One difference between optical engine 1600b in FIG. 16B and optical engine 1600a in FIG. 16A relates to what components are bonded (e.g. attached) to base substrate 1603a. In optical engine 1600b, each of: laser diodes 1610a, 1610b, 1610c, 1610d; cap 1620; electrical connections 1616a, 1616b, 1616c, 1616d; and electrically insulating cover 1640 are bonded (e.g., attached) to base substrate 1603a. However, laser diode driver circuit 1614 is not necessarily bonded directly to base substrate 1603a. Instead, laser diode driver circuit 1614 could be bonded to a separate base substrate 1603b. Similar to base substrate 1602 in FIG. 16A and base substrate 1603a in FIG. 16B, base substrate 1603b may be formed from a material that is radio frequency (RF) compatible and is suitable for hermetic sealing. For example, the base substrate 1603b may be formed from low temperature co-fired ceramic (LTCC), alumina, Kovar®, etc. In an alternative implementation, laser diode drive circuit 1614 may not need to be bonded to a substrate at all, and could simply be mounted directly to a frame of a WHUD.

For implementations where laser diode drive circuit 1614 is not bonded to base substrate 1603a, electrical contacts 1617a, 1617b, 1617c, and 1617d could be bonded to base substrate 1603a, each at an end of a respective electrical connection 1616a, 1616b, 1616c, or 1616d as described above with regards to act 508 in FIG. 5. In this way, electrical contacts 1617a, 1617b, 1617c, and 1617d could be used to electrically couple laser diode drive circuit 1614 to electrical connections 1616a, 1616b, 1616c, and 1616d and consequently laser diodes 1610a, 1610b, 1610c, and 1610d.

Although the implementations of FIGS. 16A and 16B illustrate examples which include cap 1620, cap 1620 could be replaced by a waveguide and sealing medium similar to as described with reference to FIG. 15.

For example, a waveguide and sealing medium could be disposed on base substrate 1602 in FIG. 16A to cover the plurality of laser diodes 1610a, 1610b, 1610c, and 1610d; optical director element 1618 (if included); and at least a portion or all of electrical connections 1616a, 1616b, 1616c, and 1616d. Laser diode driver circuitry 1614 could optionally be covered as well, or left uncovered. In this way, electrical connections 1616a, 1616b, 1616c, and 1616d will connect laser diode circuitry 1614 to laser diodes 1610a, 1610b, 1610c, and 1610d through the waveguide and sealing medium.

As another example, a waveguide and sealing medium could be disposed on base substrate 1603a in FIG. 16B to cover the plurality of laser diodes 1610a, 1610b, 1610c, and 1610d; optical director element 1618 (if included); and a portion of electrical connections 1616a, 1616b, 1616c, and 1616d. Electrical contacts 1617a, 1617b, 1617c, and 1617d could be left uncovered, such that laser diode circuitry 1614 can be coupled thereto. In this way, electrical connections 1616a, 1616b, 1616c, and 1616d will connect laser diode circuitry 1614 to laser diodes 1610a, 1610b, 1610c, and 1610d via electrical contacts 1617a, 1617b, 1617c, and 1617d, through the waveguide and sealing medium.

Throughout this application, collimation lenses have been represented in the Figures by a simple curved lens shape. However, the subject systems, devices, and methods can utilize more advanced collimation schemes, as appropriate for a given application.

Figure 17:
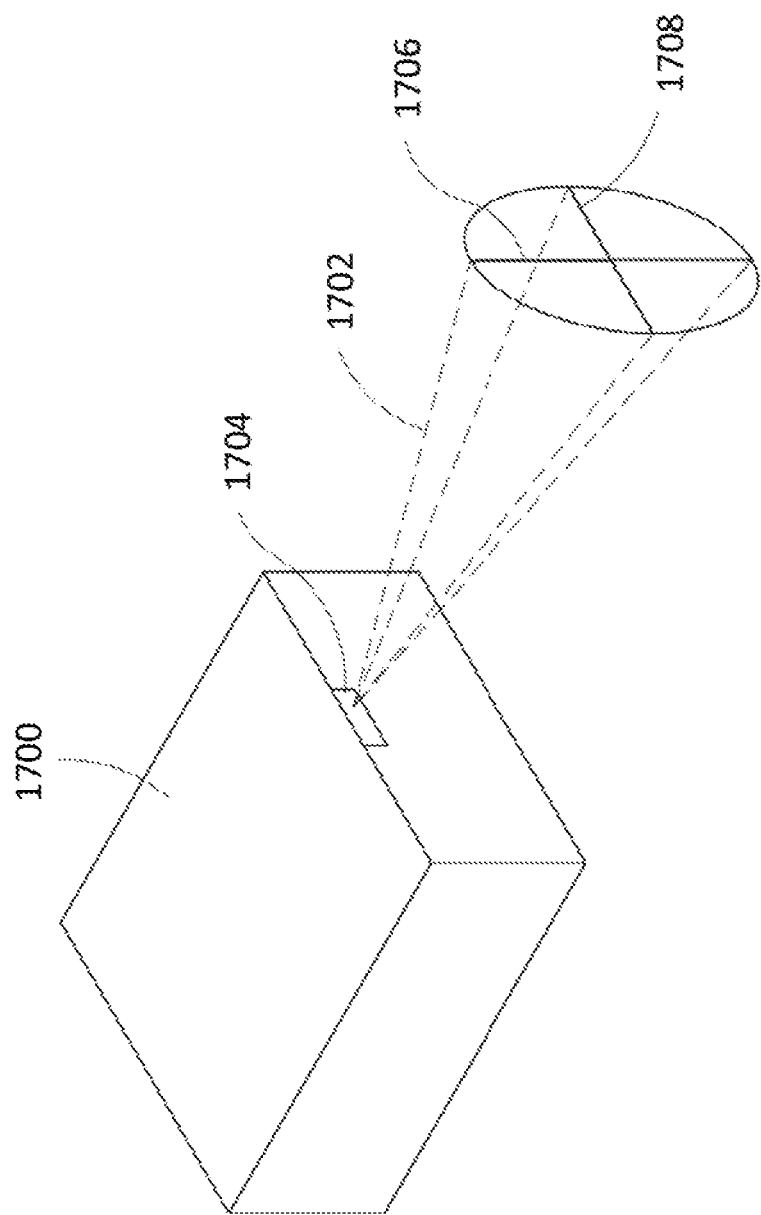
FIG. 17 is an isometric view of a laser diode, showing a fast axis and a slow axis of a light beam generated by the laser diode, in accordance with the present systems, devices, and methods.

FIG. 17 shows an exemplary situation where using an advanced collimation scheme would be helpful. FIG. 17 is an isometric view of a laser diode 1700. The laser diode 1700 may be similar or identical to the various laser diodes discussed herein. The laser diode 1700 outputs a laser light beam 1702 via an output facet 1704 of the laser diode. FIG. 17 shows the divergence of the light 1702 emitting from the laser diode 1700. As shown, the light beam 1702 may diverge by a substantial amount along a fast axis 1706 (or perpendicular axis) and by a lesser amount in the slow axis 1708 (parallel axis). As a non-limiting example, in at least some implementations, the light beam 1702 may diverge with full width half maximum (FWHM) angles of up to 40 degrees in the fast axis direction 1706 and up to 10 degrees in the slow axis direction 1708. This divergence results in a rapidly expanding elliptical cone.

Figure 18A:
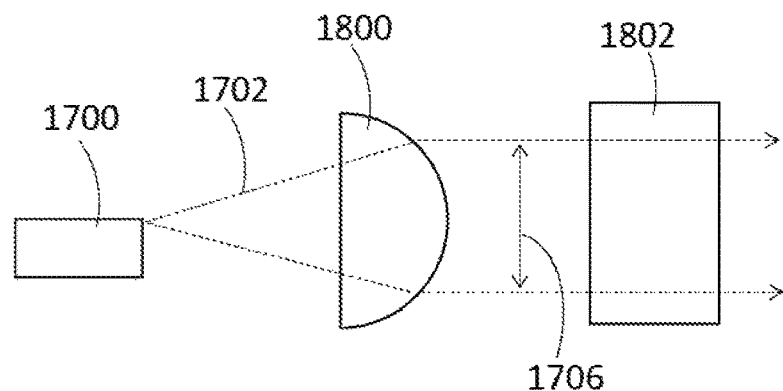
FIG. 18A is a left side sectional view of a set of collimation lenses for collimating a beam of light separately along different axes.
Figure 18B:
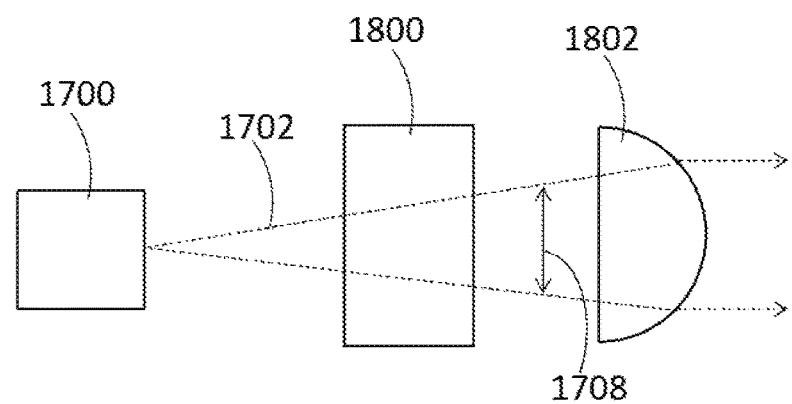
FIG. 18B is a top side sectional elevational view of the set of collimation lenses of FIG. 18A.

FIGS. 18A and 18B show an exemplary collimation scheme that can be used to circularize and collimate an elliptical beam such as that shown in FIG. 17. FIG. 18A illustrates an orthogonal view of the fast axis 1706 of light beam 1702 emitted from laser diode 1700. FIG. 18B illustrates an orthogonal view of the slow axis 1708 of light beam 1702 emitted from laser diode 1700. As shown in FIG. 18A, a first lens 1800 collimates light beam 1702 along fast axis 1706. As shown in FIG. 18B, first lens 1800 is shaped so as to not substantially influence light beam 1702 along slow axis 1708. Subsequently, as shown in FIG. 18B, light beam 1702 is collimated along slow axis 1708 by a second lens 1802. As shown in FIG. 18A, second lens 1802 is shaped so as to not substantially influence light beam 1702 along fast axis 1706. In essence, light beam 1702 is collimated along fast axis 1706 separately from slow axis 1708. By collimating light beam 1702 along fast axis 1706 separately from slow axis 1708, the collimation power applied to each axis can be independently controlled by controlling the power of lens 1800 and lens 1802 separately. Further, spacing between each of laser diode 1700, lens 1800, and lens 1802 can be controlled to collimate light beam 1702 to a certain width in each axis separately. If light beam 1702 is collimated along fast axis 1706 to the same width as slow axis 1708, light beam 1702 can be circularized. Because light beam 1702 will typically diverge faster in the fast axis 1706, it is generally preferable to collimate light beam 1702 along fast axis 1706 first, then collimate light beam 1702 along slow axis 1708 after. However, it is possible in certain applications to collimate light beam 1702 along slow axis 1708 first, and subsequently collimate light beam 1702 along fast axis 1706 after. This can be achieved by reversing the order of first lens 1800 with second lens 1802, with respect to the path of travel of light beam 1702.

Figure 18C:
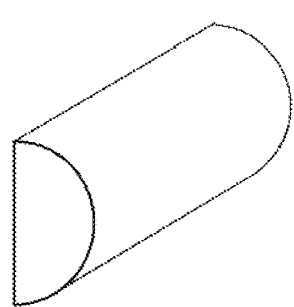
FIGS. 18C and 18D are isometric views of exemplary lens shapes which could be used as lenses in the implementation of FIGS. 18A and 18B.
Figure 18D:
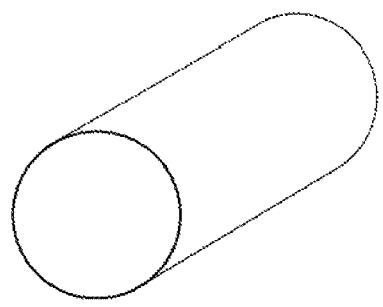

FIGS. 18C and 18D are isometric views which illustrate exemplary shapes for lenses 1800 and 1802. Each of lens 1800 and 1802 can be for example a half-cylinder as in FIG. 18C, a full cylinder as in FIG. 18D, a quarter cylinder, a three-quarter cylinder, any other partial cylinder, or any other appropriate shape. Lenses 1800 and 1802 can be similarly shaped, or can have different shapes.

FIGS. 19A and 19B illustrate an alternative collimation scheme. FIG. 19A illustrates an orthogonal view of the fast axis 1706 of light beam 1702 emitted from laser diode 1700. FIG. 19B illustrates an orthogonal view of the slow axis 1708 of light beam 1702 emitted from laser diode 1700. As shown in FIG. 19A, a first lens 1900 redirects light beam 1702 along fast axis 1706, to reduce divergence of light beam 1702 along fast axis 1706. As shown in FIG. 19B, first lens 1900 is shaped so as to not substantially influence light beam 1702 along slow axis 1708. Preferably, first lens 1900 will reduce divergence of light beam 1702 along fast axis 1706 to match divergence of light beam 1702 along slow axis 1708. That is, first lens 1900 preferably circularizes light beam 1702. Subsequently, as shown in FIGS. 19A and 19B, light beam 1702 is collimated along both fast axis 1706 and slow axis 1708 by a second lens 1902. As shown in FIGS. 19A and 19B, second lens 1902 is shaped similarly with respect to both the fast axis 1706 and the slow axis 1708, to evenly collimate light beam 1702. In essence, first lens 1900 circularizes light beam 1702, and subsequently second lens 1902 collimates light beam 1702 along both axes. First lens 1900 can for example be shaped similarly to lens 1800 or lens 1802 discussed above, and shown in FIGS. 18C and 18D. Second lens 1902 can for example be shaped as a double convex lens as illustrated in FIG. 19C, or a single convex lens (convex on either side) as illustrated in FIG. 19D, or any other appropriate shape of collimating lens.

The collimation schemes illustrated in FIGS. 18A-18D and 19A-19D, and discussed above could be used in place of any of the collimation lenses described herein, including at least collimation lenses 136a, 136b, 136c, 136d.

A person of skill in the art will appreciate that the teachings of the present systems, methods, and devices may be modified and/or applied in additional applications beyond the specific WHUD implementations described herein. In some implementations, one or more optical fiber(s) may be used to guide light signals along some of the paths illustrated herein.

The WHUDs described herein may include one or more sensor(s) (e.g., microphone, camera, thermometer, compass, altimeter, and/or others) for collecting data from the user's environment. For example, one or more camera(s) may be used to provide feedback to the processor of the WHUD and influence where on the display(s) any given image should be displayed.

The WHUDs described herein may include one or more on-board power sources (e.g., one or more battery(ies)), a wireless transceiver for sending/receiving wireless communications, and/or a tethered connector port for coupling to a computer and/or charging the one or more on-board power source(s).

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other portable and/or wearable electronic devices, not necessarily the exemplary wearable electronic devices generally described above.

For instance, the foregoing detailed description has set forth various embodiments of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one embodiment, the present subject matter may be implemented via Application Specific Integrated Circuits (ASICs). However, those skilled in the art will recognize that the embodiments disclosed herein, in whole or in part, can be equivalently implemented in standard integrated circuits, as one or more computer programs executed by one or more computers (e.g., as one or more programs running on one or more computer systems), as one or more programs executed by on one or more controllers (e.g., microcontrollers) as one or more programs executed by one or more processors (e.g., microprocessors, central processing units, graphical processing units), as firmware, or as virtually any combination thereof, and that designing the circuitry and/or writing the code for the software and or firmware would be well within the skill of one of ordinary skill in the art in light of the teachings of this disclosure.

When logic is implemented as software and stored in memory, logic or information can be stored on any processor-readable medium for use by or in connection with any processor-related system or method. In the context of this disclosure, a memory is a processor-readable medium that is an electronic, magnetic, optical, or other physical device or means that contains or stores a computer and/or processor program. Logic and/or the information can be embodied in any processor-readable medium for use by or in connection with an instruction execution system, apparatus, or device, such as a computer-based system, processor-containing system, or other system that can fetch the instructions from the instruction execution system, apparatus, or device and execute the instructions associated with logic and/or information.

In the context of this specification, a "non-transitory processor-readable medium" can be any element that can store the program associated with logic and/or information for use by or in connection with the instruction execution system, apparatus, and/or device. The processor-readable medium can be, for example, but is not limited to, an electronic, magnetic, optical, electromagnetic, infrared, or semiconductor system, apparatus or device. More specific examples (a non-exhaustive list) of the computer readable medium would include the following: a portable computer diskette (magnetic, compact flash card, secure digital, or the like), a random access memory (RAM), a read-only memory (ROM), an erasable programmable read-only memory (EPROM, EEPROM, or Flash memory), a portable compact disc read-only memory (CDROM), digital tape, and other non-transitory media.

The various embodiments described above can be combined to provide further embodiments. To the extent that they are not inconsistent with the specific teachings and definitions herein, at least the following are incorporated herein by reference in their entirety: U.S. Provisional Patent Application Ser. No. 62/438,725, U.S. Non-Provisional patent application Ser. No. 15/848,265 (U.S. Publication Number 2018/0180885), U.S. Non-Provisional patent application Ser. No. 15/848,388 (U.S. Publication Number 2018/0180886), U.S. Provisional Patent Application Ser. No. 62/450,218, U.S. Non-Provisional patent application Ser. No. 15/852,188 (U.S. Publication Number 2018/0210215), U.S. Non-Provisional patent application Ser. No. 15/852,282, (U.S. Publication Number 2018/0210213), U.S. Non-Provisional patent application Ser. No. 15/852,205 (U.S. Publication Number 2018/0210216), U.S. Provisional Patent Application Ser. No. 62/575,677, U.S. Provisional Patent Application Ser. No. 62/591,550, U.S. Provisional Patent Application Ser. No. 62/597,294, U.S. Provisional Patent Application Ser. No. 62/608,749, U.S. Provisional Patent Application Ser. No. 62/609,870, U.S. Provisional Patent Application Ser. No. 62/591,030, U.S. Provisional Patent Application Ser. No. 62/620,600, U.S. Provisional Patent Application Ser. No. 62/576,962, U.S. Provisional Patent Application Ser. No. 62/760,835, U.S. Non-Provisional patent application Ser. No. 16/201,664, U.S. Non-Provisional patent application Ser. No. 16/168,690, U.S. Non-Provisional patent application Ser. No. 16/171,206, U.S. Non-Provisional patent application Ser. No. 16/203,221, U.S. Non-Provisional patent application Ser. No. 16/216,899 and/or PCT Patent Application PCT/CA2018051344. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A wearable heads-up display (WHUD), comprising:
   a support structure that in use is worn on the head of a user;
   a laser projector carried by the support structure, the laser projector comprising:
      an optical engine, comprising:
         a base substrate;
         a plurality of laser diodes, each of the plurality of laser diodes bonded directly or indirectly to the base substrate;
         at least one laser diode driver circuit operatively coupled to the plurality of laser diodes to selectively drive current to the plurality of laser diodes;
         a photonic integrated circuit bonded to the base substrate at a position that is spaced apart from the plurality of laser diodes, the photonic integrated circuit comprising a plurality of input facets and at least one output facet, in operation, the photonic integrated circuit receives a plurality of beams of light at the respective plurality of input facets and wavelength multiplexes the plurality of beams of light to provide an aggregated beam of light at the output facet; and
         a waveguide and sealing medium that covers and hermetically or partially hermetically seals the plurality of laser diodes, the waveguide and sealing medium comprising at least one directly written waveguide that couples the plurality of beams of light emitted by the plurality of laser diodes to the input facets of the photonic integrated circuit; and
      at least one scan mirror positioned to receive the aggregate beam of light output at the output facet of the photonic integrated circuit, the at least one scan mirror controllably orientable to redirect the aggregate beam of light over a range of angles.

2. The WHUD of claim 1, further comprising:
   a transparent combiner carried by the support structure and positioned within a field of view of the user, in operation the transparent combiner directs laser light from an output of the laser projector into the field of view of the user.

3. The WHUD of 1 wherein each of the plurality of input facets of the photonic integrated circuit comprises a grating input coupler or an edge input coupler.

4. The WHUD of claim 1, further comprising:
   a collimation lens positioned and oriented to receive and collimate the aggregate beam of light from the output facet of the photonic integrated circuit.

5. The WHUD of claim 1, further comprising at least one diffractive optical element positioned and oriented to receive the aggregate beam of light, in operation, the at least one diffractive optical element provides wavelength dependent focus correction for the aggregate beam of light.

6. The WHUD of claim 1 wherein the at least one laser diode driver circuit is bonded to a first surface of the base substrate, and the plurality of laser diodes and the waveguide and sealing medium are bonded to a second surface of the base substrate, the second surface of the base substrate opposite the first surface of the base substrate.

7. The WHUD of claim 1 wherein the at least one laser diode driver circuit, the plurality of laser diodes, and the waveguide and sealing medium are bonded to a first surface of the base substrate.

8. The WHUD of claim 1 wherein the plurality of laser diodes and the waveguide and sealing medium are bonded to the base substrate, and the at least one laser diode driver circuit is bonded to another substrate separate from the base substrate.

9. The WHUD of claim 1 wherein the photonic integrated circuit includes a first plurality of waveguides, each waveguide of the first plurality of waveguides having a respective input facet, and the waveguide medium includes a second plurality of waveguides, each waveguide of the second plurality of waveguides to receive laser light from a respective laser diode of the plurality of laser diodes and couple the received laser light to the input facet of a respective waveguide in the first plurality of waveguides.

10. An optical engine, comprising:
    a base substrate;
    a plurality of laser diodes, each of the plurality of laser diodes bonded directly or indirectly to the base substrate;
    at least one laser diode driver circuit operatively coupled to the plurality of laser diodes to selectively drive current to the plurality of laser diodes;
    a photonic integrated circuit bonded to the base substrate at a position that is spaced apart from the plurality of laser diodes, the photonic integrated circuit comprising a plurality of input facets and at least one output facet, in operation, the photonic integrated circuit receives a plurality of beams of light at the respective plurality of input facets and wavelength multiplexes the plurality of beams of light to provide an aggregated beam of light at the output facet; and
    a waveguide and sealing medium that covers and hermetically or partially hermetically seals the plurality of laser diodes, the waveguide and sealing medium comprising at least one directly written waveguide that couples the plurality of beams of light emitted by the plurality of laser diodes to the input facets of the photonic integrated circuit.

11. The optical engine of claim 10 wherein the waveguide and sealing medium comprises an organically modified ceramic (ORMOCER) material.

12. The optical engine of claim 10 wherein each of the plurality of input facets of the photonic integrated circuit comprises one of a grating input coupler or an edge input coupler.

13. The optical engine of claim 10, further comprising:
    a collimation lens positioned and oriented to receive and collimate the aggregate beam of light from the output facet of the photonic integrated circuit.

14. The optical engine of claim 13 wherein the collimation lens comprises one of an achromatic lens or an apochromatic lens.

15. The optical engine of claim 10, further comprising at least one diffractive optical element positioned and oriented to receive the aggregate beam of light, in operation, the at least one diffractive optical element provides wavelength dependent focus correction for the aggregate beam of light.

16. The optical engine of claim 10, further comprising:
    a plurality of chip submounts bonded to the base substrate, wherein each of the laser diodes are bonded to a corresponding one of the plurality of chip submounts.

17. The optical engine of claim 10 wherein the plurality of laser diodes includes a red laser diode to provide a red laser light, a green laser diode to provide a green laser light, a blue laser diode to provide a blue laser light, and an infrared laser diode to provide infrared laser light.

18. The optical engine of claim 10 wherein the at least one laser diode driver circuit is bonded to a first surface of the base substrate, and the plurality of laser diodes and the cap are bonded to a second surface of the base substrate, the second surface of the base substrate opposite the first surface of the base substrate.

19. The optical engine of claim 10 wherein the at least one laser diode driver circuit, the plurality of laser diodes, and the cap are bonded to a first surface of the base substrate.

20. The optical engine of claim 10 wherein the photonic integrated circuit includes a first plurality of waveguides, each waveguide of the first plurality of waveguides having a respective input facet, and the waveguide medium includes a second plurality of waveguides, each waveguide of the second plurality of waveguides to receive laser light from a respective laser diode of the plurality of laser diodes and couple the received laser light to the input facet of a respective waveguide in the first plurality of waveguides.

\* \* \* \* \*